United States Patent
Kato et al.

(10) Patent No.: US 9,596,422 B2
(45) Date of Patent: Mar. 14, 2017

(54) SIGNAL PROCESSING DEVICE AND METHOD, IMAGING DEVICE, AND IMAGING APPARATUS

(71) Applicant: SONY CORPORATION, Tokyo (JP)

(72) Inventors: Yuri Kato, Kanagawa (JP); Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/903,153

(22) PCT Filed: Jul. 4, 2014

(86) PCT No.: PCT/JP2014/067880
§ 371 (c)(1),
(2) Date: Jan. 6, 2016

(87) PCT Pub. No.: WO2015/008634
PCT Pub. Date: Jan. 22, 2015

(65) Prior Publication Data
US 2016/0212365 A1    Jul. 21, 2016

(30) Foreign Application Priority Data
Jul. 16, 2013  (JP) .................. 2013-147550

(51) Int. Cl.
*H04N 5/369* (2011.01)
*H04N 5/3745* (2011.01)
(Continued)

(52) U.S. Cl.
CPC ........ *H04N 5/3698* (2013.01); *H03M 1/1033* (2013.01); *H04N 5/357* (2013.01);
(Continued)

(58) Field of Classification Search
CPC ........ H03M 1/34; H03M 1/205; H03M 1/204; H04N 5/3698; H04N 5/37455; H04N 5/37457; H04N 5/378; H04N 5/357
(Continued)

(56) References Cited

U.S. PATENT DOCUMENTS

2009/0066554 A1* 3/2009 Lim ............ H03M 1/144
341/155
2011/0037868 A1* 2/2011 Ota ............ H04N 5/357
348/222.1

FOREIGN PATENT DOCUMENTS

JP    2009-33305 A    2/2009
JP    2010-245660 A    10/2010
(Continued)

OTHER PUBLICATIONS

International Search Report and Written Opinion prepared by the Japanese Patent Office on Sep. 17, 2014, for International Application No. PCT/JP2014/067880.

*Primary Examiner* — Nelson D. Hernández Hernández
(74) *Attorney, Agent, or Firm* — Sheridan Ross P.C.

(57) ABSTRACT

The present technology relates to a signal processing device and a method, an imaging device, and an imaging apparatus that are designed to reduce occurrences of A/D conversion errors. A signal processing device of the present technology includes: a comparing unit that compares an analog signal output from a unit pixel with a predetermined voltage; a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in a result of the compari-
(Continued)

son performed by the comparing unit. The present technique can be applied to imaging devices and imaging apparatuses, for example.

20 Claims, 39 Drawing Sheets

(51) Int. Cl.
*H04N 5/357* (2011.01)
*H03M 1/10* (2006.01)
*H04N 5/378* (2011.01)
*H03M 1/56* (2006.01)

(52) U.S. Cl.
CPC ......... *H04N 5/378* (2013.01); *H04N 5/37455* (2013.01); *H04N 5/37457* (2013.01); *H03M 1/56* (2013.01)

(58) Field of Classification Search
USPC .................................. 341/126–131, 155–172
See application file for complete search history.

(56) References Cited

FOREIGN PATENT DOCUMENTS

| JP | 2011-041091 | 2/2011 |
| JP | 2011-41205 A | 2/2011 |
| JP | 2013-51575 A | 3/2013 |

* cited by examiner

SIGNAL PROCESSING DEVICE AND METHOD, IMAGING DEVICE, AND IMAGING APPARATUS

CROSS REFERENCE TO RELATED APPLICATIONS

This application is a national stage application under 35 U.S.C. 371 and claims the benefit of PCT Application No. PCT/JP2014/067880 having an international filing date of Jul. 4, 2014, which designated the United States, which PCT application claimed the benefit of Japanese Patent Application No. 2013-147550 filed Jul. 16, 2013, the disclosures of which are incorporated herein by reference in their entirety.

TECHNICAL FIELD

The present technology relates to signal processing devices and methods, imaging devices, and imaging apparatuses, and more particularly, to a signal processing device and a method, an imaging device, and an imaging apparatus that are designed to reduce occurrences of A/D conversion errors.

BACKGROUND ART

In a general image sensor, the charge stored in a light receiving unit (a photodiode) is read as a signal voltage, and is subjected to Analog/Digital (A/D) conversion (see Patent Document 1, for example).

According to the A/D conversion method disclosed in Patent Document 1, two A/D conversion circuits are connected to the same pixel output signal, and reference voltages Vref1 and Vref2 with different gradients are input from two reference voltage generating units to the respective A/D conversion circuits. In this manner, A/D conversion is performed with two gradation accuracies, so as to achieve a higher gradation accuracy and restrain increases in conversion time at the same time. In this case, however, the circuit area and the power consumption are doubled. Therefore, according to the method disclosed in Patent Document 1, only one A/D conversion circuit is used, and a determining unit is provided. The determining unit determines the size of each pixel output signal, and, in accordance with a result of the determination, selects one of the reference voltages Vref1 and Vref2 having two different gradients. In this manner, the use of different conversion accuracies depending on the sizes of pixel output signals is realized.

CITATION LIST

Patent Document

Patent Document 1: Japanese Patent Application Laid-Open No. 2011-41091

SUMMARY OF THE INVENTION

Problems to be Solved by the Invention

However, in the case of conventional A/D conversion such as the A/D conversion according to the method disclosed in Patent Document 1, it is difficult to sufficiently reduce occurrences of errors in the A/D conversion. Therefore, there is a possibility that a higher gradation accuracy and restraint on increases in conversion time cannot be realized at the same time, or it will become difficult to restrain image quality degradation, for example.

The present technology has been suggested in view of those circumstances, and aims to reduce occurrences of A/D conversion errors.

Solutions to Problems

One aspect of the present technology is a signal processing device that includes: a comparing unit that compares an analog signal output from a unit pixel with a predetermined voltage; a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

The load capacitance may be an equivalent capacitance or an approximate capacitance of the comparing unit.

The signal processing device may further include a dummy comparing unit as the load capacitance, the dummy comparing unit having the same structure as the comparing unit, one input of the dummy comparing unit being connected to a fixed potential, the output of the dummy comparing unit being in an opened state. The switching unit may connect the other one of the reference voltages to the other input of the dummy comparing unit, the other one of the reference voltages being not connected to the comparing unit.

The signal processing device may further include a circuit as the load capacitance, the circuit including: an input transistor that operates in the same operation region as the input transistor of the comparing unit; a current supply transistor that supplies a constant current to the input transistor; a capacitor that cancels a reference voltage offset; and a switch transistor that initializes the capacitor. The switching unit may connect the other one of the reference voltages to the capacitor of the circuit, the other one of the reference voltages being not connected to the comparing unit.

The signal processing device may further include a circuit as the load capacitance, the circuit including: an input transistor that operates in the same operation region as the input transistor of the comparing unit; a capacitor that cancels a reference voltage offset; a first switch transistor that initializes the capacitor; a second switch transistor that initializes the input transistor; and a third switch transistor that connects the input transistor to a fixed potential. The switching unit may connect the other one of the reference voltages to the capacitor of the circuit, the other one of the reference voltages being not connected to the comparing unit.

The signal processing device may further include: a first capacitance adjusting unit that is connected to the load capacitance, and adjusts the load capacitance; and a control unit that controls the capacitance of the first capacitance adjusting unit.

The first capacitance adjusting unit may be formed with transistors connected in series between the load capacitance and a fixed potential, and the control unit may obtain a desired capacitance value by inputting a control signal to each gate of the transistors.

The first capacitance adjusting unit may be formed with transistors connected in parallel to one another, the gate of each of the transistors may be connected to the load capacitance, and the control unit may obtain a desired capacitance value by inputting a control signal to the source and the drain of each of the transistors.

The first capacitance adjusting unit may be formed with a capacitor having a variable capacitance, and the control unit may obtain a desired capacitance value by inputting a control signal to a control terminal of the capacitor.

The signal processing device may further include a second capacitance adjusting unit that is connected to an input of the comparing unit, and adjusts the capacitance of the comparing unit. The control unit may further control the capacitance of the second capacitance adjusting unit.

The second capacitance adjusting unit may be formed with transistors connected in series between the input of the comparing unit and a fixed potential, and the control unit may obtain a desired capacitance value by inputting a control signal to each gate of the transistors.

The second capacitance adjusting unit may be formed with transistors connected in parallel to one another, the gate of each of the transistors may be connected to the input of the comparing unit, and the control unit may obtain a desired capacitance value by inputting a control signal to the source and the drain of each of the transistors.

The second capacitance adjusting unit may be formed with a capacitor having a variable capacitance, and the control unit may obtain a desired capacitance value by inputting a control signal to a control terminal of the capacitor.

The control unit may control the capacitance first or last in a frame.

The control unit may control the capacitance based on capacitance adjustment information about a frame processed in the past.

The control unit may control the capacitance every few frames.

The control unit may control the capacitance in accordance with the size of a difference in black level when the respective reference voltages are input to the comparing unit.

The one aspect of the present technology is also a signal processing method that includes: comparing an analog signal output from a unit pixel with a predetermined voltage, using a comparing unit; switching reference voltages to be supplied to the comparing unit as necessary, connecting one of the reference voltages to the comparing unit, and connecting another one of the reference voltages to a predetermined load capacitance, the reference voltages being of different gradation accuracies from each other; and measuring timing of a change in the result of the comparison performed by the comparing unit between the analog signal and the reference voltage supplied to the comparing unit.

Another aspect of the present technology is an imaging device that includes: a pixel array including unit pixels arranged therein, each of the unit pixels including a photoelectric conversion element that performs photoelectric conversion on incident light; a comparing unit that compares an analog signal output from a unit pixel of the pixel array with a predetermined voltage; a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

Yet another aspect of the present technology is an imaging apparatus that includes: an imaging unit that images an object; and an image processing unit that performs image processing on image data obtained through the imaging performed by the imaging unit. The imaging unit includes: a pixel array including unit pixels arranged therein, each of the unit pixels including a photoelectric conversion element that performs photoelectric conversion on incident light; a comparing unit that compares an analog signal output from a unit pixel of the pixel array with a predetermined voltage; a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

In one aspect of the present technology, an analog signal output from a unit pixel is compared with a predetermined voltage by a comparing unit, reference voltages to be supplied to the comparing unit are switched as necessary, one of the reference voltages of different gradation accuracies from each other is connected to the comparing unit, another one of the reference voltages is connected to a predetermined load capacitance, and timing of a change in the result of the comparison between the analog signal and the reference voltage supplied to the comparing unit is measured.

In another aspect of the present technology, reference voltages to be supplied to a comparing unit that compares a predetermined voltage with an analog signal output from a unit pixel including a photoelectric conversion element performing electric conversion on incident light in a pixel array are switched as necessary, one of the reference voltages of different gradation accuracies from each other is connected to the comparing unit, another one of the reference voltages is connected to a predetermined load capacitance, and timing of a change in the result of the comparison between the analog signal and the reference voltage supplied to the comparing unit is measured.

In yet another aspect of the present technology, an object is imaged, the image data obtained through the imaging is subjected to image processing, reference voltages to be supplied to a comparing unit that compares a predetermined voltage with an analog signal output from a unit pixel including a photoelectric conversion element performing electric conversion on incident light in a pixel array are switched as necessary during the imaging, one of the reference voltages of different gradation accuracies from each other is connected to the comparing unit, another one of the reference voltages is connected to a predetermined load capacitance, and timing of a change in the result of the comparison between the analog signal and the reference voltage supplied to the comparing unit is measured.

Effects of the Invention

According to the present technology, information can be processed. Particularly, occurrences of A/D conversion errors can be reduced.

MODES FOR CARRYING OUT THE INVENTION

Modes for carrying out the present disclosure (hereinafter referred to as the embodiments) will be described below. Explanation will be made in the following order.

1. First Embodiment (CMOS Image Sensor)
2. Second Embodiment (CMOS Image Sensor)
3. Third Embodiment (Imaging Apparatus)
4. Fourth Embodiment (Computer)

1. First Embodiment

<A/D Conversion>

In a general image sensor, the charge stored in a light receiving unit (such as a photodiode) of a unit pixel is read as a signal voltage (a pixel signal), and is subjected to analog-to-digital conversion (Analog/Digital (A/D) conversion).

In this A/D conversion, a signal voltage is compared with a reference voltage that is being varied, for example, and the signal voltage is subjected to digital conversion when the reference voltage becomes equal to the signal voltage (see Japanese Patent Application Laid-Open No. 2005-278135 (hereinafter referred to as Patent Document 2), for example).

Figure 1:
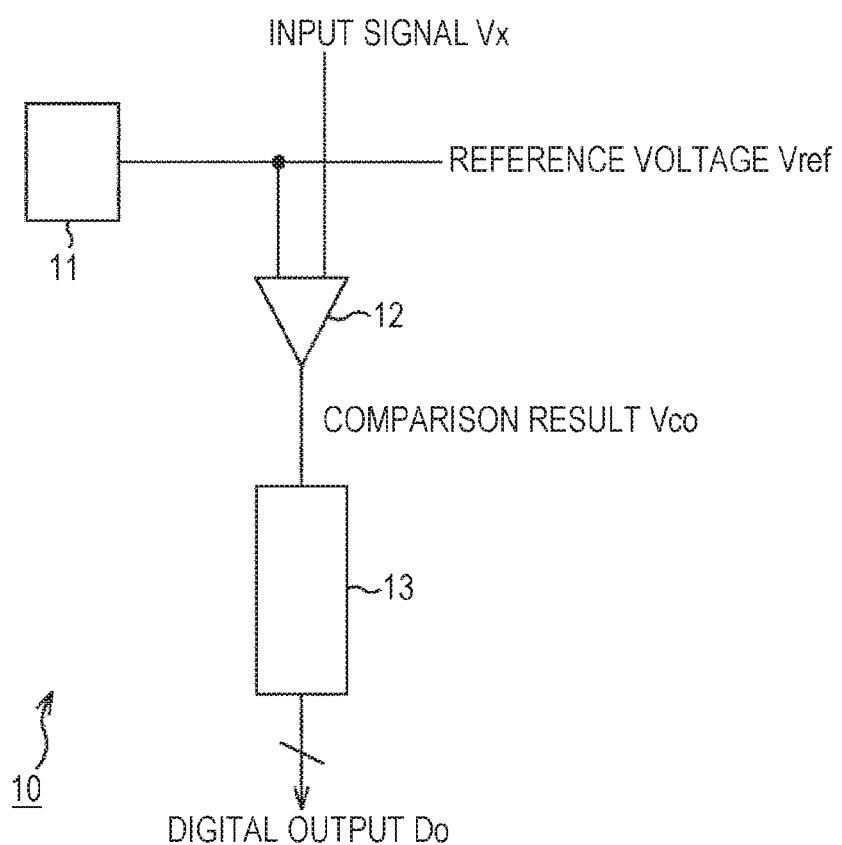
FIG. 1 is a diagram showing a typical example structure of a column A/D conversion unit.

A column A/D conversion unit 10 shown in FIG. 1 is a processing unit that performs A/D conversion in this manner, and performs A/D conversion on a pixel signal read from a unit pixel. The column A/D conversion unit 10 shown in FIG. 1 includes a reference voltage generating unit 11, a comparing unit 12, and a timing measuring unit 13. The reference voltage generating unit 11 generates a reference voltage Vref having a value being varied within a predetermined voltage range, and supplies the reference voltage Vref to the comparing unit 12. The comparing unit 12 compares the voltage of an input signal Vx that is an analog pixel signal read from a pixel with the reference voltage Vref generated by the reference voltage generating unit 11, and supplies the comparison result Vco to the timing measuring unit 13. The timing measuring unit 13 measures (counts) the period from the start of the comparison till a change in the value of the comparison result Vco, regards the length (count value) of the period as the digital value (the value after the A/D conversion) of the input signal Vx, and outputs the digital value as a digital output Do.

Figure 2:
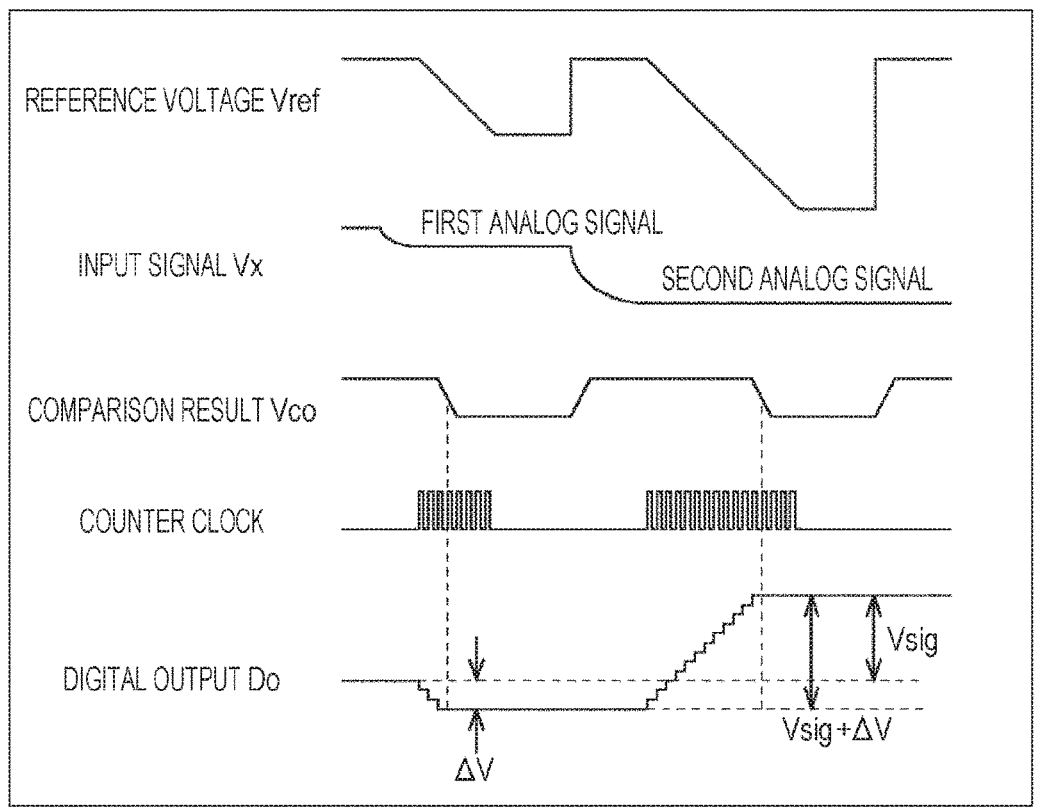
FIG. 2 is a timing chart showing an example of A/D conversion.

FIG. 2 is a timing chart showing an example of such A/D conversion performed by the column A/D conversion unit 10.

As shown in FIG. 2, the reference voltage Vref scans voltage in a ramp-like manner. The input signal Vx is input, with a variation component $\Delta V$ (noise component) of a pixel output being a first analog signal, Vsig+$\Delta V$ being a second analog signal obtained by adding a signal component Vsig to the variation component.

The timing measuring unit 13 uses a counter that can switch between counting up and counting down, for example, and, with a counter clock, measures time until the comparison result Vco changes. Here, the first analog signal is counted down, and the second analog signal is counted up. Accordingly, the second analog signal is subtracted from the first analog signal, to eventually obtain an output Do formed only with the digitized signal component Vsig.

With this method, however, the conversion time might increase with gradation accuracy. In general, when the conversion accuracy (voltage per gradation) is increased in A/D conversion, the input voltage range (dynamic range) in which conversion can be performed becomes narrower. Alternatively, in a case where the input voltage range (dynamic range) is fixed, the conversion time might increase (a decrease in speed) or power consumption might increase as the number of gradations increases.

For example, so as to increase conversion accuracy, the gradient of the reference voltage is made smaller in a case where the detection accuracy at the time when the reference voltage determined from a clock frequency is equal to a signal voltage stays the same. In a case where the number of gradations stays the same, the number of necessary clocks does not change. Therefore, there are no changes in electric power and speed, but the amplitude of the reference voltage becomes smaller. As a result, the input voltage range in which A/D conversion can be performed becomes narrower. If the number of gradations is increased in this case, a larger number of clocks are required, resulting in a decrease in speed and an increase in electric power. However, the amplitude of the reference voltage becomes wider, and the input voltage range in which A/D conversion can be performed becomes narrower.

Of course, if the clock frequency is made higher, the conversion accuracy can be increased without a decrease in the gradient of the reference voltage, and the A/D conversion speed does not change. However, power consumption apparently becomes larger.

That is, as the conversion accuracy is made higher, the input voltage range becomes narrower, or the speed or electric power decreases. So as to increase the conversion accuracy fourfold in the same input voltage range, the number of clocks needs to be increased fourfold.

Figure 3:
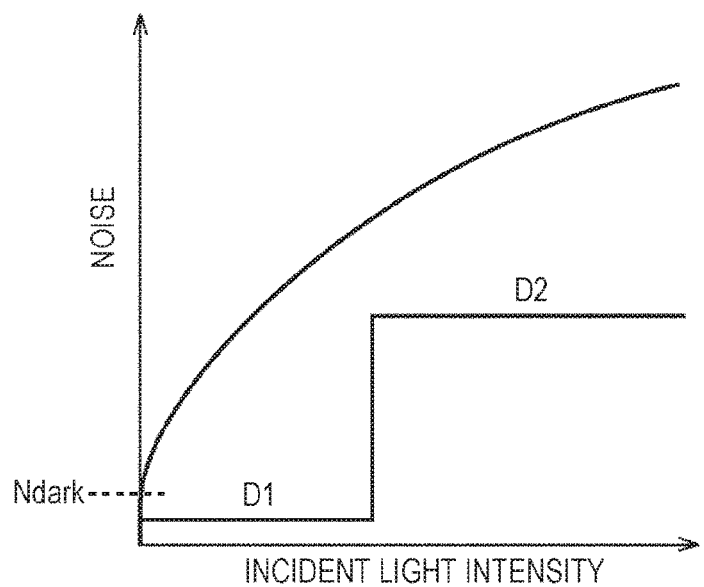
FIG. 3 is a diagram showing an example of gradation accuracies of A/D conversion.

The conversion accuracy (voltage per gradation) of A/D conversion is determined by the noise level included in a signal voltage and the degree of amplification (gain) to be performed during development of the image. For example, as shown in FIG. 3, in an image sensor, in addition to noise Ndark generated when a signal is read, photon shot noise of $\sqrt{N}$ is generated with respect to signal charge N generated in proportion to incident light intensity. As a result, the noise amount increases with incident light intensity. When it is dark, the signal is small, and the absolute value of noise is also small. When it is bright, the signal is large, and the absolute value of noise is also large. Therefore, the influence of quantized noise determined by the A/D conversion accuracy varies with signal sizes (depending on whether the signal is bright or dark). In a brighter region, photon short noise is dominant, and the required A/D conversion accuracy may be low.

In general, so as not to make quantized noise of A/D conversion visible, the conversion accuracy of A/D conversion is preferably set at a lower value than the total noise level of the read noise and photon shot noise. However, conversion speed and power consumption need to be sacrificed for a high conversion accuracy.

In view of this, as shown in FIG. 3, a higher conversion accuracy (a lower voltage per gradation) D1 is used in a low incident light region of a low noise level, and a low conversion accuracy D2 is used in a high incident light region where photon shot noise is dominant over quantized noise. In this manner, the conversion speed of A/D conversion and power consumption are improved, without actual image quality degradation due to quantized noise (see Japanese Patent Application Laid-Open No. 2011-211535 (hereinafter referred to as Patent Document 3), for example).

According to this method, A/D conversion is performed two or more times in a time-sharing manner with the same signal voltage and reference voltages having different gradients, and digital values having different conversion accuracies are obtained and are switched depending on the signal voltage range. Accordingly, gradation accuracy switching can be realized by changing the gradient of the reference voltage Vref at the same counter clock frequency. It is of course possible to change the counter clock frequency without a change in the gradient of the reference voltage Vref. However, lowering the frequency leads to a decrease in the A/D conversion speed. Therefore, it is preferable to change the gradient of the reference voltage Vref.

Figure 4:
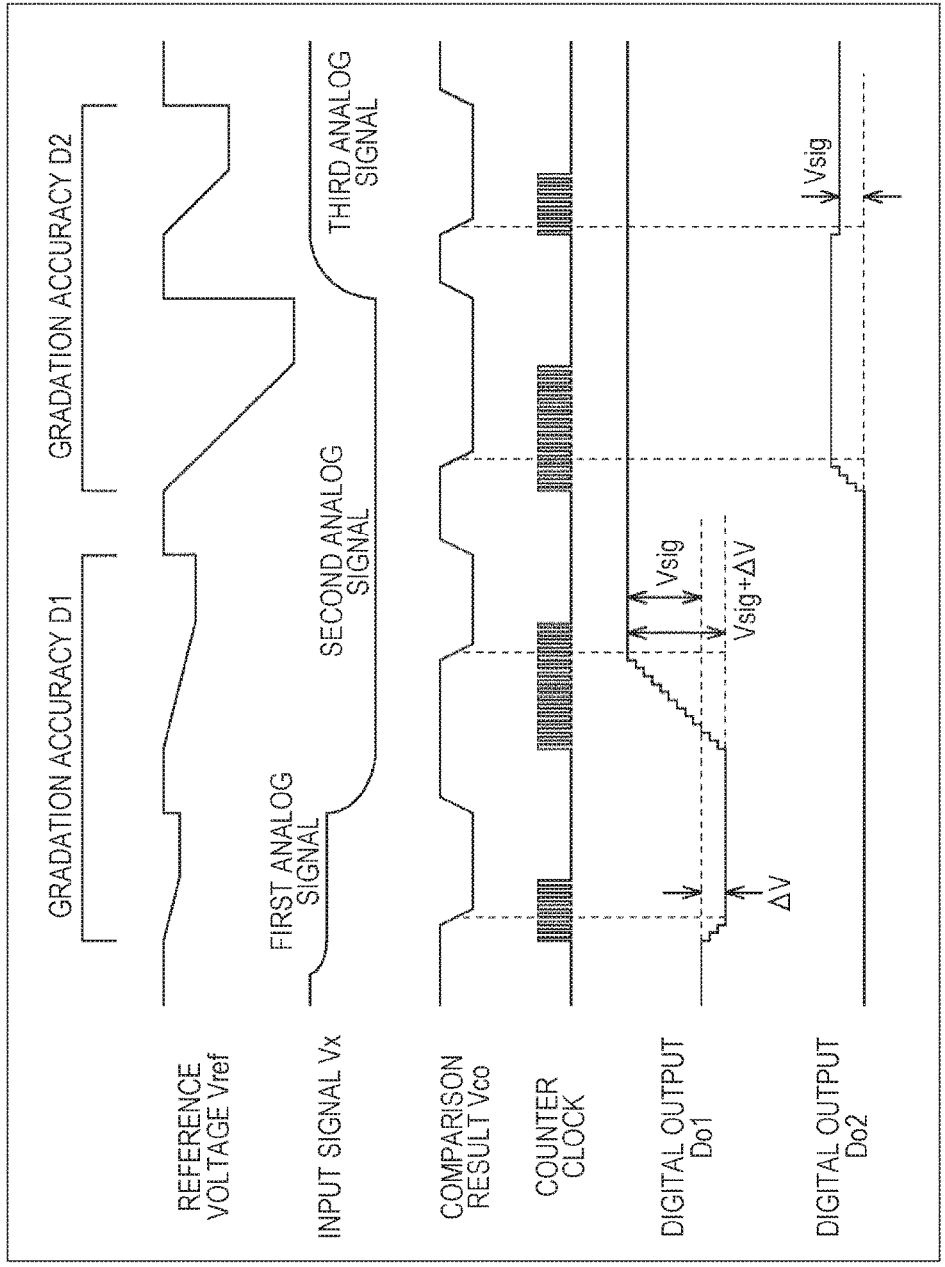
FIG. 4 is a timing chart showing another example of A/D conversion.

As shown in the timing chart in FIG. 4, according to this method, A/D conversion with a reference voltage Vref having a small gradient or a high gradation accuracy is performed on a first analog signal and a second analog signal, and A/D conversion with the reference voltage Vref having an increased gradient or a lower gradation accuracy D2 is performed on the second analog signal and a third analog signal. The A/D conversion for the third analog signal is the process for subtracting the variation component. That is, the first analog signal and the third analog signal are variation components (noise components).

Doubling a gradation accuracy is equivalent to halving a gradient. In a case where A/D conversion is performed in the same input signal range, the required conversion time is doubled. In the example case shown in FIG. 4, the input signal range of the gradation accuracy D1 is narrowed, so that the high gradation accuracy D1 is used only in the region where the signal component Vsig is small, and the relatively low gradation accuracy D2 is used in the region where the signal component Vsig is large. Therefore, the AD conversion performed twice takes a conversion time that is almost twice longer than the conversion time required in a case where only the gradation accuracy D2 is used. However, in a case where the conversion accuracy D1 is set at an accuracy four times higher than D2, the conversion time is almost a half of the conversion time required in a case where only the gradation accuracy D1 is used.

According to this method, however, conversion needs to be performed twice on the second analog signal that is the signal component. Although conversion needs to be performed twice on the variation components (the first analog signal and the third analog signal), a variation component normally has a smaller amplitude than a signal component. Accordingly, the amplitude of the reference voltage is small, and the conversion time for each variation component is shorter than the conversion time for the signal component. Therefore, the fact that conversion needs to be performed twice on the signal component (the second analog signal) greatly contributes to a decrease in A/D conversion speed.

In view of this, a method has been suggested to switch conversion accuracies in A/D conversion depending on the signal voltage range in an A/D conversion period for a signal component, by determining the magnitude of the signal voltage, selecting different amplification factors in accordance with the determination result, and amplifying the signal voltage (see Japanese Patent Application Laid-Open No. 2004-15701 (hereinafter referred to as Patent Document 4), for example).

According to this method, a check is made to determine the magnitude of a predetermined voltage with respect to a pixel output, and an analog signal is amplified in accordance with the result. At this point, the gradation accuracy of the A/D conversion is not changed, but the analog signal is amplified before the A/D conversion. Accordingly, a voltage equivalent to 1 LSB can be reduced in terms of the input voltage with respect to the signal component. That is, A/D conversion with a high gradation accuracy can be performed in a region where the signal amplitude is small and the incident light intensity is low.

According to this method, however, the pixel output is amplified in an analog manner, and therefore, variations of the amplification factors of the amplifier circuit might be overlapped as fixed pattern noise. Unless the analog amplification is performed on the signal component Vsig minus the variation component $\Delta V$, there is a possibility that the dynamic range is narrowed (the output is saturated) as the variation component $\Delta V$ is amplified. Therefore, the subtraction process needs to be performed in an analog region, resulting in a possibility of increases in circuit area and power consumption, and an increase in noise or the like due to the limitation of the analog calculation accuracy.

In view of this, a method of realizing a conversion accuracy in A/D conversion by changing the gradient of the reference voltage has been suggested (see Patent Document 1, for example). According to this method, two A/D conversion circuits are connected to the same pixel output signal, and reference voltages Vref1 and Vref2 with different gradients are input from two reference voltage generating units to the respective A/D conversion circuits. In this manner, A/D conversion is performed with two gradation accuracies.

In this case, however, the circuit area and the power consumption are doubled. Therefore, another method has been suggested. According to this method, a single AD conversion circuit is used, a determining unit determines the size of a pixel output signal, and one of the reference voltages Vref1 and Vref2 with two different gradients is selected in accordance with the result of the determination. The variation component $\Delta V$ is subjected to an analog subtraction process by a comparing unit, and A/D conversion is performed once on the difference signal (Vsig).

In this case, however, the variation component subtraction process is performed in an analog region with a comparison circuit. Therefore, so as to achieve a sufficiently low noise level, the capacitance Cin of the comparison circuit needs to be increased, and therefore, there is a possibility that the circuit area and power consumption become larger than the circuit area and power consumption in a case where the subtraction process is performed in a digital region.

Also, a determining unit that determines the magnitude of a pixel output signal is added. However, the comparison accuracy (offset error) at this determining unit differs from the comparison accuracy (offset error) at the comparing unit for A/D conversion. Therefore, the difference needs to be compensated by a supply of reference voltages in a wider voltage range. This is because, even if the determining unit determines a low incident light region (a region where the output amplitude is small), the comparing unit for A/D conversion might be outside the voltage range of the reference voltage Vref1 due to the offset error, and in that case, the output image might be damaged.

<Improvement of A/D Conversion>

In view of the above, a signal processing device is designed to include: a comparing unit that compares an analog signal output from a unit pixel with a predetermined voltage; a selecting unit that selects one of reference voltages of different gradation accuracies from each other in accordance with a result of comparison performed by the comparing unit between the analog signal and at least one predetermined determination value; a switching unit that switches the reference voltages to be supplied to the comparing unit in accordance with the result of the selection performed by the selecting unit; and a measuring unit that measures timing of a change in the result of the comparison performed by the comparing unit between the analog signal and the reference voltage supplied to the comparing unit through the switching control performed by the switching unit.

As described above, the comparing unit used in the comparison with the reference value in A/D conversion is also used in the comparison with a predetermined determination value, and a gradation accuracy is selected in accordance with the result of the comparison. In this manner, the signal processing device can reduce the reference voltage range margin derived from the comparison accuracy (offset error) in the determination, and achieve the effect to increase speed or reduce power consumption. That is, occurrences of A/D conversion errors can be reduced.

The predetermined determination value may be supplied from the reference voltage generating unit to which the reference voltage having the higher gradation accuracy among the reference voltages is supplied.

By setting the predetermined determination value with the use of the reference voltage generating unit to which the reference voltage having the higher gradation accuracy is supplied as described above, the signal processing device can further reduce the reference voltage range margin derived from the comparison accuracy (offset error).

If the reference voltage Vref1 has a higher conversion accuracy than the reference voltage Vref2 (or the reference voltage Vref1 is the slope voltage having the smaller gradient), for example, the predetermined determination value needs to be set within a voltage range in which the reference voltage Vref1 can be subjected to A/D conversion. Therefore, if the predetermined determination value is set with a different voltage generating unit from the reference voltage Vref1, the voltage range of the reference voltage Vref1 needs to be widened by the amount equivalent to the voltage setting error (offset). As the same voltage unit as the reference voltage Vref1 having the higher conversion accuracy sets the predetermined determination value, not only the predetermined determination value can be supplied without an increase in the number of circuits, but also the voltage setting error can be canceled.

In a case where the analog signal is determined to be smaller than the predetermined determination value as a result of the comparison performed by the comparing unit, the selecting unit may select the reference voltage having the higher gradation accuracy from among the reference voltages. In a case where the analog signal is determined to be greater than the predetermined determination value, the selecting unit may select the reference voltage having the lower gradation accuracy from among the reference voltages. The switching unit may then supply the reference voltage selected by the selecting unit to the comparing unit.

That is, a high gradation accuracy is used in a region where quantized noise can become dominant noise, and a low gradation accuracy is used in a region where photon shot noise or the like is dominant. With this, the signal processing device can realize A/D conversion for obtaining image quality equivalent to that in a case where A/D conversion is performed with a high gradation accuracy, while restraining decreases in conversion speed and increases in power consumption.

The comparing unit may compare a first analog signal that is the noise signal of the pixel, and a second analog signal that is a signal containing the data of the pixel, with the reference voltage. The measuring unit may calculate the difference between the result of measurement of timing of a change in the result of the comparison performed by the comparing unit between the first analog signal and the reference voltage, and the result of measurement of timing of a change in the result of the comparison performed by the comparing unit between the second analog signal and the reference voltage.

With this, the signal processing device can perform the subtraction process for removing variation components in a digital region, and restrain increases in circuit size and power consumption due to the subtraction process.

With respect to the first analog signal, the selecting unit may sequentially select the respective reference voltages, the switching unit may supply the reference voltage selected by the selecting unit to the comparing unit, and the comparing unit under the control of the switching unit sequentially may compare the first analog signal with the respective reference voltages. As for the second analog signal, the selecting unit may select one of the reference voltages in accordance with a result of comparison performed by the comparing unit between the second analog signal and at least one predetermined determination value, the switching unit may supply the reference voltage selected by the selecting unit to the comparing unit, and the comparing unit under the control of the switching unit may compare the second analog signal with the reference voltage selected by the selecting unit. The measuring unit may calculate the difference between the result of measurement of timing of a change in the result of the comparison between the second analog signal and the reference voltage selected by the selecting unit, and the result of measurement of timing of a change in the result of the comparison between the first analog signal and the reference voltage selected by the selecting unit.

As described above, by comparing the first analog signal (variation component) with the reference voltages of the respective gradation accuracies, the signal processing device can perform A/D conversion on the second analog signal (signal component+variation component) with any gradation accuracy.

The signal processing device may further include a reference voltage supplying unit that supplies the reference voltages.

As the reference voltages are supplied from itself, the signal processing device can easily perform scan control on the reference voltages.

The reference voltage supplying unit may supply the reference voltages so that the first analog signal and the second analog signal are compared with voltages within a predetermined range in a first comparison direction from the lower side toward the higher side or in a second comparison direction from the higher side toward the lower side.

With this, the comparing unit can compare the first analog signal and the second analog signal with the reference voltages within a predetermined voltage range.

The reference voltage supplying unit may supply the reference voltages so that the first analog signal is compared with the reference voltages in the order of gradation accuracies and in the opposite comparison direction from that of the previous reference voltage.

As the comparison directions of the reference voltages of different gradation accuracies to be sequentially applied to the first analog signal are sequentially alternated, the comparison result Vco does not need to change before the start of the next gradation accuracy comparison. Accordingly, the signal processing device shortens the settling period required for each A/D conversion, and can achieve an even higher speed.

The reference voltage supplying unit may supply the reference voltage selected by the selecting unit so that the second analog signal is compared with the reference voltage in the same comparison direction as the direction of the comparison between the reference voltage and the first analog signal.

With this, the signal processing device can realize low-noise A/D conversion, without a decrease in the accuracy of removal of the variation component (or the first analog signal) due to nonlinear characteristics (hysteresis) that vary depending on the scan direction of the reference voltage.

The reference voltage supplying unit may supply the reference voltage having the highest gradation accuracy among the reference voltages so that comparison with voltages within the above described range is performed in the second comparison direction, and supply the reference voltage having the lowest gradation accuracy so that comparison with the voltages within the above described range is performed in the first comparison direction.

With this, the signal processing device can perform A/D conversion on the second analog signal with various gradation accuracies in accordance with logical values changed by the comparing unit with the results of predetermined voltage determination. Accordingly, there is no need to stand by until the comparing unit changes to a stable logical value prior to A/D conversion, and the signal processing device can achieve an even higher speed.

There may be more than one combination of the comparing unit, the selecting unit, the switching unit, and the measuring unit. In each combination, the selecting unit may include a first holding unit and a second holding unit that hold the comparison result. The first holding unit in each combination may hold the comparison result until the results of the comparison performed by the comparing unit in all the combinations are held in the first holding unit. The second holding unit in each combination may hold the comparison result after the first holding unit holds the comparison results in all the combinations, and select one of the reference voltages based on the comparison result held therein.

When the reference voltages are switched in accordance with a result of comparison with the predetermined determination value, noise might be generated in the reference voltage. Further, this noise might cause errors in other comparison results due to delay differences in the clock signal supplied to the respective AD conversion units. Therefore, the comparison result is held until the results of comparison performed by the comparing unit in all the combinations are held in the first holding unit. In this manner, influence of such noise can be reduced.

The present technology can also be realized as a signal processing method for the signal processing device.

Also, an imaging device may be designed to include: a pixel array including unit pixels arranged therein, each of the unit pixels including a photoelectric conversion element that performs photoelectric conversion on incident light; a comparing unit that compares an analog signal output from a unit pixel of the pixel array with a predetermined voltage; a selecting unit that selects one of reference voltages of different gradation accuracies from each other in accordance with a result of comparison performed by the comparing unit between the analog signal and at least one predetermined determination value; a switching unit that switches the reference voltages to be supplied to the comparing unit in accordance with the result of the selection performed by the selecting unit; and a measuring unit that measures timing of a change in the result of the comparison performed by the comparing unit between the analog signal and the reference voltage supplied to the comparing unit through the switching control performed by the switching unit.

Also, an imaging apparatus may be designed to include: an imaging unit that images an object; and an image processing unit that performs image processing on the image data obtained through the imaging performed by the imaging unit. The imaging unit includes: a pixel array including unit pixels arranged therein, each of the unit pixels including a photoelectric conversion element that performs photoelectric conversion on incident light; a comparing unit that compares an analog signal output from a unit pixel of the pixel array with a predetermined voltage; a selecting unit that selects one of reference voltages of different gradation accuracies from each other in accordance with a result of comparison performed by the comparing unit between the analog signal and at least one predetermined determination value; a switching unit that switches the reference voltages to be supplied to the comparing unit in accordance with the result of the selection performed by the selecting unit; and a measuring unit that measures timing of a change in the result of the comparison performed by the comparing unit between the analog signal and the reference voltage supplied to the comparing unit through the switching control performed by the switching unit.

That is, the present technology can be realized as a signal processing device, or can be realized as a device that performs the same signal processing as the signal processing device. Part or all of the control process may be realized by software.

This will be described below in greater detail.

<CMOS Image Sensor>

Figure 5:
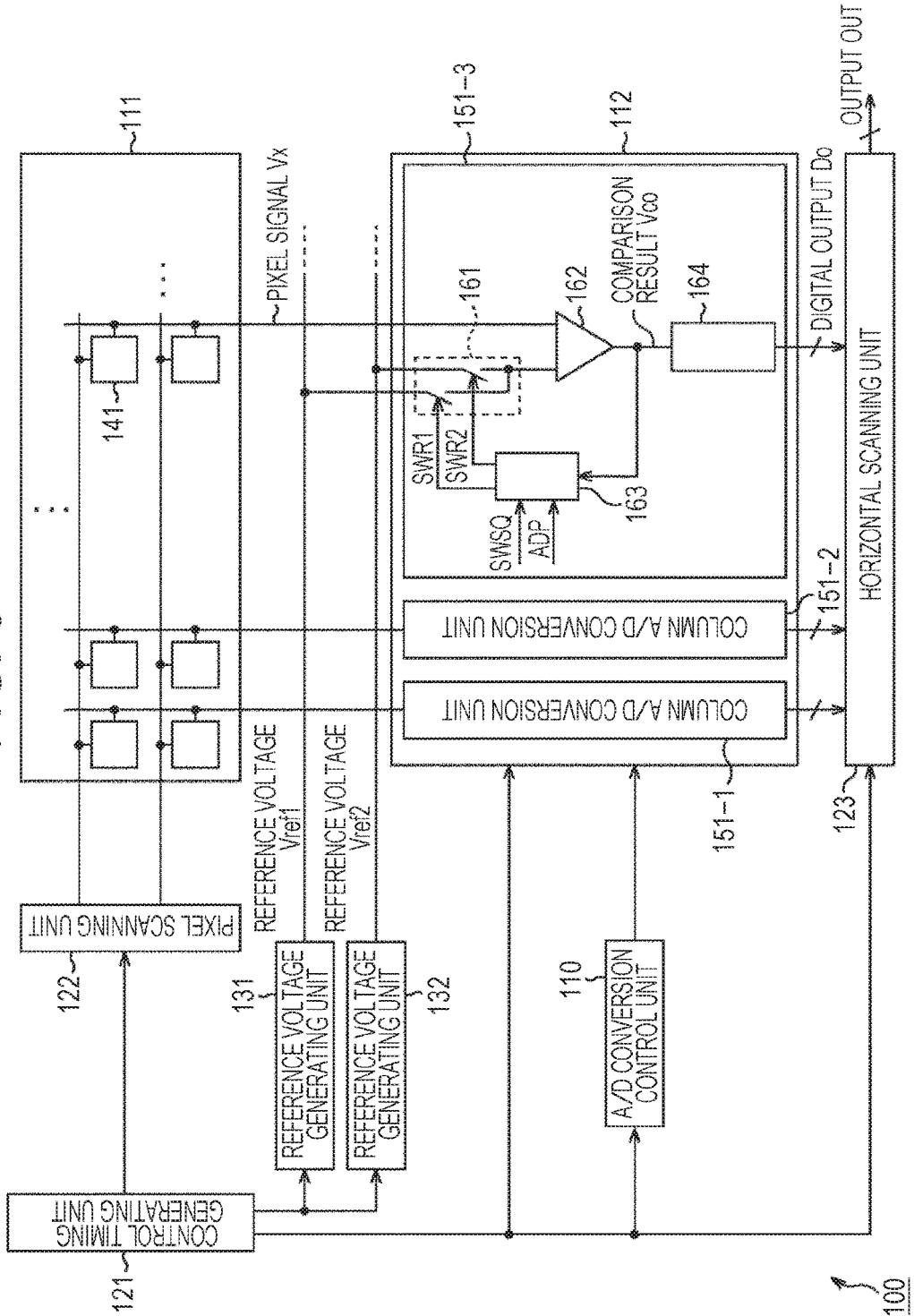
FIG. 5 is a diagram showing a typical example structure of a CMOS image sensor.

FIG. 5 is a diagram showing a typical example structure of a Complementary Metal Oxide Semiconductor (CMOS) image sensor. The CMOS image sensor 100 shown in FIG. 5 is an imaging device using a CMOS. Alternatively, the CMOS image sensor 100 is an example of a signal processing device that processes an image signal obtained in a pixel area. As shown in FIG. 5, the CMOS image sensor 100 includes a pixel array 111 and an A/D conversion unit 112 as an example of a signal processing device. The CMOS image sensor 100 photoelectrically converts light incident on the pixel array 111, performs A/D conversion on the resultant analog signal with the A/D conversion unit 112, and outputs the digital data corresponding to the image corresponding to the incident light.

In the pixel array 111, unit pixels 141 that are indicated by squares in the drawing and include photoelectric conversion elements are arranged in an array-like (matrix-like) form. In FIG. 5, only some of the unit pixels are shown. The number of pixels in the pixel array 111 may be any number. Of course, the number of rows and the number of columns may also be any numbers.

The A/D conversion unit 112 is provided for each column of the pixel array 111, and includes column A/D conversion units 151 as an example of signal processing devices that perform A/D conversion on analog pixel signals Vx read from the respective unit pixels of the corresponding columns.

In FIG. 5, only a column A/D conversion unit 151-1 corresponding to the first column from the left in the pixel array 111, a column A/D conversion unit 151-2 corresponding to the second column from the left, and a column A/D conversion unit 151-3 corresponding to the third column from the left are shown. In reality, the A/D conversion unit 112 includes column A/D conversion units 151 corresponding to all the respective columns of the unit pixels 141 in the pixel array 111. Where there is no need to distinguish the column A/D conversion units from one another, the column A/D conversion units will be referred to simply as the column A/D conversion unit(s) 151.

The number of column A/D conversion units 151 does not need to be the same as the number of columns in the pixel array 111. For example, a single column A/D conversion unit 151 may perform A/D conversion on pixel signals Vx of columns in the pixel array 111. For example, the column A/D conversion units 151 may perform A/D conversion processes on pixel signals Vx of the corresponding columns in a time-sharing manner.

The CMOS image sensor 100 also includes an A/D conversion control unit 110, a control timing generating unit 121, a pixel scanning unit 122, a horizontal scanning unit 123, a reference voltage generating unit 131, and a reference voltage generating unit 132.

The control timing generating unit 121 controls timing of operation of each processing unit by supplying a clock signal to the A/D conversion control unit 110, the A/D conversion unit 112, the pixel scanning unit 122, the horizontal scanning unit 123, the reference voltage generating unit 131, and the reference voltage generating unit 132, for example.

The pixel scanning unit 122 supplies a control signal to each unit pixel 141 in the pixel array 111, to control operation of each unit pixel. The horizontal scanning unit 123 sequentially outputs digital data of the respective rows of unit pixels supplied from the respective column A/D conversion units 151.

The A/D conversion control unit 110 controls of operation of each column A/D conversion unit 151. The reference voltage generating unit 131 supplies a reference voltage Vref1 to each column A/D conversion unit 151. The reference voltage generating unit 132 supplies a different reference voltage Vref2 from the reference voltage Vref1 to each column A/D conversion unit 151.

Each column A/D conversion unit 151 of the A/D conversion unit 112 operates at the timing controlled by the control timing generating unit 121.

Each column A/D conversion unit 151 includes a switching unit 161, a comparing unit 162, a selecting unit 163, and a timing measuring unit 164. Although the structure of the column A/D conversion unit 151-3 is shown in FIG. 5, all the column A/D conversion units 151 including the column A/D conversion unit 151-1 and the column A/D conversion unit 151-2 have the same structure as the column A/D conversion unit 151-3.

The switching unit 161 includes a switch that is provided between the reference voltage generating unit 131 and the comparing unit 162, and is controlled to connect the reference voltage generating unit 131 to the comparing unit 162 or disconnect the reference voltage generating unit 131 from the comparing unit 162 (ON/OFF) by a control signal SWR1 supplied from the selecting unit 163. The switching unit 161 also includes a switch that is provided between the reference voltage generating unit 132 and the comparing unit 162, and is controlled to connect the reference voltage generating unit 132 to the comparing unit 162 or disconnect the reference voltage generating unit 132 from the comparing unit 162 (ON/OFF) by a control signal SWR2 supplied from the selecting unit 163. That is, the switching unit 161 supplies the reference voltage Vref1 supplied from the reference voltage generating unit 131 or the reference voltage Vref2 supplied from the reference voltage generating unit 132, whichever is selected by the selecting unit 163, to the comparing unit 162.

The comparing unit 162 compares the voltage of an analog pixel signal Vx read from a unit pixel 141 with the reference voltage (Vref1 or Vref2) supplied from the switching unit 161. The comparing unit 162 supplies the comparison result Vco (indicating which voltage is higher) to the selecting unit 163 and the timing measuring unit 164.

So as to perform A/D conversion on a pixel signal Vx, the comparing unit 162 compares a reference voltage for scanning a predetermined voltage width with the voltage of the pixel signal Vx. So as to determine the gradation accuracy during A/D conversion of a pixel signal Vx (second analog signal), the comparing unit 162 also compares a reference voltage having a predetermined magnitude (predetermined determination value) with the pixel signal Vx (second analog signal).

In this manner, the same comparing unit 162 performs comparison for A/D conversion of a pixel signal Vx and comparison for determining a gradation accuracy. Accordingly, the column A/D conversion unit 151 can reduce the margin required in the reference voltage range, and realize A/D conversion at higher speed or less power consumption.

Under the control of the A/D conversion control unit 110, the selecting unit 163 selects the reference voltage to be supplied to the comparing unit 162. A control signal ADP and a control signal SWSQ are supplied from the A/D conversion control unit 110 to the selecting unit 163. At the timing based on the values of those control signals, the selecting unit 163 selects the reference voltage Vref1 or the reference voltage Vref2 based on the comparison result Vco supplied from the comparing unit 162. The selecting unit 163 determines the values of the control signal SWR1 and the control signal SWR2 so that the switching unit 161 supplies the selected reference voltage to the comparing unit 162, and supplies the control signal SWR1 and the control signal SWR2 to the switching unit 161.

The timing measuring unit 164 includes a counter, and, with the counter, measures time from the start of comparison in the comparing unit 162 until the time when the value of the comparison result Vco changes. The timing measuring unit 164 supplies the count value (or the length of time from the start of comparison in the comparing unit 162 until the time when the value of the comparison result Vco changes) as the digital data of the pixel signal Vx to the horizontal scanning unit 123.

The timing measuring unit 164 includes a counter that can perform both counting up and counting down. Accordingly, the timing measuring unit 164 can perform a counting operation to realize subtraction of the count value of comparison between the second analog signal (signal level+variation component) and the reference voltage from the count value of comparison between the first analog signal (variation component) and the reference voltage. That is, the timing measuring unit 164 can easily perform this subtraction. The timing measuring unit 164 can also perform this subtraction in a digital field. Accordingly, increases in circuit size and power consumption can be restrained.

Figure 6:
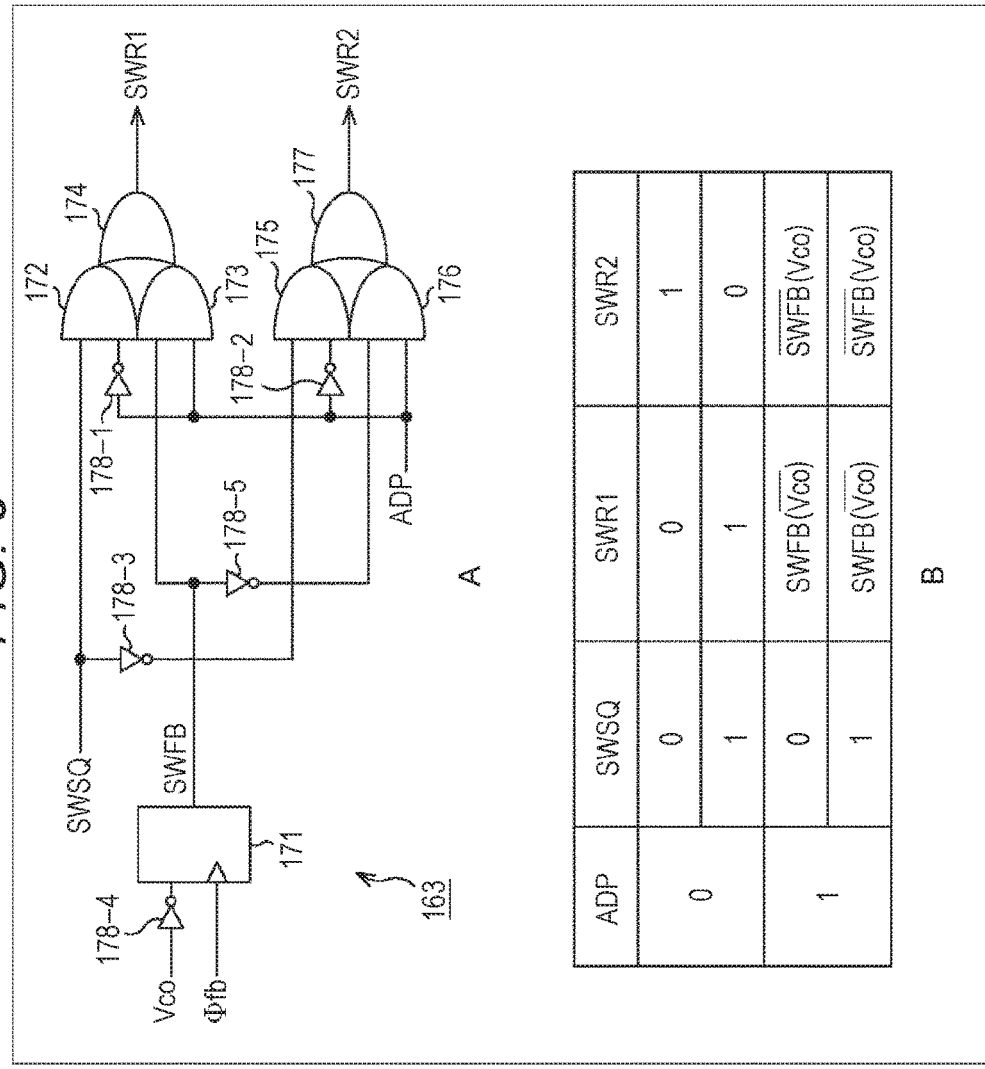
FIG. 6 is a diagram showing a typical example structure of a selecting unit.

Next, the selecting unit 163 in FIG. 5 is described. FIG. 6 is a diagram showing a typical example structure of the selecting unit 163. As shown in A in FIG. 6, the selecting unit 163 includes a latch 171, an AND 172, an AND 173, an OR 174, an AND 175, an AND 176, an OR 177, and NOTs 178-1 through 178-5.

The selecting unit 163 receives control signals ADP, SWSQ, and Φfb, and a comparison result Vco, and outputs control signals SWR1 and SWR2. The control signal Φfb controls the timing to latch negation (SWFB) of the comparison result Vco. A truth table of the control signals ADP and SWSQ, and the control signals SWR1 and SWR2 is shown in B in FIG. 6.

In a case where the control signal ADP is at L level, for example, if the control signal SWSQ is at L level, L level is output as the control signal SWR1, and H level is output as the control signal SWR2. That is, the reference voltage Vref2 is selected, and is then supplied to the comparing unit 162. If the control signal SWSQ is at H level, H level is output as the control signal SWR1, and L level is output as the control signal SWR2. That is, the reference voltage Vref1 is selected, and is then supplied to the comparing unit 162.

In a case where the control signal ADP is at H level after negation of the comparison result Vco is held by the latch 171 with the pulse of the control signal Φfb, for example, a signal SWFB (negation of the comparison result Vco) is output as the control signal SWR1, and negation of the signal SWFB (comparison result Vco) is output as the control signal SWR2, regardless of the value of the control signal SWSQ. That is, in a case where the comparison result Vco is at L level, the reference voltage Vref1 is selected, and is then supplied to the comparing unit 162. In a case where the comparison result Vco is at H level, the reference voltage Vref2 is selected, and is then supplied to the comparing unit 162.

Figure 7:
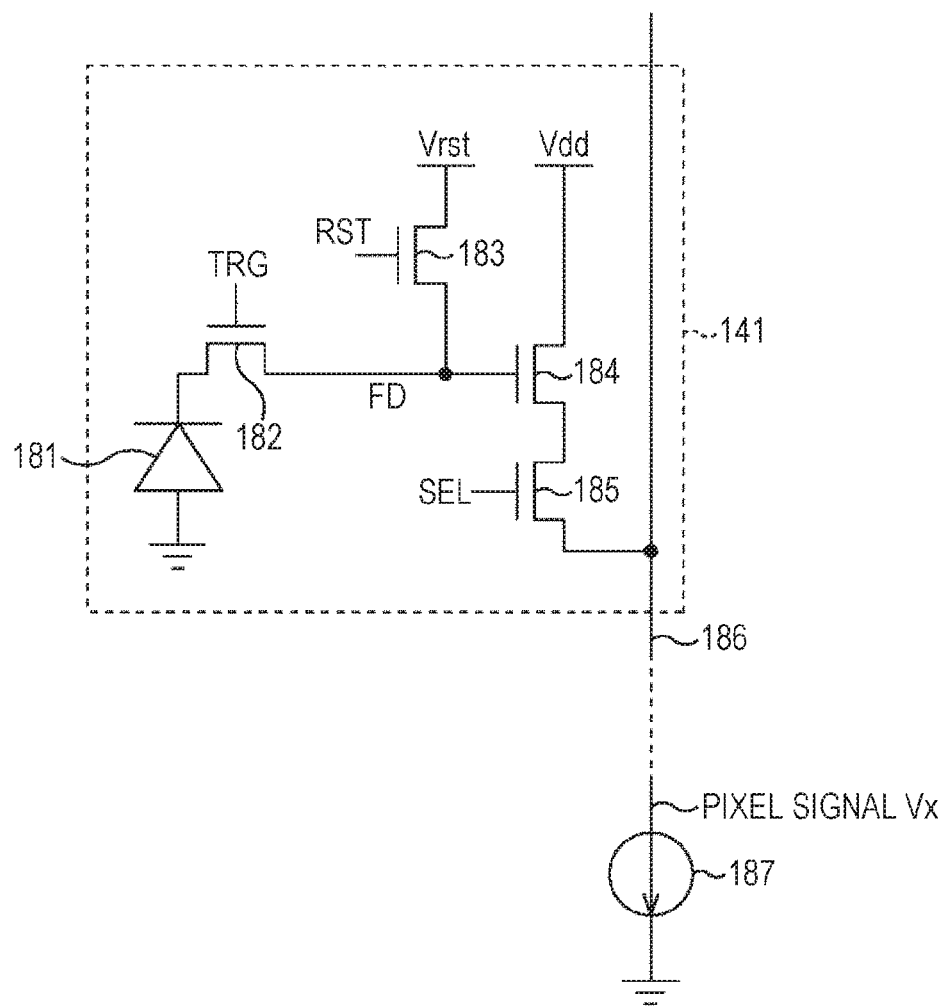
FIG. 7 is a diagram showing a typical example structure of a unit pixel.

Next, a unit pixel 141 in FIG. 5 is described. FIG. 7 is a diagram showing a typical example structure of a unit pixel. As shown in FIG. 7, a unit pixel 141 includes a photodiode 181, a transfer transistor 182, a reset transistor 183, an amplifying transistor 184, and a select transistor 185. The unit pixel 141 is connected to a vertical signal line 186. Other than the unit pixel, a low current source 187 representing a load is connected to the vertical signal line 186.

Optical charge generated at the photodiode 181 that is an example of a photoelectric conversion element is transferred to the parasitic capacitance of a node FD by virtue of a control signal TRG of the gate of the transfer transistor 182, and is subjected to charge-voltage conversion. This voltage is connected to the gate of the amplifying transistor 184, and is output as a pixel signal Vx to the vertical signal line 186 when the pixel is selected by a control signal SEL of the gate of the select transistor 185. Also, the node FD is set at a predetermined voltage Vrst by a control signal RST of the gate of the reset transistor 183, and a pixel signal Vx indicating the variation components of the amplifying transistor 184 and the like can be output.

In the description below, the pixel signal Vx set at the predetermined voltage Vrst by the control signal RST will be referred to as the first analog signal, and the pixel signal Vx having optical charge transferred and a signal level added thereto will be referred to as the second analog signal.

Figure 8:
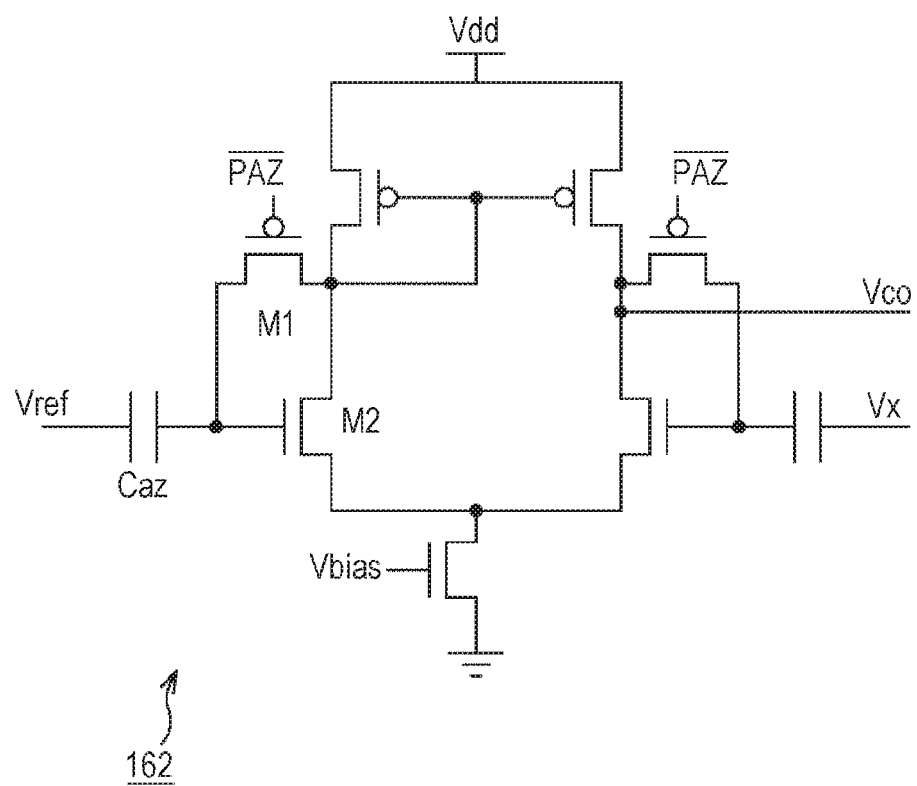
FIG. 8 is a diagram showing a typical example structure of a comparing unit.

Next, the comparing unit 162 is described. FIG. 8 is a diagram showing a typical example structure of the comparing unit 162.

When the magnitude relationship between the pixel signal Vx and the reference voltage Vref is reversed, the comparison result Vco changes from one side to the other. Here, the offset error of a differential amplifier circuit is stored with a control signal PAZ, so that the comparing unit 162 can compare the pixel signal Vx with the reference voltage Vref more accurately.

<Timing Chart>

Figure 9:
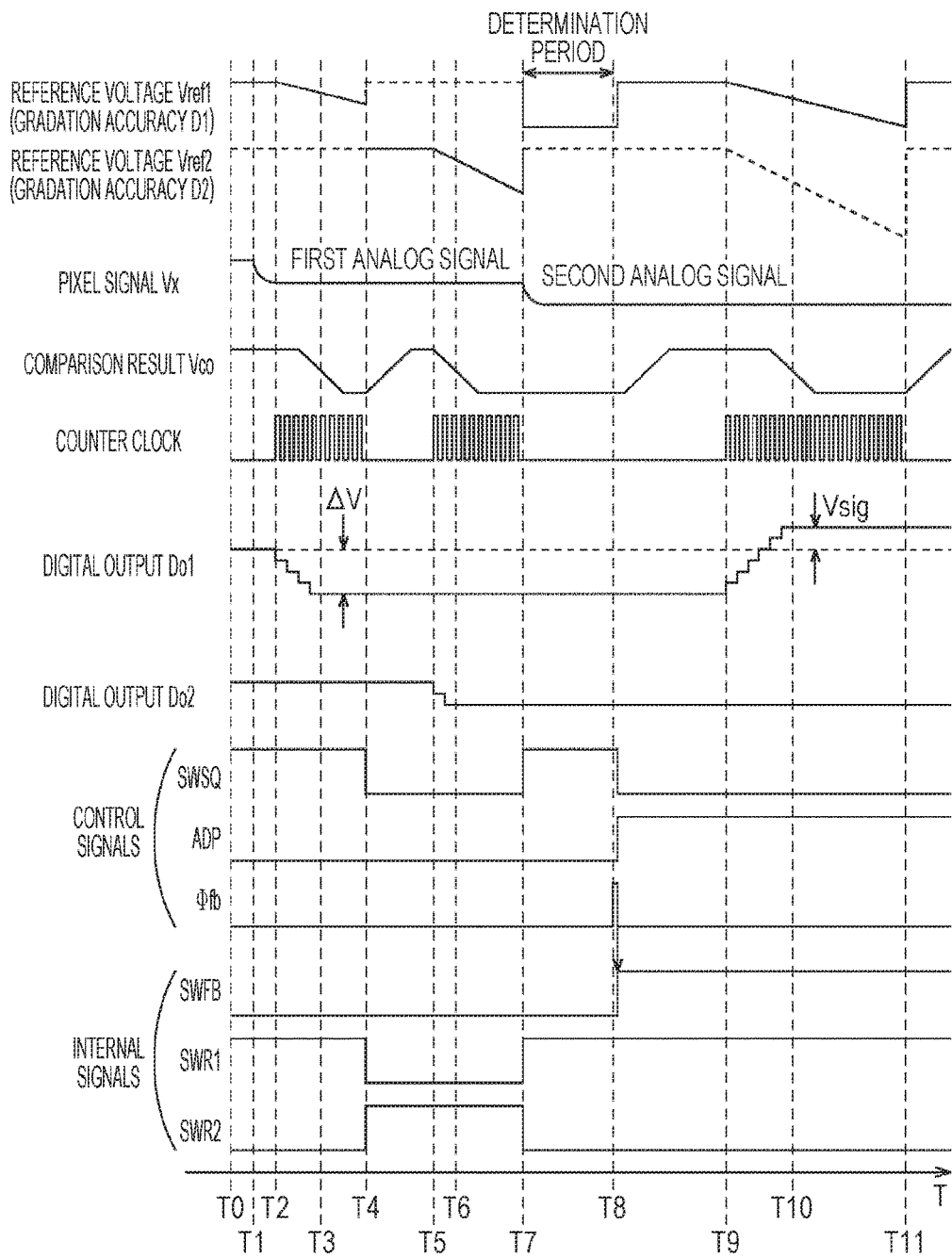
FIG. 9 is a timing chart showing an example of A/D conversion.

Next, flows of operation and control of the CMOS image sensor 100 are described. FIG. 9 is a timing chart showing an example of A/D conversion in a case where the incident light luminance is low or where the amplitude of the second analog signal is small. Here, the respective operation timings in an A/D conversion process for a pixel signal Vx read from a unit pixel 141 are described.

After reading of a pixel signal Vx from a unit pixel 141 is started at time T0, reading of the first analog signal (variation component ΔV) is started at time T1.

At time T2, the reference voltage generating unit 131 starts voltage scan of the reference voltage Vref1. The reference voltage generating unit 131 scans voltage in the direction from the larger side toward the smaller side (comparison direction) with predetermined gradation accuracy D1 (60 uV/LSB, for example) with respect to the reference voltage Vref1 (or performs scan in the direction from the darker side toward the brighter side). This scan continues until time T4.

During the period from time T0 to time T4, the control signal SWSQ is set at H level, the control signal ADP is set at L level, and the control signal Φfb is set at L level. That is, the selecting unit 163 selects the reference voltage Vref1, and the switching unit 161 supplies the reference voltage Vref1 generated by the reference voltage generating unit 131 to the comparing unit 162.

During the period from time T2 to time T4 in which the reference voltage Vref1 is scanning, the comparing unit 162 compares the pixel signal Vx (first analog signal) with the reference voltage Vref1. The timing measuring unit 164 starts counting with the counter clock from time T2. This counting continues until the comparison result Vco of the comparison between the pixel signal Vx (first analog signal) and the reference voltage Vref1 changes, or until time T4.

This comparison result Vco might change at time T3, which is earlier than time T4. In this case, the timing measuring unit 164 ends the counting at time T3. The timing measuring unit 164 outputs this count value as a digital output Do1. That is, the digital output Do1 is the digital value of ΔV.

After the comparison between the reference voltage Vref1 and the first analog signal ends, comparison between the reference voltage Vref2 and the first analog signal is performed. At time T4, the control signal SWSQ is switched to L level, and the reference voltage Vref2 generated by the reference voltage generating unit 132 is supplied to the comparing unit 162 by the switching unit 161.

After standing by until the value of the comparison result Vco changes, the reference voltage generating unit 132 starts voltage scan of the reference voltage Vref2 at time T5. The reference voltage generating unit 132 scans voltage in the direction from the larger side toward the smaller side (comparison direction) with gradation accuracy D2 (240 uV/LSB, for example), which is different from the gradation accuracy D1, with respect to the reference voltage Vref2 (or performs scan in the direction from the darker side toward the brighter side). This scan continues until time T7.

Meanwhile, the comparing unit 162 compares the pixel signal Vx (first analog signal) with the reference voltage Vref2. The timing measuring unit 164 starts counting with the counter clock from time T5. This counting continues until the comparison result Vco of the comparison between the pixel signal Vx (first analog signal) and the reference voltage Vref2 changes, or until time T7.

This comparison result Vco might change at time T6, which is earlier than time T7. In this case, the timing measuring unit 164 ends the counting at time T6. The timing measuring unit 164 outputs this count value as a digital output Do2. That is, the digital output Do2 is the digital value of ΔV.

After the comparison between the reference voltages Vref1 and Vref2 and the first analog signal ends, comparison between the reference voltages and the second analog signal is performed. At time T4, the control signal SWSQ is switched to L level, and the reference voltage Vref2 generated by the reference voltage generating unit 132 is supplied to the comparing unit 162 by the switching unit 161.

As described above, the column A/D conversion unit 151 sequentially performs A/D conversion on the first analog signal with the reference voltage Vref1 and the reference voltage Vref2. Through the voltage scan of the reference voltage, the comparison result Vco changes when the pixel signal Vx and the reference voltage Vrefx become the same as each other, and this timing is measured so that the voltage value can be obtained as a digital value. In the timing measurement, a counter circuit can be used, for example. The counter clock number is counted, and the counting is stopped when the comparison result Vco changes. The time or the voltage width the reference voltage has scanned before the comparison result Vco changes is recorded as a digital value.

The result of the conversion performed with the reference voltage Vref1 and the result of the conversion performed with the reference voltage Vref2 are held in the digital outputs Do1 and Do2, respectively. The digital values obtained here are values of the first analog signal, and therefore, are values of a reset pixel or values of the variation component ΔV. Although Do1 and Do2 are obtained through A/D conversion of the first analog signal, the gradation accuracies differ, and therefore, the digital values of course differ.

Between time T7 and time T8, the column A/D conversion unit 151 sets the reference voltage Vref1 at a predetermined determination value equal to or smaller than the maximum amplitude of the reference voltage Vref1 with respect to the second analog signal, and then compares the reference voltage Vref1 with the second analog signal.

This comparison is performed by using the comparing unit 162 used in the A/D conversion. The obtained comparison result Vco is latched by the latch 171 of the selecting unit 163 with the pulse of the control signal Φfb, and is captured as the signal SWFB at time T8.

The reference voltage to be compared with the second analog signal is selected based on this comparison result. In the example case shown in FIG. 9, the amplitude of the second analog signal is small, and therefore, the second analog signal is compared with the reference voltage Vref1. In the example case shown in FIG. 9, through the capture at time T8, the signal SWFB switches from L level to H level.

As the comparison result Vco is captured, the control signal ADP is switched to H level, and the reference voltage to be supplied to the comparing unit 162 is selected based on the signal SWFB. In the example case shown in FIG. 9, the signal SWFB switches to H level. Accordingly, the control signal SWR1 switches to H level, and the control signal SWR2 switches to L level. As described above, the reference voltage Vref1 is selected.

After standing by until the value of the comparison result Vco changes, the reference voltage generating unit 131 starts voltage scan of the reference voltage Vref1 at time T9. The reference voltage generating unit 131 scans voltage in the direction from the larger side toward the smaller side (comparison direction) with the gradation accuracy D1 with respect to the reference voltage Vref1 (or performs scan in the direction from the darker side toward the brighter side). This scan continues until time T11.

Meanwhile, the comparing unit 162 compares the pixel signal Vx (second analog signal) with the reference voltage Vref1. The timing measuring unit 164 starts counting with the counter clock from time T9. This counting continues until the comparison result Vco of the comparison between the pixel signal Vx (second analog signal) and the reference voltage Vref1 changes, or until time T11.

This comparison result Vco might change at time T10, which is earlier than time T11. In this case, the timing measuring unit 164 ends the counting at time T10. The timing measuring unit 164 outputs this count value as a digital output Do1.

Since the second analog signal contains the variation component ΔV and the signal component Vsig, the column A/D conversion unit 151 performs A/D conversion on the second analog signal, and subtracts the already-determined digital value of the first analog signal from the digital value of the second analog signal, so that the digital value equivalent to the signal component Vsig can be obtained.

Meanwhile (from time T9 to time T11), the reference voltage generating unit 132 also scans the reference voltage Vref2 in the direction from the larger side toward the smaller side (comparison direction) with the gradation accuracy D2 (or performs scan in the direction from the darker side toward the brighter side). In the case shown in FIG. 9, however, the amplitude of the second analog signal is small. Therefore, the reference voltage Vref2 is not supplied to the comparing unit 162 (or is not compared with the second analog signal) under the control of the switching unit 161.

Figure 10:
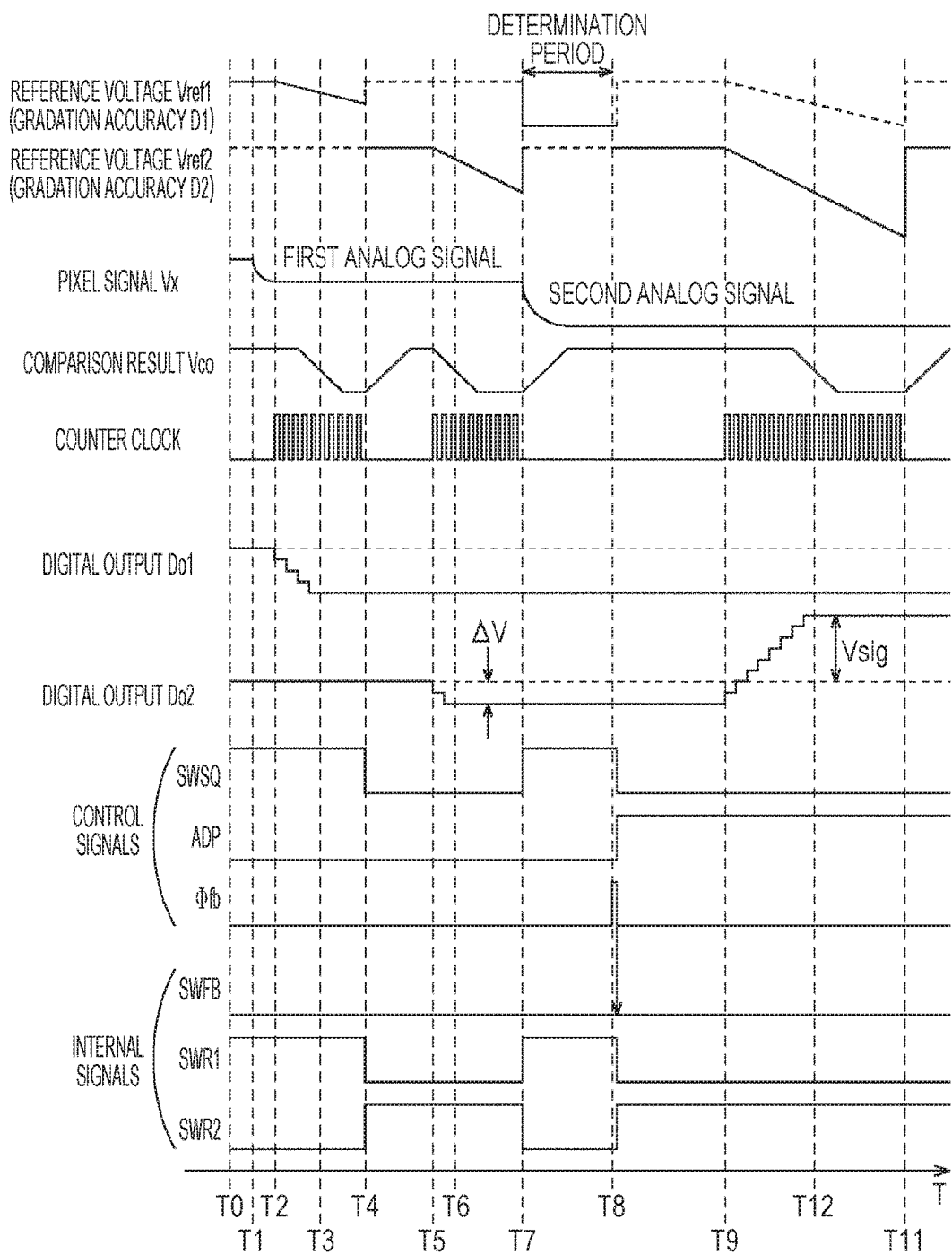
FIG. 10 is a timing chart showing an example of A/D conversion.

Referring now to a timing chart shown in FIG. 10, an example of A/D conversion in a case where the incident light luminance is high or where the amplitude of the second analog signal is large is described.

In the case shown in FIG. 10, the comparison between the first analog signal and the reference voltages is performed in the same manner as in the case shown in FIG. 9. That is, the respective reference voltages (Vref1 and Vref2) are sequentially compared with the first analog signal.

The comparison between the second analog signal and the reference voltage Vref1 set at a predetermined determination value equal to or smaller than the maximum amplitude with respect to the second analog signal is also performed in the same manner as in the case shown in FIG. 9. That is, the processing between time T0 and time T8 is performed in the same manner as in the case shown in FIG. 9.

In the example case shown in FIG. 10, however, the amplitude of the second analog signal is large, and therefore, the second analog signal is compared with the reference voltage Vref2. In the example case shown in FIG. 10, the signal SWFB remains at L level after time T8.

As the comparison result Vco is captured, the control signal ADP is switched to H level. Based on the signal SWFB, the control signal SWR1 switches to L level, and the control signal SWR2 switches to H level. That is, the reference voltage Vref2 is selected as described above.

At time T9, the reference voltage generating unit 132 starts voltage scan of the reference voltage Vref2. The reference voltage generating unit 132 scans voltage in the direction from the larger side toward the smaller side (comparison direction) with the predetermined gradation accuracy D2 with respect to the reference voltage Vref2 (or performs scan in the direction from the darker side toward the brighter side). This scan continues until time T11.

Meanwhile, the comparing unit 162 compares the pixel signal Vx (second analog signal) with the reference voltage Vref2. The timing measuring unit 164 starts counting with the counter clock from time T9. This counting continues until the comparison result Vco of the comparison between the pixel signal Vx (second analog signal) and the reference voltage Vref2 changes, or until time T11.

This comparison result Vco might change at time T12, which is earlier than time T11. In this case, the timing measuring unit 164 ends the counting at time T12. The timing measuring unit 164 outputs this count value as a digital output Do2.

Through such a process, the column A/D conversion unit 151 subtracts the already-determined digital value of the first analog signal from the digital value of the second analog signal, so that the digital value equivalent to the signal component Vsig can be obtained.

Meanwhile (from time T9 to time T11), the reference voltage generating unit 131 also scans the reference voltage Vref1 in the direction from the larger side toward the smaller side (comparison direction) with the gradation accuracy D1 (or performs scan in the direction from the darker side toward the brighter side). In the case shown in FIG. 10, however, the amplitude of the second analog signal is large. Therefore, the reference voltage Vref1 is not supplied to the comparing unit 162 (or is not compared with the second analog signal) under the control of the switching unit 161.

If a counter that can switch between counting up and counting down is used as the timing measuring unit 164, and different count directions are used in A/D conversion of the first analog signal and the second analog signal, respectively, the subtraction of the variation component ΔV and the A/D conversion can be performed at the same time. Also, in a case where the results of A/D conversion of the first analog signal with more than one gradation accuracy are held in timing measuring units independent of each other, a check can be easily made to determine which timing measuring unit should perform the subtraction of the second analog signal, using the value of SWFB, which is a determination result.

As described above, the column A/D conversion units 151 can reduce occurrences of A/D conversion errors. The A/D conversion unit 112 and the CMOS image sensor 100 including the column A/D conversion units 151 can also reduce occurrences of A/D conversion errors. The scan directions (comparison directions) of the reference voltage Vref1 and the reference voltage Vref2 are arbitrarily determined. However, so as to facilitate the calculation of Vsig, the scan direction (comparison direction) of each reference voltage is preferably the same between a case where the first analog signal is subjected to A/D conversion and a case where the second analog signal is subjected to A/D conversion.

<Other Examples of Timing Charts>

In the above described examples shown in FIGS. 9 and 10, A/D conversion is performed on the first analog signal more than once with different gradation accuracies. However, the comparison result Vco that has changed during each A/D conversion needs to change again at the start of the next A/D conversion. As a result, a settling time is generated between A/D conversions. That is, an unnecessary standby time is generated, and the A/D conversion process time unnecessarily becomes longer (the A/D conversion speed becomes lower).

Figure 11:
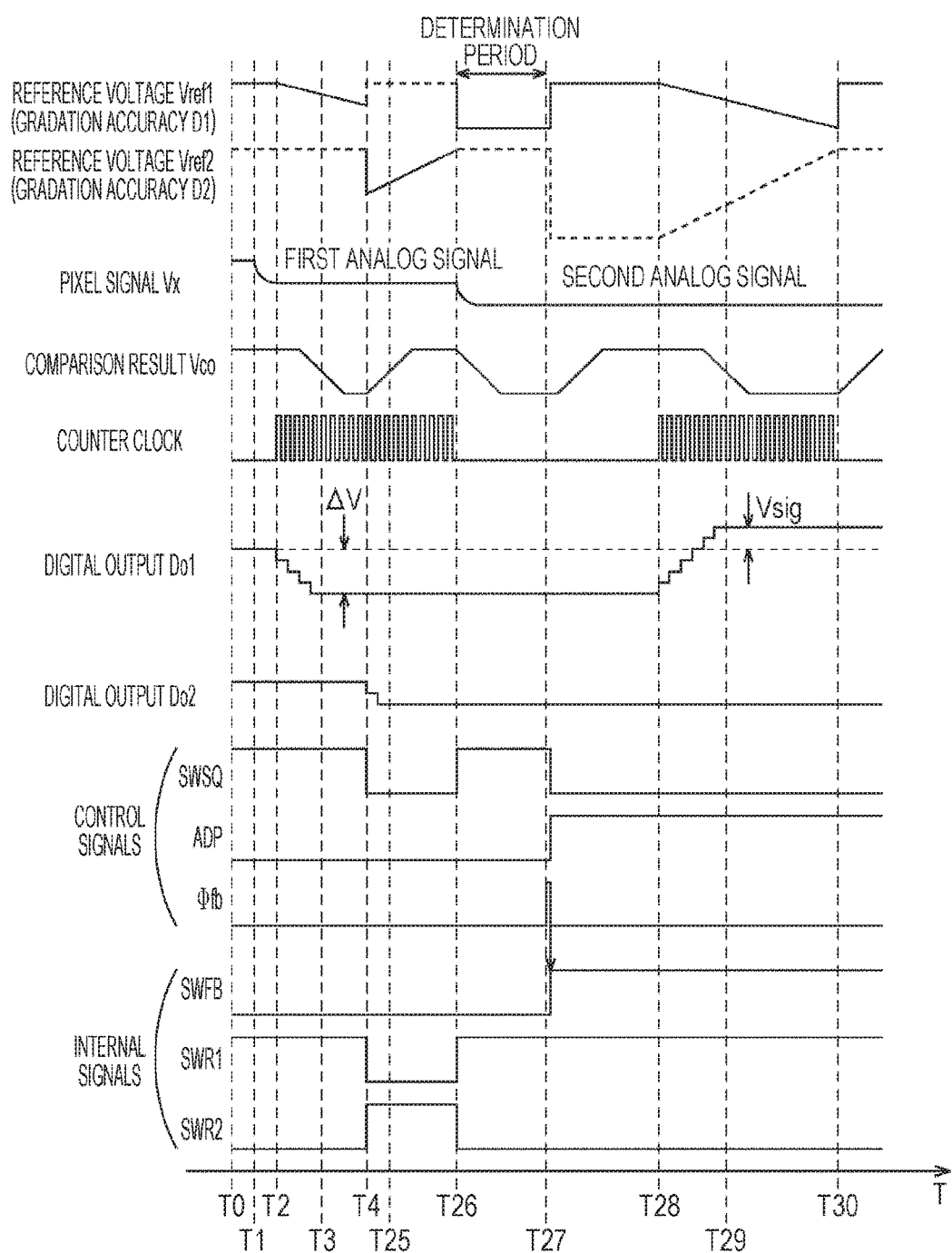
FIG. 11 is a timing chart showing an example of A/D conversion.
Figure 12:
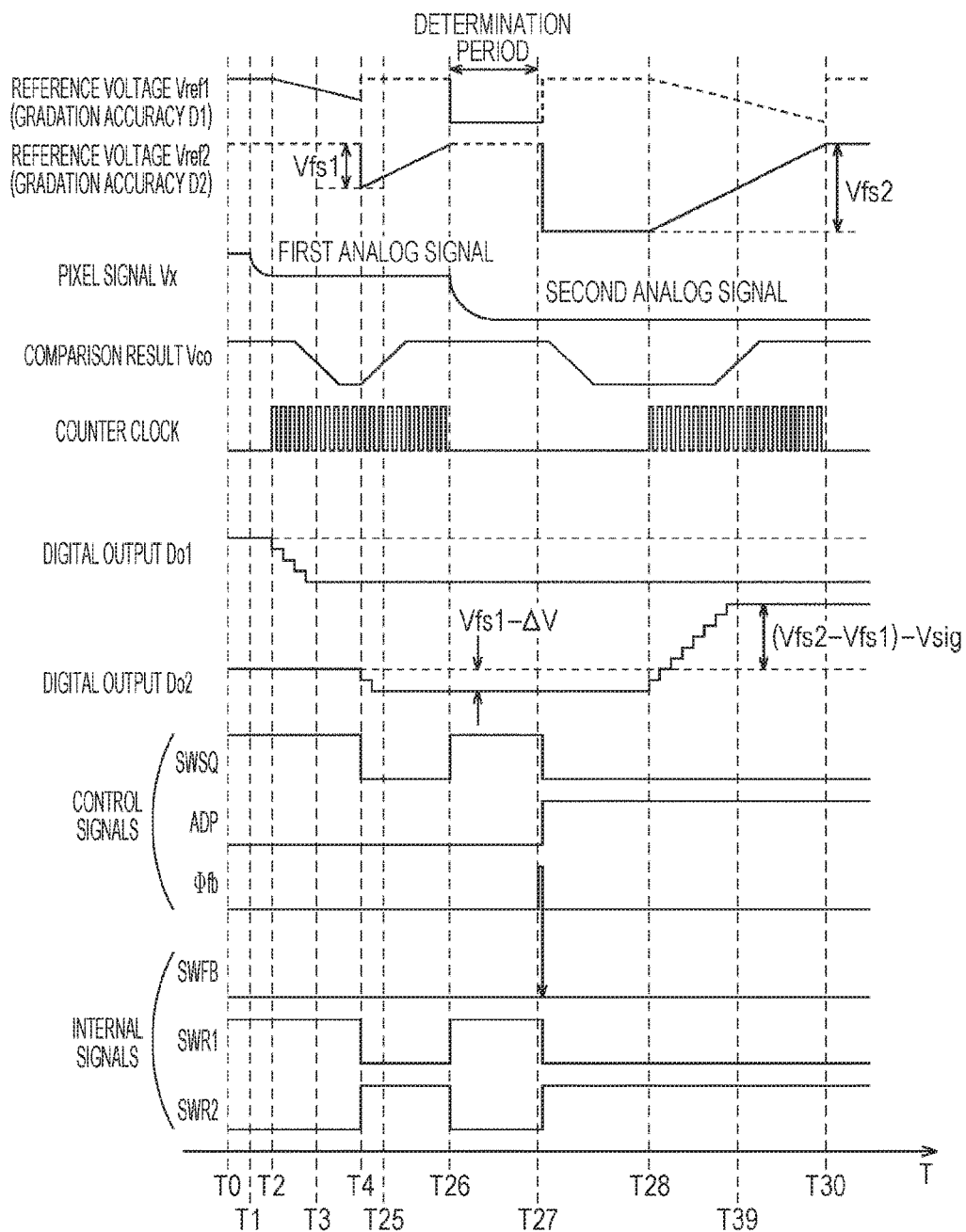
FIG. 12 is a timing chart showing an example of A/D conversion.

In view of this, the voltage scan directions of the reference voltages Vref1 and Vref2 with different gradation accuracies may be alternately used, as shown in FIGS. 11 and 12. With this arrangement, the comparison result Vco does not need to change during the period from the end of comparison between the first analog signal and the reference voltage Vref1 until the start of comparison between the first analog signal and the reference voltage Vref2. That is, with this arrangement, the column A/D conversion unit 151 can restrain generation of any settling time, and the A/D conversion process can be performed at higher speed.

FIG. 11 is a timing chart of a case where the incident light luminance is low or where the amplitude of the second analog signal is small. FIG. 12 is a timing chart of a case where the incident light luminance is high or where the amplitude of the second analog signal is large.

In this case, there is no need to change the value of the comparison result Vco. Accordingly, comparison between the first analog signal and the reference voltage Vref2 can be started at time T4, as shown in FIGS. 11 and 12. That is, at least the settling time between time T4 and time T5 can be eliminated from the processes shown in FIGS. 9 and 10.

As shown in FIGS. 11 and 12, in this case, the reference voltage generating unit 132 scans the reference voltage Vref2 in the direction from the smaller side toward the larger side (the comparison direction opposite from that in the case with the reference voltage Vref1) (or performs scan in the direction from the brighter side toward the darker side). This scan continues until time T26.

This comparison result Vco might change at time T25, which is earlier than time T26. In this case, the timing measuring unit 164 ends the counting at time T25. The timing measuring unit 164 outputs this count value as a digital output Do2.

In both cases shown in FIGS. 11 and 12, the comparison between the predetermined determination value of the reference voltage Vref1 with the higher gradation accuracy and the second analog signal is performed in the same manner as in the cases shown in FIGS. 9 and 10 (from time T26 to time T27).

Also, the comparison between the second analog signal and the reference voltage being scanned is performed in the same manner as in the cases shown in FIGS. 9 and 10 (from time T28 to time T30). The comparison directions of the reference voltage Vref1 and the reference voltage Vref2 are of course the same between the comparison with the first analog signal and the comparison with the second analog signal. For example, in the example case shown in FIG. 11, when compared with the second analog signal, the reference voltage Vref1 scans in the direction from the larger side toward the smaller side (or scans in the direction from the darker side toward the brighter side), and the reference voltage Vref2 scans in the direction from the smaller side toward the larger side (or scans in the direction from the brighter side toward the darker side).

In the example shown in FIG. 11, this comparison result Vco might change at time T29, which is earlier than time T30. In this case, the timing measuring unit 164 ends the counting at time T29. The timing measuring unit 164 outputs this count value as a digital output Do1. As in the case shown in FIG. 9, the column A/D conversion unit 151 can easily obtain the digital value of the signal component Vsig.

In the example shown in FIG. 12, this comparison result Vco might change at time T39, which is earlier than time T30. In this case, the timing measuring unit 164 ends the counting at time T39, and outputs the obtained count value as a digital output Do2.

As shown in FIG. 12, in a case where the scan directions of reference voltages are the opposite of each other, the time from the start of reference voltage scan till a change in the comparison result Vco is measured, and a digital value (Vfs1−ΔV) is obtained with respect to the first analog signal. With respect to the second analog signal, a digital value (Vfs2−(Vsig+ΔV)) is obtained. In a case where subtraction is performed with a count-up/down counter, the eventual output is (Vfs2−Vfs1)−Vsig). Here, Vfs1 represents the voltage amplitude of the reference voltage that has scanned with respect to the first analog signal, Vfs2 represents the voltage amplitude of the reference voltage that has scanned with respect to the second analog signal. Therefore, both Vfs1 and Vfs2 are known values. Accordingly, the column A/D conversion unit 151 can easily calculate Vsig from these digital values.

<Other Examples of Timing Charts>

In the example cases shown in FIGS. 11 and 12, after the determination period, the comparison result Vco changes once before A/D conversion is performed on the second analog signal. This is because the reference voltage Vref1 used for the second analog signal having a smaller amplitude (or darker) than the predetermined determination value scans from the darker side, and therefore, exceeds the pixel signal Vx when the reference voltage changes from the predetermined determination value to a scan start value.

Likewise, the reference voltage Vref2 scans from the brighter side with respect to the second analog signal having a larger amplitude (or brighter) than the predetermined determination value, and therefore, exceeds the pixel signal Vx when the reference voltage changes from the predetermined determination value to the scan start value, resulting in a change in the comparison result Vco.

Therefore, the column A/D conversion unit 151 cannot start A/D conversion before the comparison result Vco stabilizes.

In view of this, the comparison direction (scan direction) of each reference voltage is reversed from that in the cases shown in FIGS. 11 and 12. Specifically, the reference voltage generating unit 131 scans the reference voltage Vref1 with the higher gradation accuracy in the direction from the smaller side toward the larger side (or in the direction from the brighter side toward the darker side). The reference voltage generating unit 132 scans the reference voltage Vref2 with the lower gradation accuracy in the direction from the larger side toward the smaller side (or in the direction from the darker side toward the brighter side). With this arrangement, the comparison result Vco can be prevented from changing during the time from the end of the determination period till the start of the next A/D conversion. In this manner, the column A/D conversion unit 151 can perform A/D conversion at even higher speed.

Figure 13:
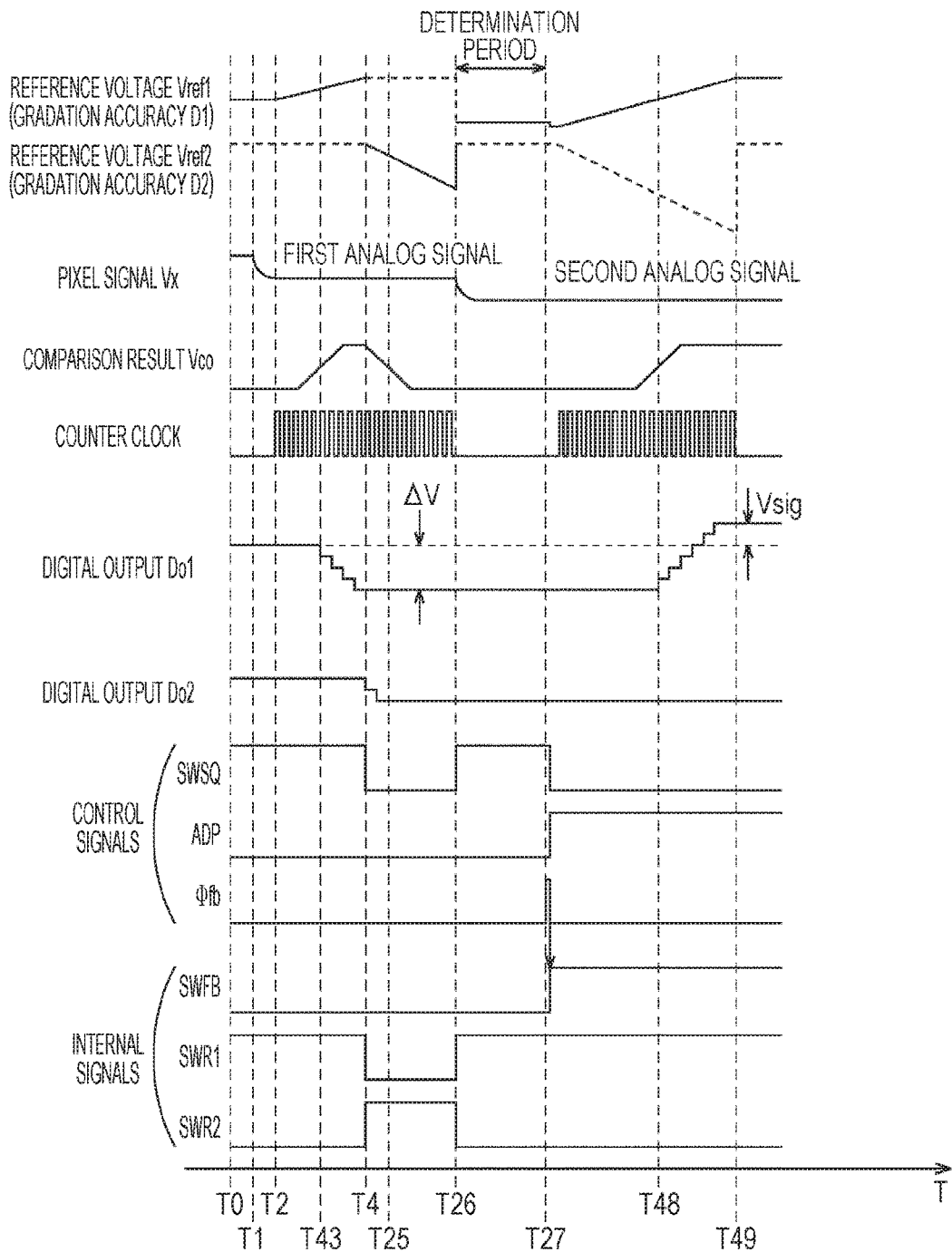
FIG. 13 is a timing chart showing an example of A/D conversion.
Figure 14:
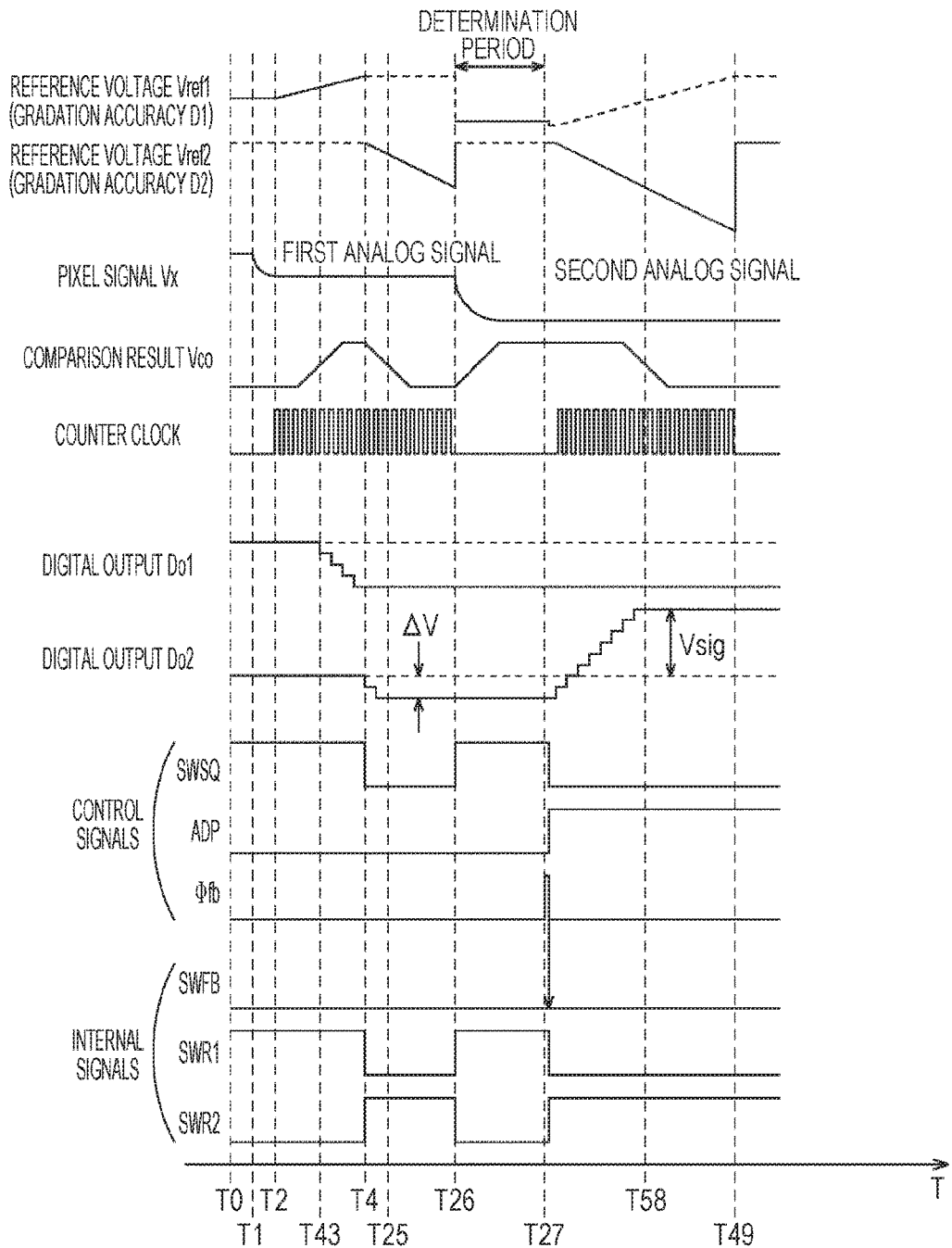
FIG. 14 is a timing chart showing an example of A/D conversion.

FIGS. 13 and 14 show examples of timing charts in such cases. FIG. 13 is a timing chart of a case where the incident light luminance is low or where the amplitude of the second analog signal is small. FIG. 14 is a timing chart of a case where the incident light luminance is high or where the amplitude of the second analog signal is large.

As shown in FIGS. 13 and 14, the scan directions (comparison directions) of the reference voltage Vref1 and the reference voltage Vref2 in these cases are the opposite of those in the example cases shown in FIGS. 11 and 12. Accordingly, during the A/D conversion of the second analog signal, the pulse of the control signal Φfb is generated after the end of the determination period (time T27), and the reference voltage Vref1 and the reference voltage Vref2 can be scanned when the control signal ADP switches to H level. That is, from this point on, comparison between the second analog signal and the reference voltage Vref1 or the reference voltage Vref2 can be performed. Accordingly, the column A/D conversion unit 151 can eliminate the settling time between time T27 and time T28 shown in FIGS. 11 and 12, and can perform A/D conversion at higher speed.

In the examples shown in FIGS. 11 and 12, when the reference voltage Vref2 is compared with the first analog signal or the second analog signal, the timing measuring unit 164 measures the length of the period from the start of scan till a change in the comparison result Vco as in the case with the reference voltage Vref1, though the reference voltage Vref2 is scanned in the opposite direction from that for the reference voltage Vref1. Therefore, any digital value equivalent to Vsig is not directly obtained.

In the examples shown in FIGS. 13 and 14, on the other hand, the timing measuring unit 164 can directly obtain a digital value equivalent to Vsig, by measuring the period from the time when the comparison result Vco changes until the reference voltage scan ends.

In the example case shown in FIG. 13, as for the comparison between the reference voltage Vref1 and the first analog signal, the timing measuring unit 164 measures the period from time T43 when the comparison result Vco changes until time T4 when the reference voltage scan ends, for example. As for the comparison between the reference voltage Vref1 and the second analog signal, the timing measuring unit 164 measures the period from time T48 when the comparison result Vco changes until time T49 when the reference voltage scan ends, for example. By carrying out such measurement, the timing measuring unit 164 can directly obtain digital values equivalent to Vsig. Accordingly, when performing subtraction with a count-up/down counter, the timing measuring unit 164 obtains Vsig as a digital output. The timing measuring unit 164 may of course perform counting in the same manner as above with respect to the reference voltage Vref2 in the examples shown in FIGS. 11 and 12.

<Another Example of the Selecting Unit>

The comparison result Vco obtained through comparison with the predetermined determination value is held as SWFB by the selecting unit 163 shown in FIG. 6, and is used in controlling the switching unit 161 that switches reference voltages. As the predetermined determination value is supplied from the reference voltage generating unit 131, noise is generated in the reference voltage when the comparison result Vco is reflected in SWFB and reference voltages are switched. In a case where common reference voltages are used among the column A/D conversion units 151 as in the CMOS image sensor 100 shown in FIG. 5, the timing supplies of the control signal Φfb to the respective column A/D conversion units 151 might shift from one another. In such a case, the column A/D conversion unit 151 that has first reflected a comparison result adds noise to the reference voltage, and superimposes the error on the comparison result of from the other column A/D conversion units 151, causing the other column A/D conversion units 151 to select a wrong reference voltage.

Figure 15:
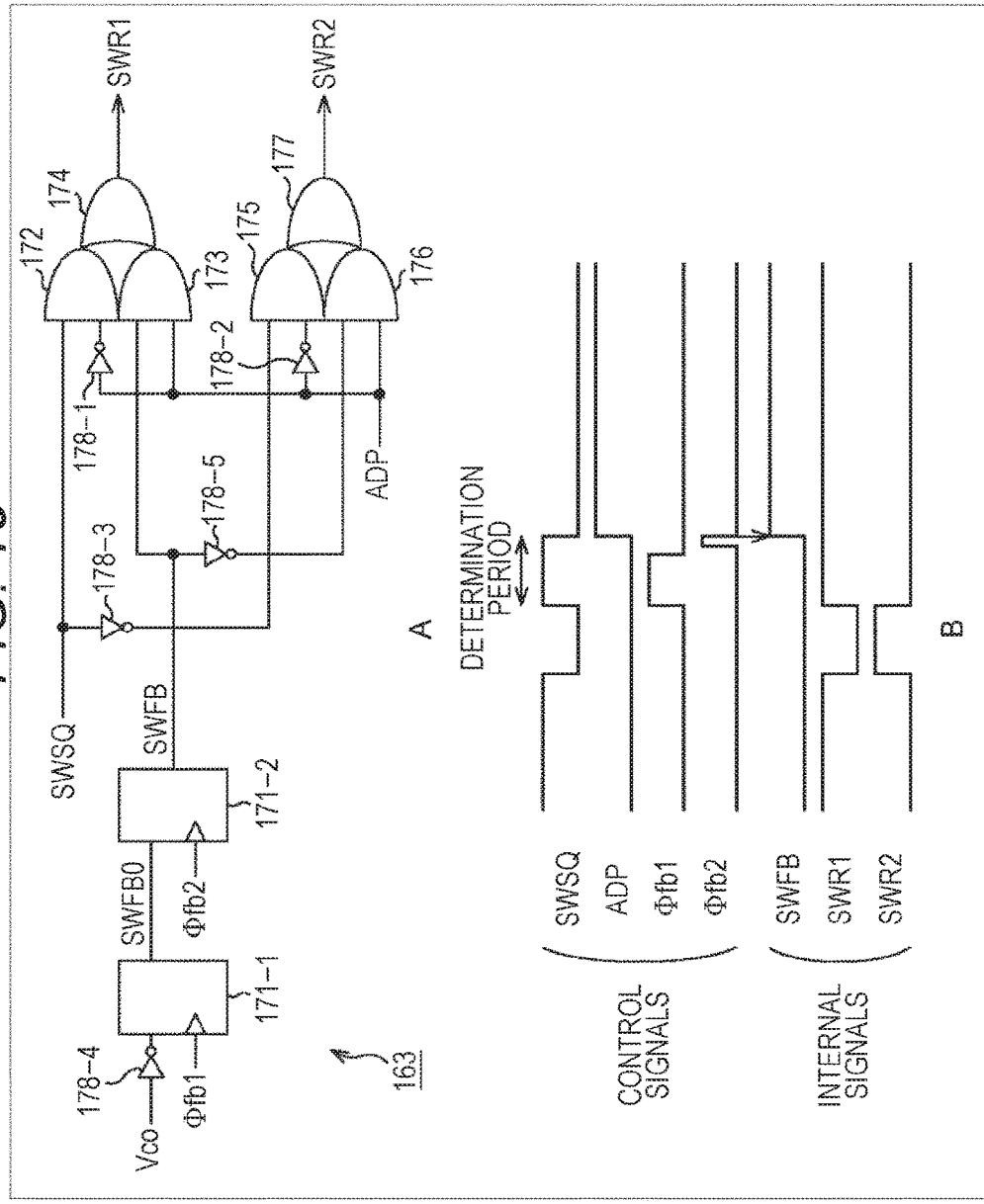
FIG. 15 is a diagram showing a typical example structure of a selecting unit.

Therefore, the holding of the comparison result Vco in the selecting unit 163 may be a two-phase operation with Φfb1 and Φfb2, as shown in A in FIG. 15. With Φfb1, the comparison result to be reflected in SWFB may be determined in all the column A/D conversion units 151. With Φfb2, reference voltages may be switched.

FIG. 15 is a diagram showing a typical example structure of the selecting unit. In A in FIG. 15, the selecting unit 163 includes a latch 171-1 and a latch 171-2, instead of the latch 171 of the structure shown in FIG. 6. Both of the latch 171-1 and the latch 171-2 are processing units that are the same as the latch 171 shown in FIG. 6. Where there is no need to distinguish the latch 171-1 and the latch 171-2 from each other, they will be referred to simply as the latch(es) 171. The latch 171-1 holds negation of the comparison result Vco at a timing controlled by a control signal Φfb1, and outputs the holding value as a signal SWFB0. The latch 171-2 holds the signal SWFB0 output from the latch 171-1 at a timing controlled by a control signal Φfb2, and outputs the holding value as a signal SWFB.

Specifically, as shown in the timing chart in B in FIG. 15, the latch 171-1 holds negation of the comparison result Vco, and, after all the column A/D conversion units 151 hold negation of the comparison result Vco, the latch 171-2 holds the held negation of the comparison result Vco. That is, the value of the signal SWFB is determined. In this manner, the CMOS image sensor 100 can restrict a reference voltage selection made by a column A/D conversion unit 151 from affecting a reference voltage selection by any other column A/D conversion unit 151.

Figure 16:
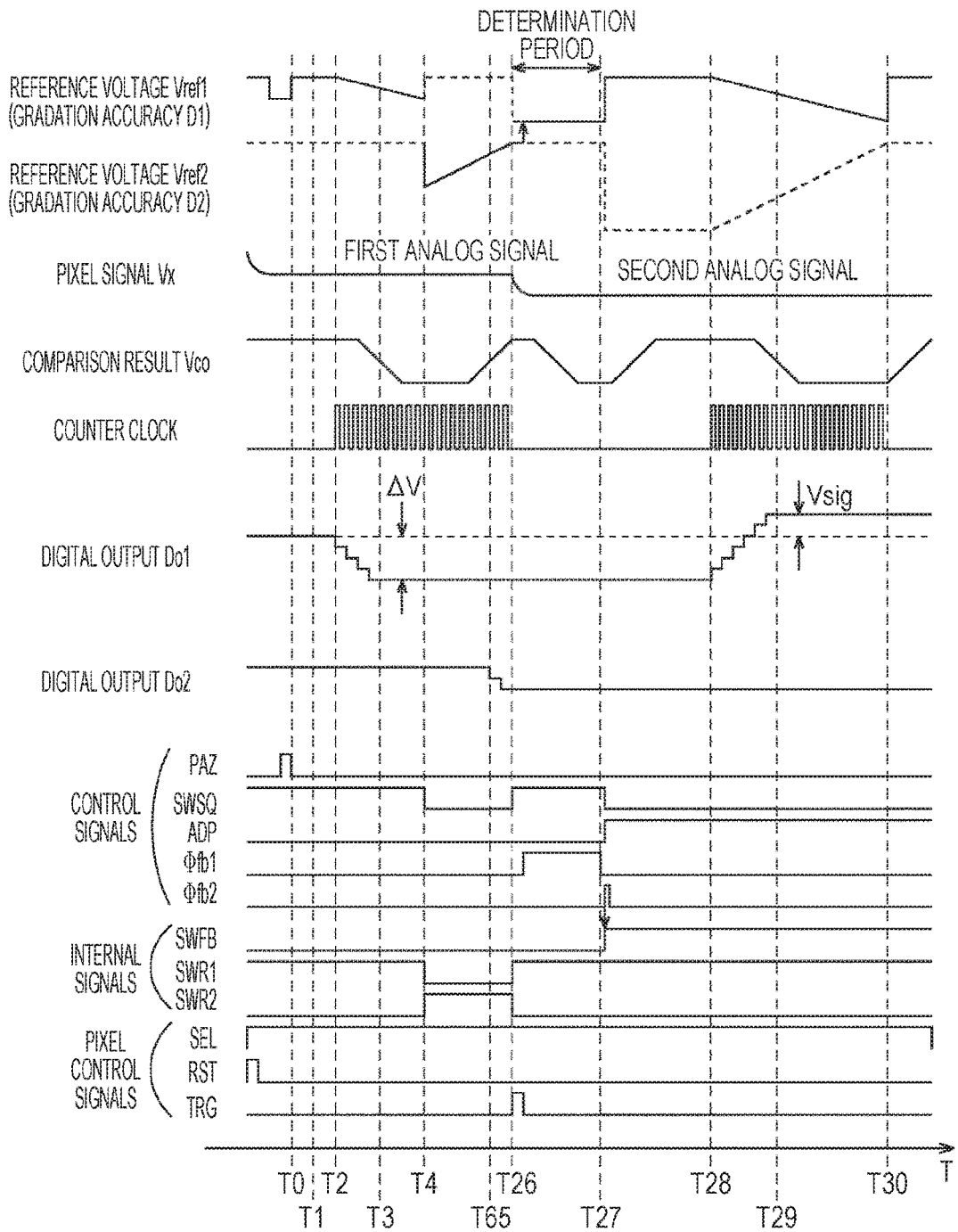
FIG. 16 is a timing chart showing an example of A/D conversion.
Figure 17:
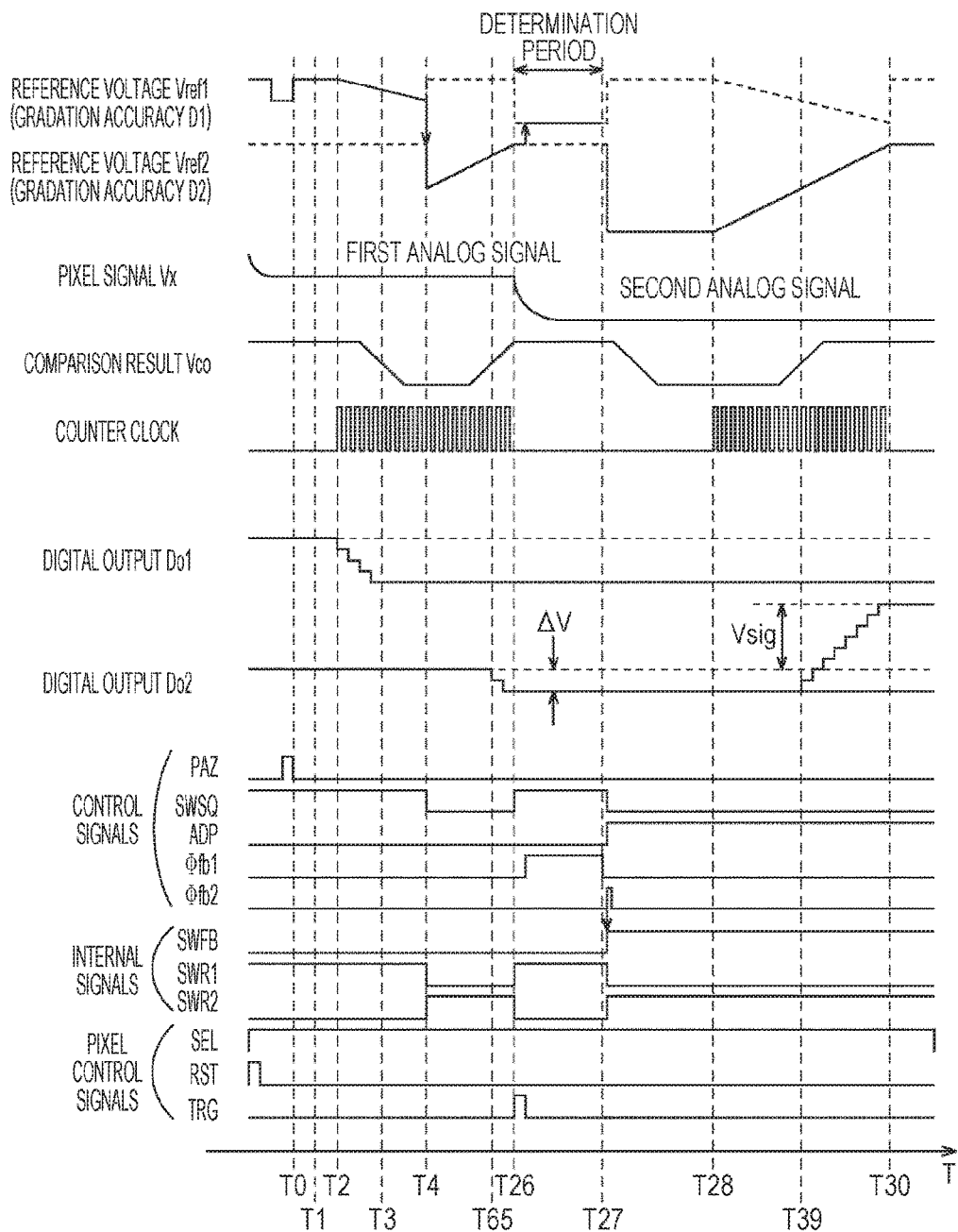
FIG. 17 is a timing chart showing an example of A/D conversion.

FIGS. 16 and 17 show timing charts of examples of A/D conversion to be performed by the CMOS image sensor 100 of FIG. 5 in a case where the above selecting unit 163, the unit pixels 141 of FIG. 7, and the comparing unit 162 of FIG. 8 are employed. FIG. 16 is a timing chart of a case where the incident light luminance is low or where the amplitude of the second analog signal is small. FIG. 17 is a timing chart of a case where the incident light luminance is high or where the amplitude of the second analog signal is large.

The comparison directions (scan directions) of the reference voltage Vref1 and the reference voltage Vref2 are the same as those in the cases shown in FIGS. 11 and 12. In the example case shown in FIG. 17, with respect to the reference voltage Vref2, the timing measuring unit 164 measures the period from the time when the comparison result Vco changes until the time when the reference voltage scan ends, a described above in <Other Examples of Timing Charts>. By doing so, the timing measuring unit 164 can directly obtain digital values equivalent to Vsig.

<Another Example of the CMOS Image Sensor>

Figure 18:
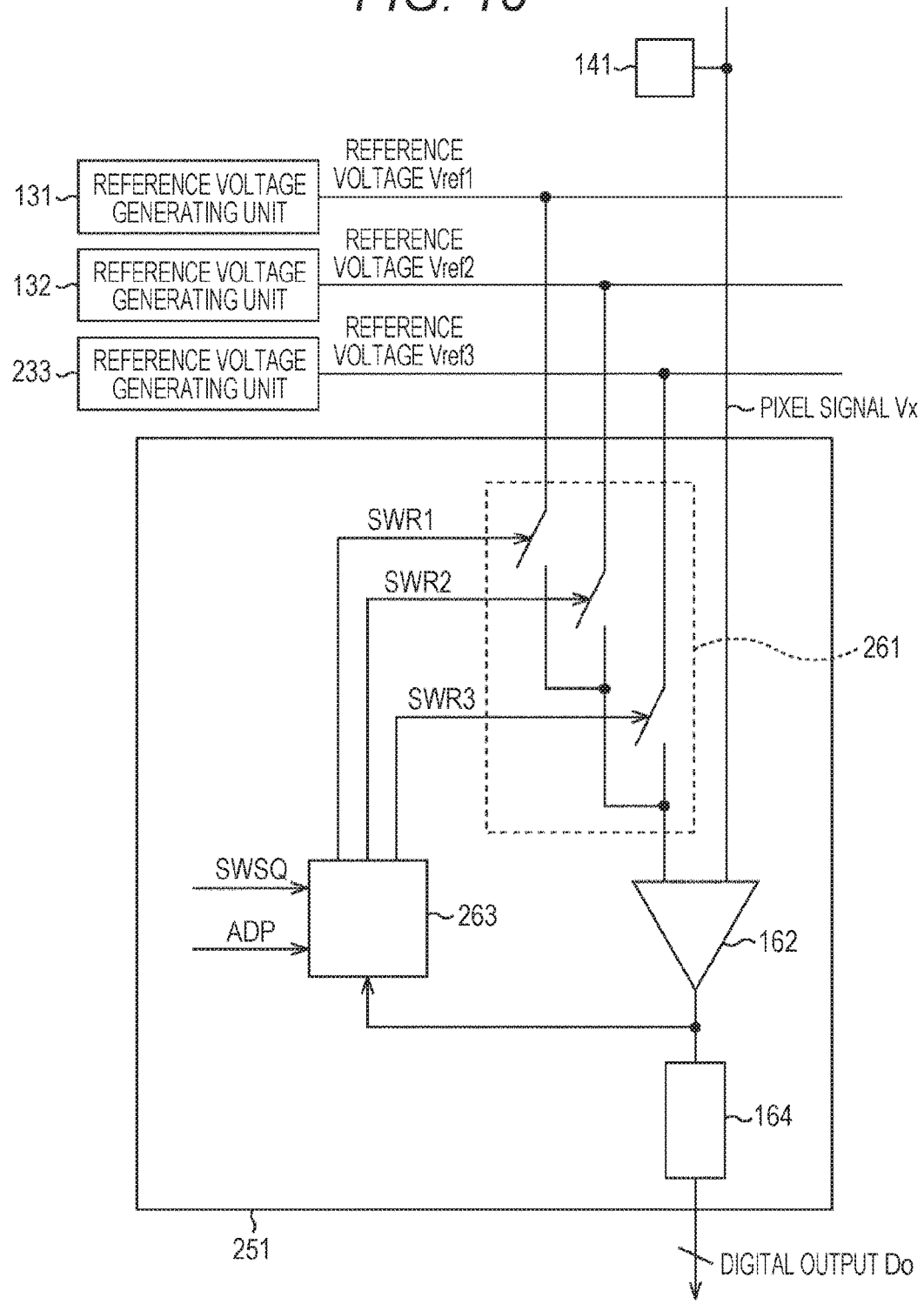
FIG. 18 is a diagram showing a typical example structure of part of a CMOS image sensor.

It should be noted that three or more gradation accuracies may be used. FIG. 18 is a diagram showing a typical example structure of part of the CMOS image sensor 100 that uses three gradation accuracies.

As shown in FIG. 18, the CMOS image sensor 100 in this case includes a reference voltage generating unit 233 as well as the reference voltage generating unit 131 and the reference voltage generating unit 132. The reference voltage generating unit 233 is the same processing unit as the reference voltage generating unit 131 and the reference voltage generating unit 132, but generates a reference voltage Vref3 that scans with a different gradation accuracy D3 from those of the reference voltage Vref1 and the reference voltage Vref2.

In this case, the CMOS image sensor 100 includes column A/D conversion units 251, instead of the column A/D conversion units 151. The column A/D conversion units 251 basically have the same structure as the column A/D conversion units 151, and perform the same processing as the column A/D conversion units 151. However, the column A/D conversion units 251 each perform A/D conversion on a pixel signal Vx, using three reference voltages (the reference voltages Vref1 through Vref3). Specifically, each column A/D conversion unit 251 includes a switching unit 261, instead of the switching unit 161, and a selecting unit 263, instead of the selecting unit 163.

As shown in FIG. 18, the switching unit 261 includes a switch that connects one of the reference voltage generating units 131, 132, and 233 to the comparing unit 162, and disconnects the other ones from the comparing unit 162, under the control of the selecting unit 263. That is, the switching unit 261 supplies one of the reference voltages Vref1 through Vref3 to the comparing unit 162 in accordance with control signals SWR1 through SWR3 supplied from the selecting unit 263.

Under the control of the A/D conversion control unit 110, the selecting unit 263 selects the reference voltage to be supplied to the comparing unit 162. A control signal ADP and a control signal SWSQ are supplied from the A/D conversion control unit 110 to the selecting unit 263. At the timing based on the values of those control signals, the selecting unit 263 selects one of the reference voltages Vref1 through Vref3 based on the comparison result Vco supplied from the comparing unit 162. The selecting unit 263 determines the values of the control signals SWR1 through SWR3 so that the switching unit 261 supplies the selected reference voltage to the comparing unit 162, and supplies the control signals SWR1 through SWR3 to the switching unit 161.

Figure 19:
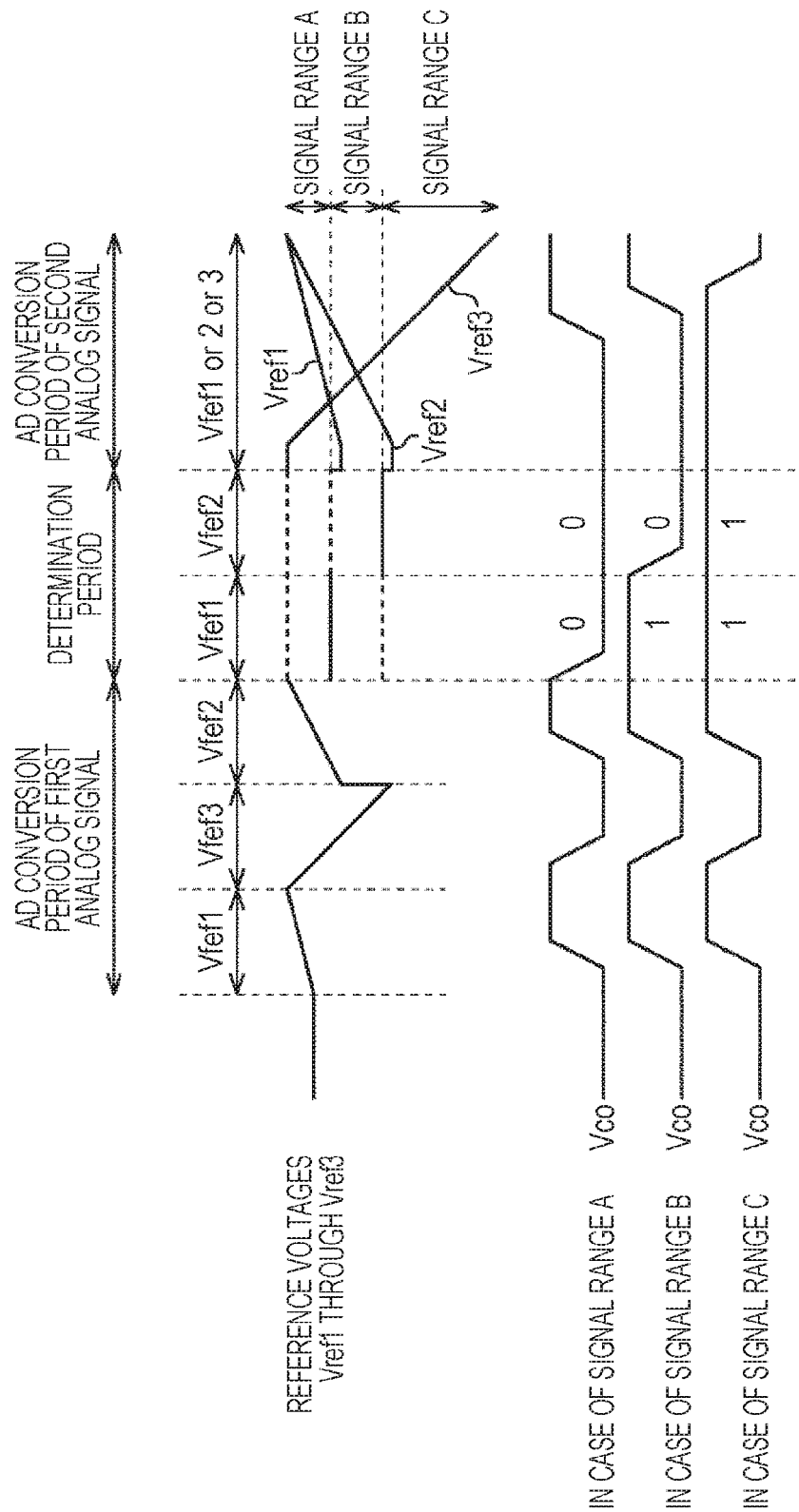
FIG. 19 is a timing chart showing an example of A/D conversion.

FIG. 19 is a timing chart showing an example of A/D conversion in this case.

For simplicity, FIG. 19 collectively shows the reference voltages Vref1 through Vref3. The reference voltage Vref1 with the highest gradation accuracy is scanned in the direction from the brighter side toward the darker side, and the reference voltage Vref3 with the lowest gradation accuracy is scanned in the direction from the darker side toward the brighter side. Here, the intermediate reference voltage Vref2 is set in the direction from the brighter side toward the darker side so that the scan directions are alternately used during the A/D conversion period of the first analog signal.

Since the reference voltage with a higher gradation accuracy is used as the predetermined determination value during the determination period, the boundary between the reference voltage Vref1 and the reference voltage Vref2 is determined with the use of the reference voltage Vref1, and the boundary between the reference voltage Vref2 and the reference voltage Vref3 is determined with the use of the reference voltage Vref2. In a case where a second determination result Vco is "0, 0", the second analog signal is in a signal range A, and therefore, the reference voltage Vref1 is used. Likewise, in the case of "1, 0", the second analog signal is in a signal range B, and the reference voltage Vref2 is used. In the case of "1, 1", the second analog signal is in a signal range C, and the reference voltage Vref3 is used.

Here, with respect to the second analog signal, each reference voltage uses the same scan direction as the scan direction used for the first analog signal, and one of the reference voltages Vref1 through Vref3 is used for the second analog signal in accordance with the determined signal range. As shown in FIG. 19, the comparison result Vco does not need to change during the period from the end of the determination period till the start of A/D conversion, and high-speed operation can be performed.

In this high-speed operation, the scan direction of the intermediate reference voltage Vref2 can be arbitrarily determined. For example, in a case where the reference voltage Vref2 needs to be scanned in the opposite direction (in the direction from the darker side toward the brighter side) from that in FIG. 19, "Vref2→Vref1→Vref3" realizes alternating order during the A/D conversion period of the first analog signal. Further, where the order of predetermined determination values during the determination period is "Vref2→Vref1", the number of changes in the comparison result Vco can be prevented from increasing, even if the reference voltage Vref2 is in the opposite direction (from that in FIG. 19).

As A/D conversion is performed with the gradation accuracy corresponding to the output level of the pixel in the above described manner, an AD conversion operation can be performed at high speed with low power consumption, while a high gradation accuracy is used for a low-output range. Particularly, increases in the area of any additional circuit related to output level determination are restrained, and prolongation of an AD conversion period due to expansion of the voltage range of a reference voltage caused by a determination error is restrained. Furthermore, the settling period required between AD conversions due to the use of two or more reference voltages with different gradation accuracies is shortened. Accordingly, operation can be performed at higher speed.

2. Second Embodiment

<Distributed Constants>

Figure 20:
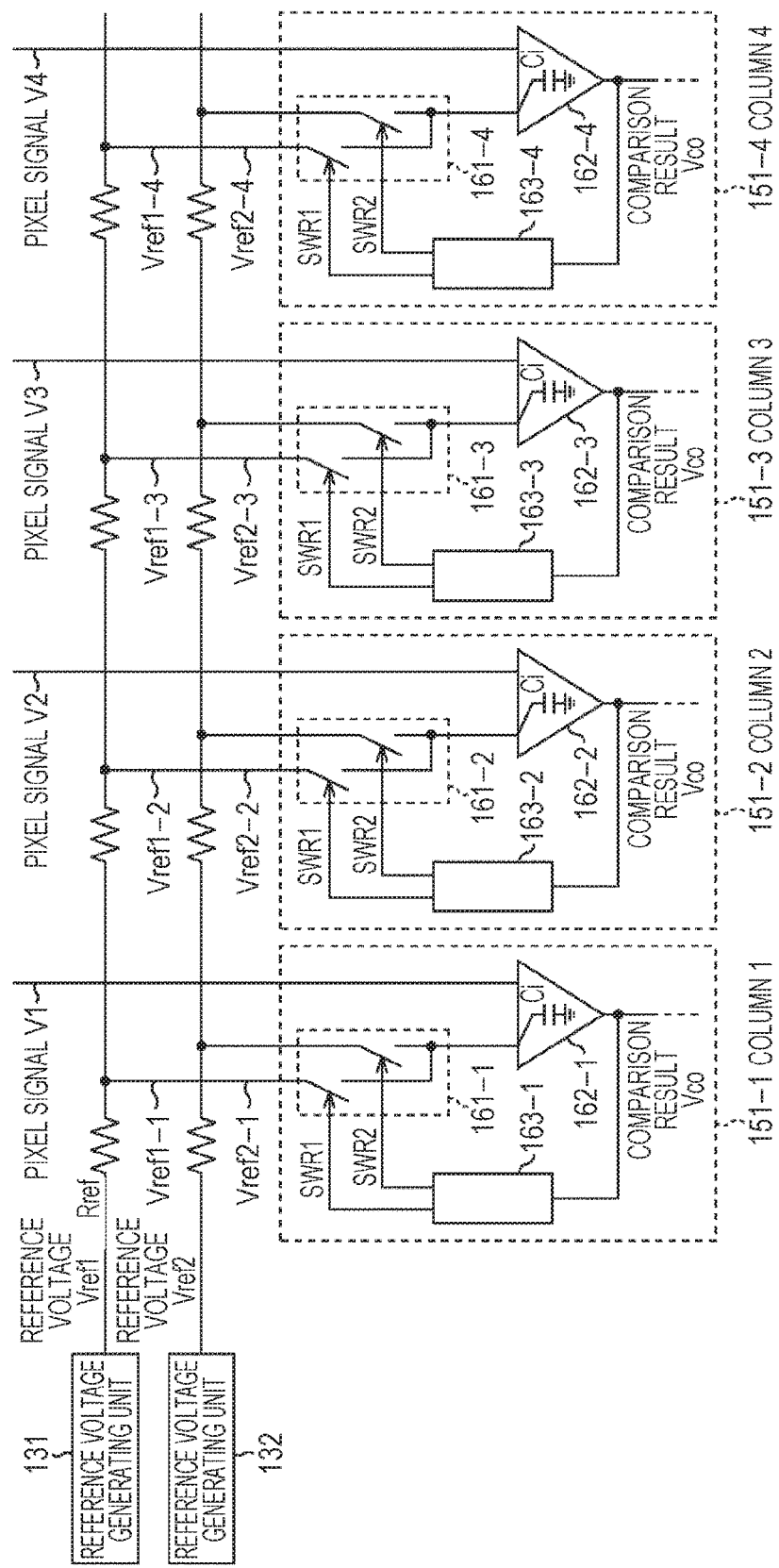
FIG. 20 is a diagram showing a typical example structure of part of a CMOS image sensor.

As described above in the first embodiment, in the CMOS image sensor 100, the reference voltage Vref1 and the reference voltage Vref2 are connected to the column A/D conversion units 151. For example, as shown in FIG. 20, four column A/D conversion units 151 (column A/D conversion units 151-1 through 151-4) might be arranged in parallel.

In this case, a parasitic resistance Rref is applied to the line extending from the reference voltage generating unit 131 or the reference voltage generating unit 132 to each column A/D conversion unit 151. In each respective column A/D conversion unit 151, a parasitic capacitance such as the input capacitance Ci of the corresponding one of the comparing units 162-1 through 162-4 is applied as a distributed constant.

Figure 21:
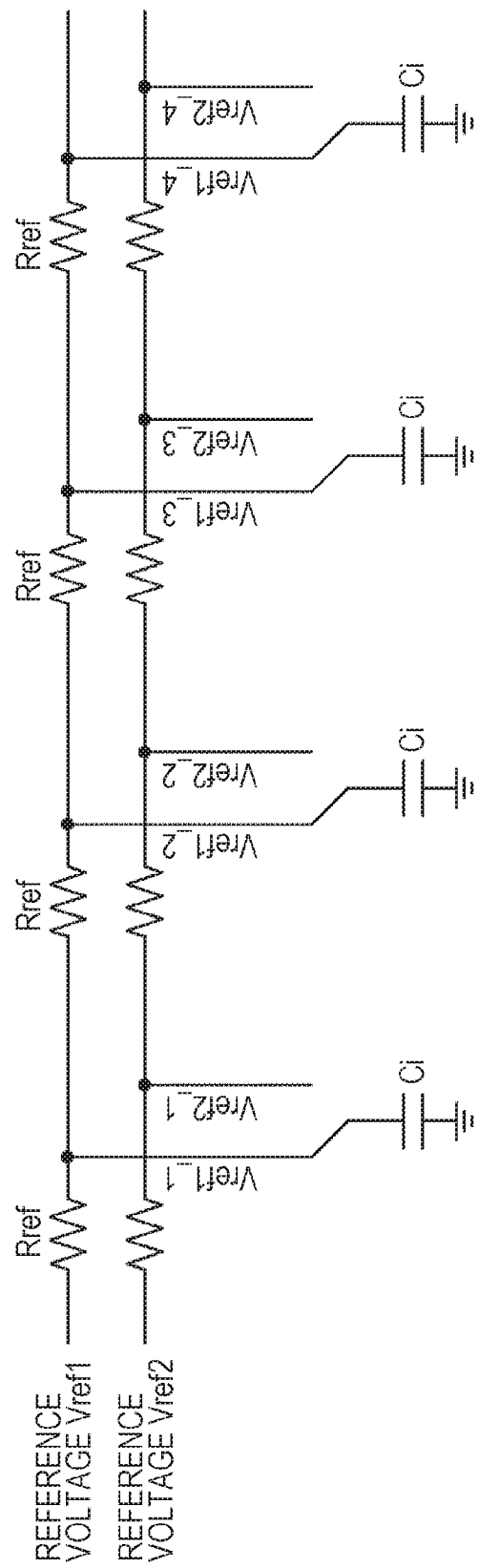
FIG. 21 is a diagram showing an example of distributed constants.
Figure 22:
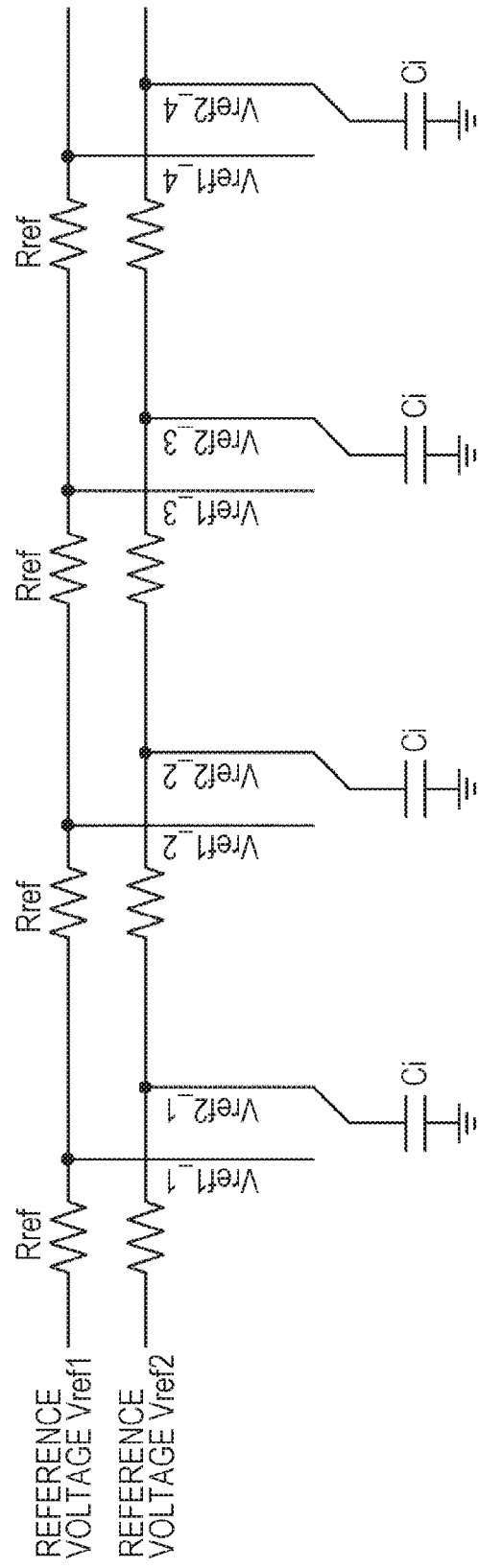
FIG. 22 is a diagram showing an example of distributed constants.

In a case where the first analog signals are compared with the reference voltage Vref1, the distributed constants are as shown in FIG. 21. In a case where the first analog signals are compared with the reference voltage Vref2, the distributed constants are as shown in FIG. 22. That is, in these cases, all the column A/D conversion units 151 are connected to the reference voltage Vref1 or to the reference voltage Vref2.

On the other hand, in such an output range that all the second analog signals are subjected to A/D conversion with the reference voltage Vref1, for example, the connected state becomes as shown in FIG. 21, and the distributed constants are the same as those in a case where the first analog signals are subjected to A/D conversion with the reference voltage Vref1.

Figure 23:
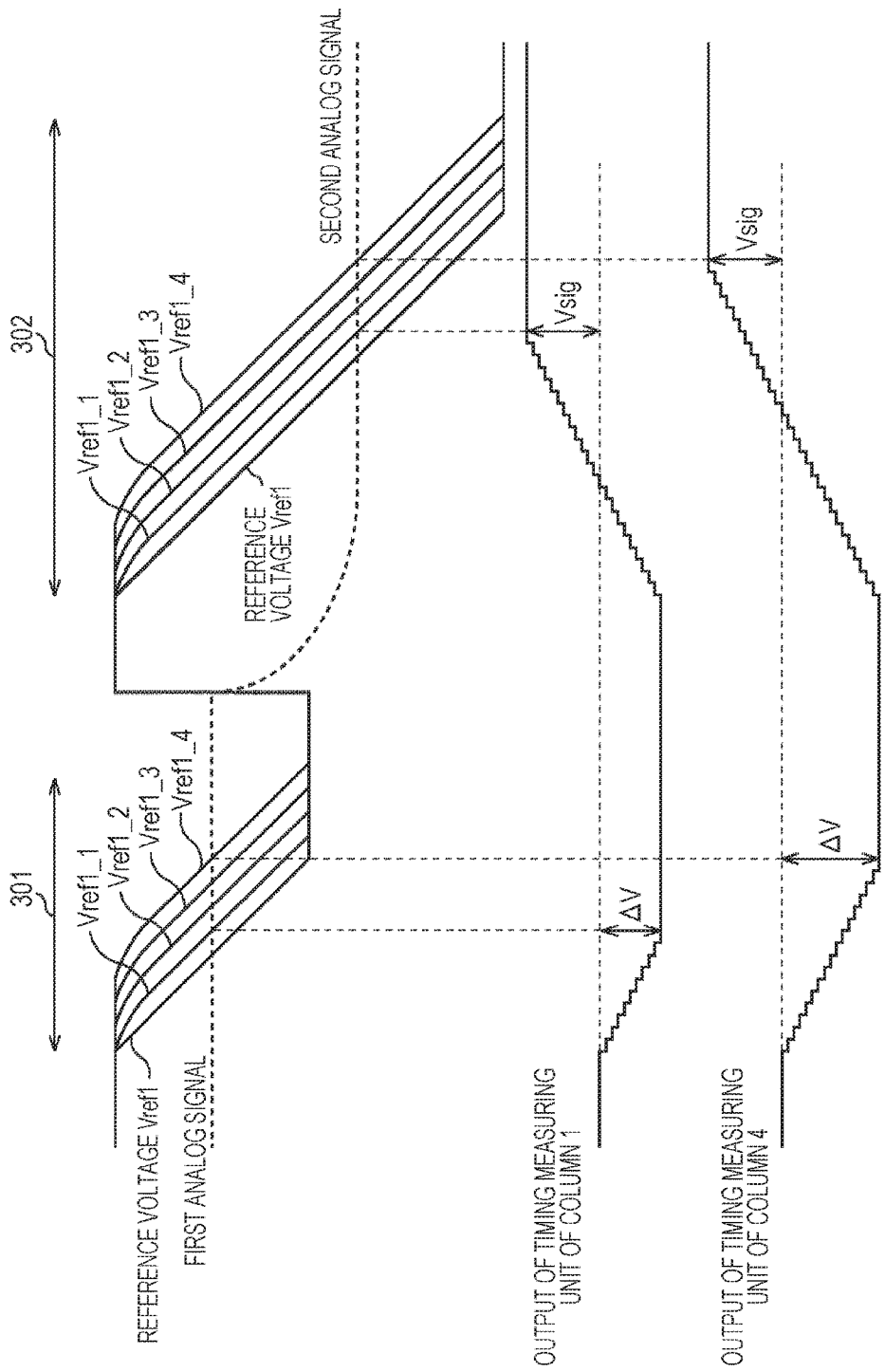
FIG. 23 is a timing chart showing an example of A/D conversion.

Therefore, as shown in FIG. 23, even if delay variations such as Vref1_1 through Vref1_4 are caused in the reference voltage Vref1 in respective columns 1 through 4 due to the parasitic resistance and the parasitic capacitance, the delays at the respective nodes during the A/D conversion of the first analog signals and the A/D conversion of the second analog signals (the delays during the period indicated by a double-headed arrow 301 and the delays during the period indicated by a double-headed arrow 302 in the respective columns) are the same as each other. Accordingly, all the A/D conversion results are correct, and digital values equivalent to Vsig are output. For simplicity, FIG. 23 does not show the period of A/D conversion of the first analog signals with Vref2, and the brightness determination period.

This applies in the case of an output range in which all the second analog signals are subjected to A/D conversion with the reference voltage Vref2. That is, during the A/D conversion period of the second analog signals, the distributed constant circuit shown in FIG. 22 appears. Accordingly, the delays at the respective Vref2_x nodes are the same as those during the AD conversion period of the first analog signals, and the signal components Vsig are subjected to correct digital conversion.

In the case of the second analog signals, however, there is a possibility that the voltage ranges of the second analog signals V1 through V4 of the respective columns coexist in the A/D conversion range of the reference voltage Vref1 and the A/D conversion range of Vref2, or high and low voltages coexist with respect to the predetermined determination value. At this point, the reference voltage Vref1 or the reference voltage Vref2 is selected in accordance with the result of determination in the column A/D conversion unit 151 of each column.

For example, the second analog signal V1 of column 1 and the second analog signal V4 of column 4 have smaller signal amplitudes than the predetermined determination value, and the second analog signal V2 of column 2 and the second analog signal V3 of column 3 have larger signal amplitudes than the predetermined determination value. In this case, the reference voltage Vref1 is selected for column 1 and column 4, and the reference voltage Vref2 is selected for column 2 and column 3.

Figure 24:
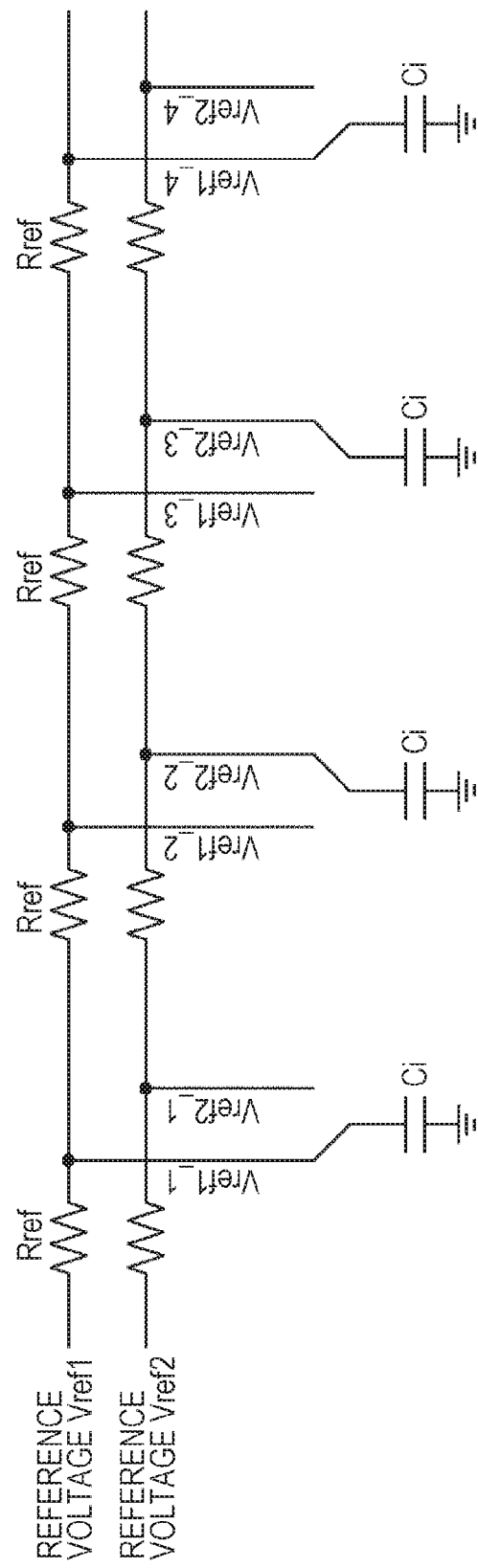
FIG. 24 is a diagram showing an example of distributed constants.
Figure 25:
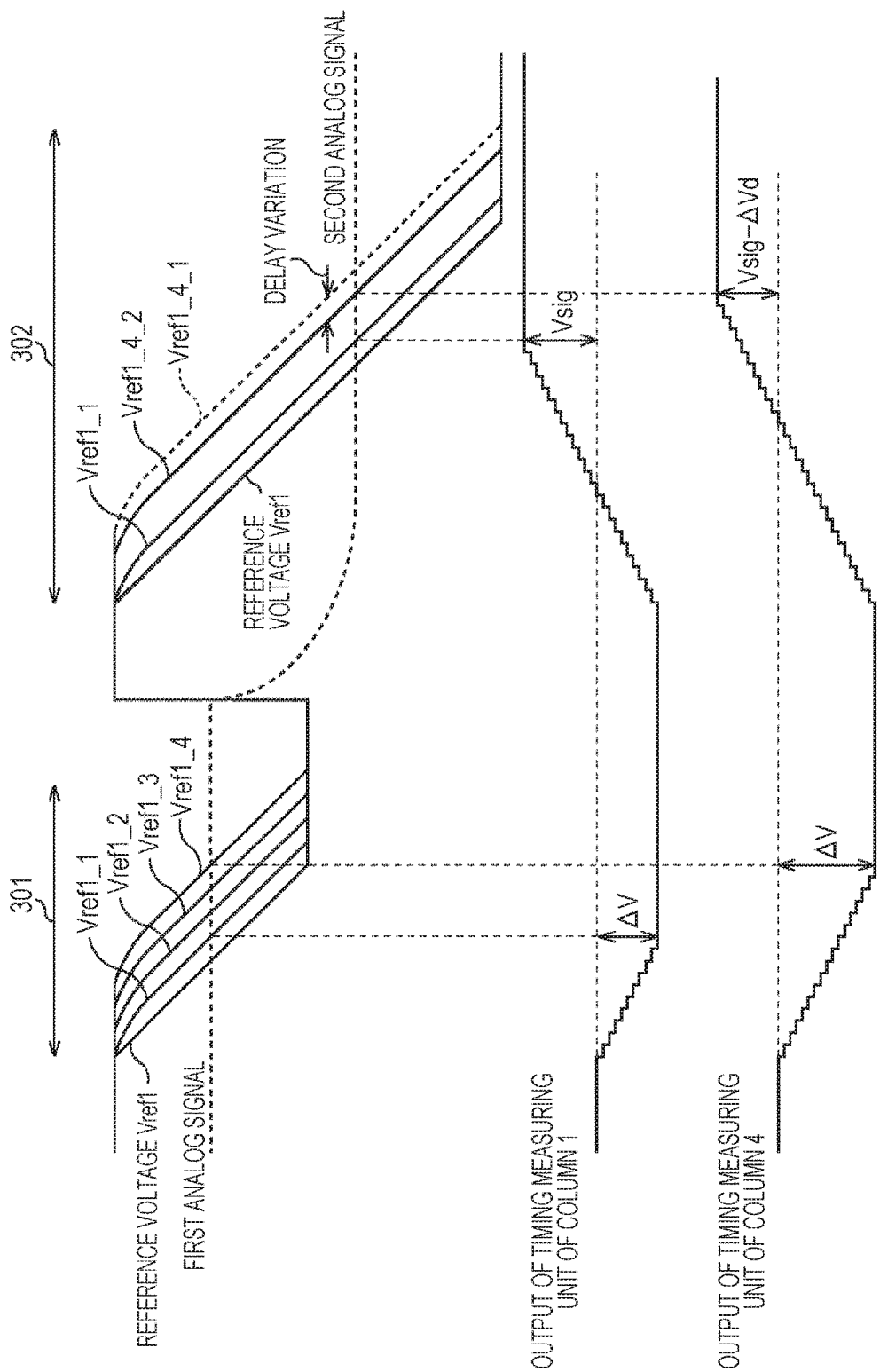
FIG. 25 is a timing chart showing an example of A/D conversion.

At this point, the distributed constants are as shown in FIG. 24. That is, the distributed constants in this case differ from the example shown in FIG. 21 and the example shown in FIG. 22.

Where attention is paid to the reference voltage Vref1 in the example case shown in FIG. 24, the delay of the reference voltage Vref1_x of each column differs between the period indicated by the double-headed arrow 301 and the period indicated by the double-headed arrow 302, as shown in FIG. 25. Particularly, the reference voltage Vref1_4 of column 4 located far away from the reference voltage generating unit 131 and the reference voltage generating unit 132 has a reduced load, and accordingly, has a shorter delay. Therefore, with respect to Vsig obtained with the reference voltage Vref1_1 of column 1, the output value has an error ΔVd, which is equivalent to the reduction in the delay with the reference voltage Vref1_4 of column 4.

In reality, the reference voltage Vref1_1 of column 1 also has a shorter delay than that in FIG. 23 and has an error with respect to Vsig. However, the error is smaller than that of the reference voltage Vref1_4 of column 4, and therefore, the error of the reference voltage Vref1_1 of column 1 is not shown in FIG. 25, for simplicity. In FIG. 25, the waveforms of the reference voltage Vref1_2 of column 2 and the reference voltage Vref1_3 of column 3 during the period indicated by the double-headed arrow 302 are not shown, either, but shorter delays like the reference voltage Vref1_4 of column 4, resulting in differences in timing. The same applies in a case where attention is paid to the reference voltage Vref2.

This error varies depending on in which positions and at what rates the second analog signals are distributed and included in the voltage ranges having different gradation accuracies assigned thereto. Therefore, the error is not easily corrected in the later image processing stage, and the error as noise might degrade image quality.

<Improvement of Distributed Constants>

In view of the above, a signal processing device is designed to include: a comparing unit that compares an analog signal output from a unit pixel with a predetermined voltage; a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

With this structure, the signal processing device can have the same constant distributions of the respective columns in the case of A/D conversion of the first analog signal and in the case of A/D conversion of the second analog signal. That is, in each column, the delay variation between the A/D conversion of the first analog signal and the A/D conversion of the second analog signal can be reduced, and signal components Vsig can be more accurately obtained as digital values. Thus, occurrences of A/D conversion errors can be reduced.

It should be noted that the load capacitance may be an equivalent capacitance or an approximate capacitance of the comparing unit.

By making the load capacitance as close to the equivalent capacitance of the comparing unit as possible, the signal processing device can more accurately equalize delays in the respective columns, and more accurately obtain the signal components Vsig as digital values.

There may be more than one combination of the comparing unit, the switching unit, and the measuring unit. In each combination, the reference voltages may be supplied to the switching unit via an amplifier that amplifies signal levels. Further, the outputs of the amplifiers may be connected to one another with respect to each of the gradation accuracies among the combinations.

A buffer is provided, and the reference voltage is supplied to the comparing unit via the buffer. With this structure, the signal processing device can prevent the noise generated in the comparing unit from propagating. In this case, a common column line may also be provided. With this, the signal processing device can smooth offset variations among the columns. In this case, having the load capacitance in the switching unit, the signal processing device can also more accurately obtain signal components Vsig as digital values.

The signal processing device may further include a selecting unit that selects one of the reference voltages of different gradation accuracies from one another in accordance with a result of comparison performed by the comparing unit between the analog signal and at least one predetermined determination value. In accordance with the result of the selection performed by the selecting unit, the switching unit may control the connection of each of the reference voltages to the comparing unit or the load capacitance With this structure, the signal processing device can reduce the reference voltage range margin derived from the comparison accuracy (offset error) in the determination, and achieve the effect to increase speed or reduce power consumption, as described in the first embodiment.

Also, the predetermined determination value may be supplied from a reference voltage generating unit to which the reference voltage having the higher gradation accuracy among the reference voltages is supplied.

With this structure, the signal processing device can further reduce the reference voltage range margin derived from the comparison accuracy (offset error), as described in the first embodiment.

Further, in a case where the analog signal is determined to be smaller than the predetermined determination value as a result of the comparison performed by the comparing unit, the selecting unit may select the reference voltage having the higher gradation accuracy from among the reference voltages. In a case where the analog signal is determined to be greater than the predetermined determination value, the selecting unit may select the reference voltage having the lower gradation accuracy from among the reference voltages. The switching unit may then connect the reference voltage selected by the selecting unit to the comparing unit, and connect another one of the reference voltages to the load capacitance.

With this structure, the signal processing device can not only supply the predetermined determination value without an increase in the number of circuits, but also cancel the voltage setting error, as described in the first embodiment.

Also, the comparing unit may compare a first analog signal that is the noise signal of the pixel, and a second analog signal that is a signal containing the data of the pixel, with the reference voltage. The measuring unit may calculate the difference between the result of measurement of timing of a change in the result of the comparison performed by the comparing unit between the first analog signal and the reference voltage, and the result of measurement of timing of a change in the result of the comparison performed by the comparing unit between the second analog signal and the reference voltage.

With this, the signal processing device can perform the subtraction process for removing variation components in a digital region, and restrain increases in circuit size and power consumption due to the subtraction process, as described in the first embodiment.

Further, with respect to the first analog signal, the selecting unit may sequentially select the respective reference voltages, the switching unit may connect the reference voltage selected by the selecting unit to the comparing unit and connect another reference voltage to the load capacitance, and the comparing unit under the control of the switching unit sequentially may compare the first analog signal with the respective reference voltages. As for the second analog signal, the selecting unit may select one of the reference voltages in accordance with a result of comparison performed by the comparing unit between the second analog signal and at least one predetermined determination value, the switching unit may connect the reference voltage selected by the selecting unit to the comparing unit and connect another reference voltage to the load capacitance, and the comparing unit under the control of the switching unit may compare the second analog signal with the reference voltage selected by the selecting unit. The measuring unit may calculate the difference between the result of measurement of timing of a change in the result of the comparison between the second analog signal and the reference voltage selected by the selecting unit, and the result of measurement of timing of a change in the result of the comparison between the first analog signal and the reference voltage selected by the selecting unit.

With this structure, the signal processing device can perform A/D conversion on the second analog signal (signal component+variation component) with any gradation accuracy, as described in the first embodiment.

Also, the signal processing device may further include a reference voltage supplying unit that supplies the reference voltages to the switching unit.

With this structure, the signal processing device can easily perform scan control on the reference voltages, as described in the first embodiment.

Further, the reference voltage supplying unit may supply the reference voltages to the comparing unit so that the first analog signal and the second analog signal are compared with voltages within a predetermined range in a first comparison direction from the lower side toward the higher side, or with the voltages within the predetermined range in a second comparison direction from the higher side toward the lower side. The switching unit may connect the reference voltage selected by the selecting unit from among the reference voltages supplied from the reference voltage supplying unit, and connect another one of the reference voltages to the load capacitance.

With this structure, the comparing unit can compare the first analog signal and the second analog signal with the reference voltages within a predetermined voltage range, as described in the first embodiment.

Also, the reference voltage supplying unit may supply the reference voltages to the switching unit so that the first analog signal is compared with the reference voltages in the order of gradation accuracies and in the opposite comparison direction from that of the previous reference voltage.

With this structure, the signal processing device shortens the settling period required for each A/D conversion, and can achieve an even higher speed, as described in the first embodiment.

Further, the reference voltage supplying unit may supply the reference voltage selected by the selecting unit to the switching unit so that the second analog signal is compared with the reference voltage in the same comparison direction as the direction of the comparison between the reference voltage and the first analog signal.

With this structure, the signal processing device can realize low-noise A/D conversion, without a decrease in the accuracy of removal of the variation component (or the first analog signal) due to nonlinear characteristics (hysteresis) that vary depending on the scan direction of the reference voltage, as described in the first embodiment.

Also, the reference voltage supplying unit may supply the reference voltage having the highest gradation accuracy among the reference voltages so that comparison with voltages within the above described range is performed in the second comparison direction, and supply the reference voltage having the lowest gradation accuracy so that comparison with the voltages within the above described range is performed in the first comparison direction.

With this structure, the signal processing device can perform A/D conversion on the second analog signal with various gradation accuracies in accordance with logical values changed by the comparing unit with the results of predetermined voltage determination, as described in the first embodiment. Accordingly, there is no need to stand by until the comparing unit changes to a stable logical value prior to A/D conversion, and the signal processing device can achieve an even higher speed.

The present technology can also be realized as a signal processing method for the signal processing device.

An imaging device may be designed to include: a pixel array including unit pixels arranged therein, each of the unit pixels including a photoelectric conversion element that performs photoelectric conversion on incident light; a comparing unit that compares an analog signal output from a unit pixel of the pixel array with a predetermined voltage; a switching unit that switches reference voltages to be supplied to the comparing unit, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

Further, an imaging apparatus may be designed to include: an imaging unit that images an object; and an image processing unit that performs image processing on image data obtained through the imaging performed by the imaging unit. The imaging unit includes: a pixel array including unit pixels arranged therein, each of the unit pixels including a photoelectric conversion element that performs photoelectric conversion on incident light; a comparing unit that compares an analog signal output from a unit pixel of the pixel array with a predetermined voltage; a switching unit that switches reference voltages to be supplied to the comparing unit, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

That is, the present technology can be realized as a signal processing device, or can be realized as a device that performs the same signal processing as the signal processing device. Part or all of the control process may be realized by software.

This will be described below in greater detail.

<Another Example of a Switching Unit>

Figure 26:
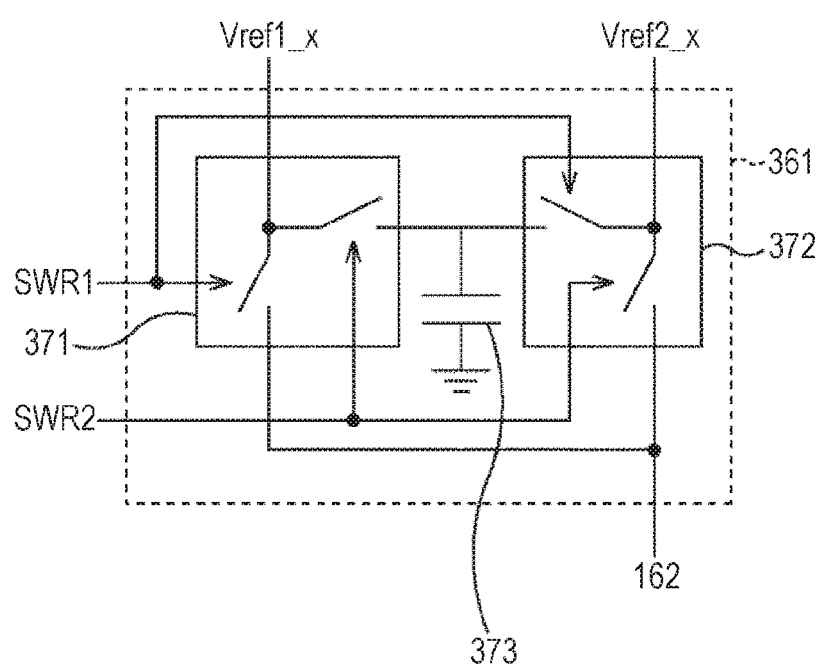
FIG. 26 is a diagram showing a typical example structure of a switching unit.

In the CMOS image sensor 100 shown in FIG. 5, for example, the switching unit 161 is replaced with a switching unit 361 shown in FIG. 26, so that the constant distribution of the respective columns becomes the same between A/D conversion of the first analog signals and A/D conversion of the second analog signals.

As shown in FIG. 26, the switching unit 361 includes a load capacitance (Cj) 373 as well as a switch 371 and a switch 372.

Based on the values of a control signal SWR1 and a control signal SWR2, the switch 371 connects the reference voltage generating unit 131 that supplies the reference voltage Vref1_x, to the comparing unit 162 or the load capacitance 373. For example, based on the values of the control signal SWR1 and the control signal SWR2, the switch 371 connects the reference voltage generating unit 131 to the comparing unit 162, and disconnects the reference voltage generating unit 131 from the load capacitance 373. Also, based on the values of the control signal SWR1 and the control signal SWR2, the switch 371 disconnects the reference voltage generating unit 131 from the comparing unit 162, and connects the reference voltage generating unit 131 to the load capacitance 373, for example.

Based on the values of the control signal SWR1 and the control signal SWR2, the switch 372 connects the reference voltage generating unit 132 that supplies the reference voltage Vref2_x, to the comparing unit 162 or the load capacitance 373. For example, based on the values of the control signal SWR1 and the control signal SWR2, the switch 372 connects the reference voltage generating unit 132 to the comparing unit 162, and disconnects the reference voltage generating unit 132 from the load capacitance 373. Also, based on the values of the control signal SWR1 and the control signal SWR2, the switch 372 disconnects the reference voltage generating unit 132 from the comparing unit 162, and connects the reference voltage generating unit 132 to the load capacitance 373, for example.

In other words, the switch 371 and the switch 372 select the reference voltage generating units to be connected to the comparing unit 162 and the load capacitance 373. That is, based on the values of the control signal SWR1 and the control signal SWR2, the switch 371 and the switch 372 connect one of the reference voltage generating units 131 and 132 to the comparing unit 162, and connect the other one to the load capacitance 373.

The load capacitance (Cj) 373 is designed to be a value equivalent or approximate to the input capacitance Ci of the comparing unit 162. The load capacitance 373 is formed with a capacitor, for example.

Figure 27:
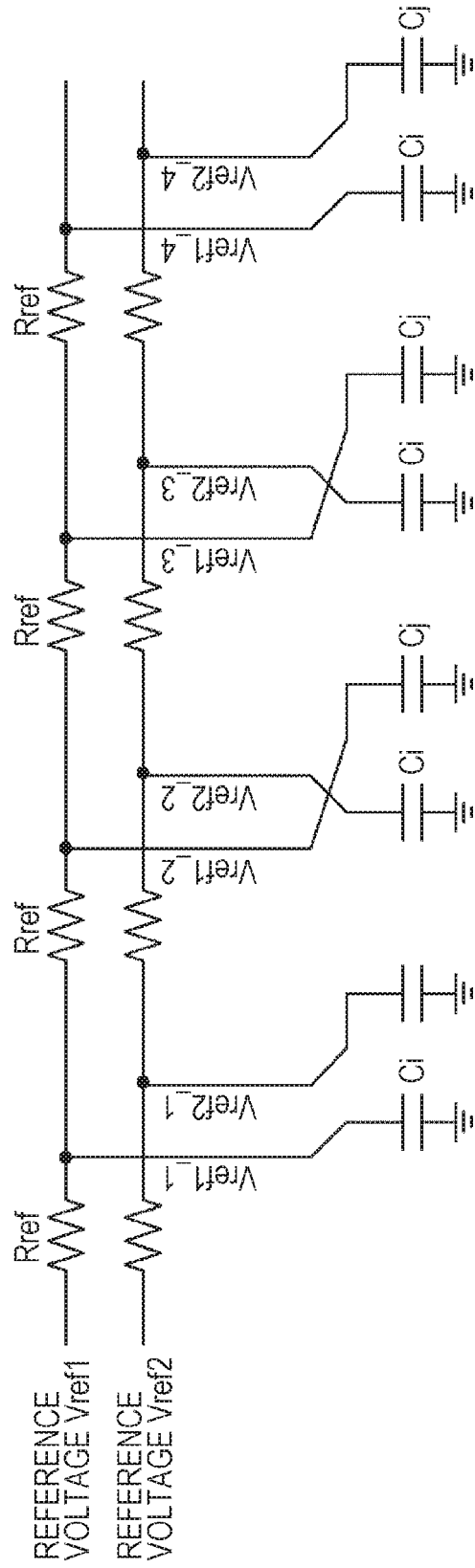
FIG. 27 is a diagram showing an example of distributed constants.

As the switching unit 361 is used in each of the column A/D conversion units 151, the distributed constants become as shown in FIG. 27 in a case where selections of reference voltages with different gradation accuracies coexist as in the case shown in FIG. 24. That is, delay variations of the reference voltages Vref between the A/D conversion of the first analog signals and the A/D conversion of the second analog signals can be reduced in all the columns, as with the distributed constants in the examples shown in FIGS. 21 and 22.

Figure 28:
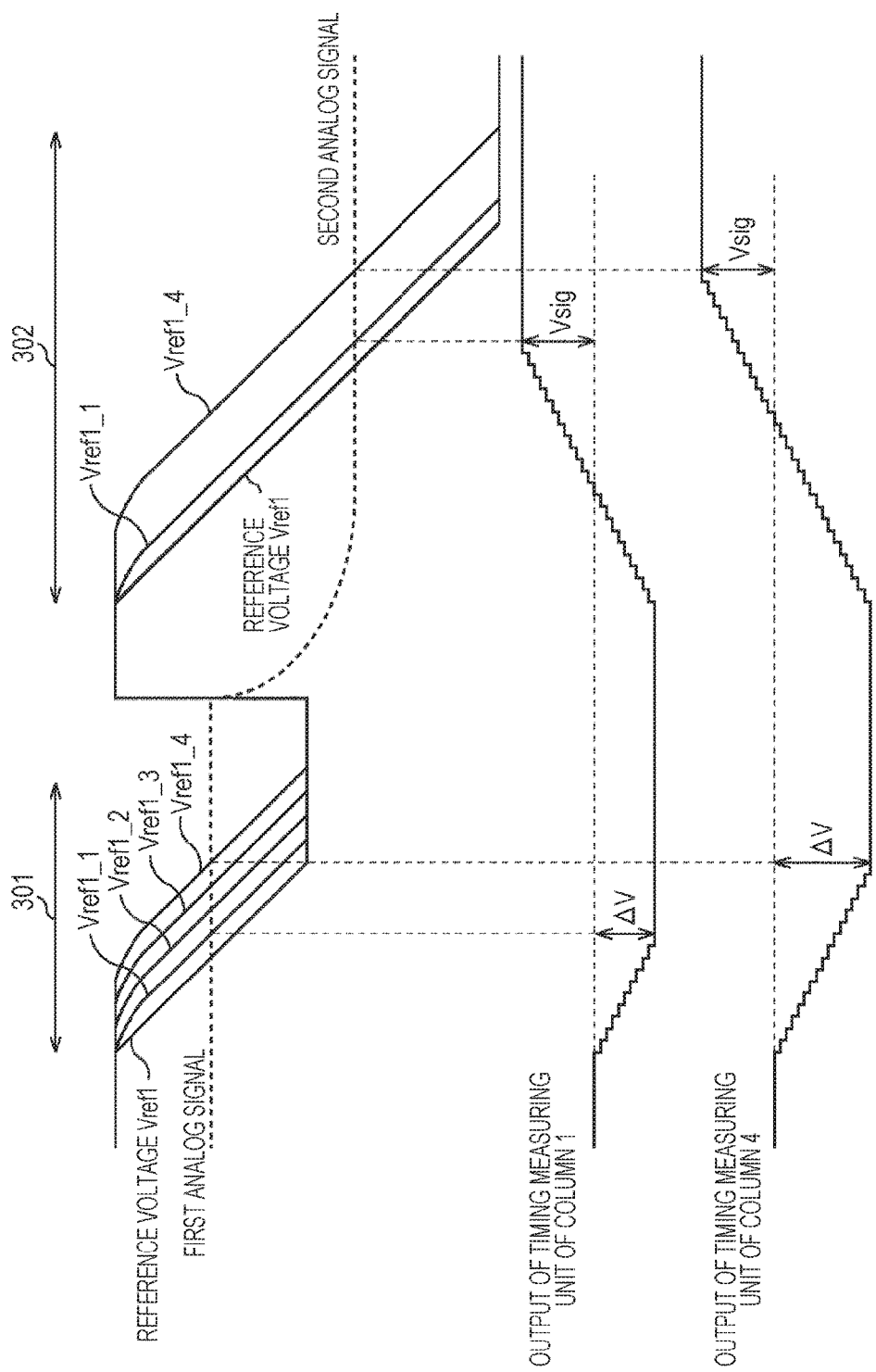
FIG. 28 is a timing chart showing an example of A/D conversion.

Accordingly, the delay of the reference voltage Vref1_x of each column is the same between the period indicated by the double-headed arrow 301 and the period indicated by the double-headed arrow 302, as shown in FIG. 28, and signal components Vsig can be accurately obtained as digital values. As for the reference voltage Vref2_x, delay variations can of course be reduced. That is, occurrences of A/D conversion errors can be reduced.

The load capacitance (Cj) 373 of the switching unit 361 is designed to be a value equivalent or approximate to the input capacitance Ci of the comparing unit 162. The comparing unit 162 has the structure shown in FIG. 8, for example. In this case, the input capacitance of the comparing unit 162 is formed with the capacitances of a capacitor Caz, a transistor M1, and a transistor M2.

Figure 29:
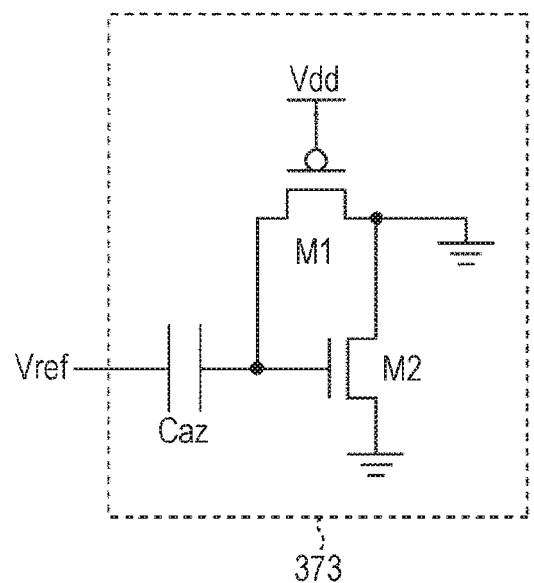
FIG. 29 is a diagram showing a typical example structure of a load capacitance Cj.

Therefore, the load capacitance 373 may be formed with an equivalent circuit using the capacitor Caz, the transistor M1, and the transistor M2, as shown in FIG. 29, for example.

Figure 30:
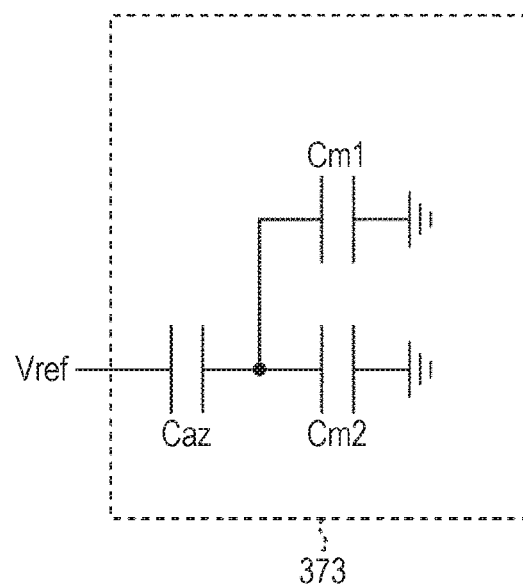
FIG. 30 is a diagram showing a typical example structure of a load capacitance Cj.

Alternatively, the load capacitance 373 may be formed with a circuit in which the transistor M1 is replaced with a capacitor Cm1 having a capacitance approximate to that of the transistor M1, and the transistor M2 is replaced with a capacitor Cm1 having a capacitance approximate to that of the transistor M2, as shown in FIG. 30, for example. Of course, only one of the transistors M1 and M2 may be replaced with a capacitor.

Figure 31:
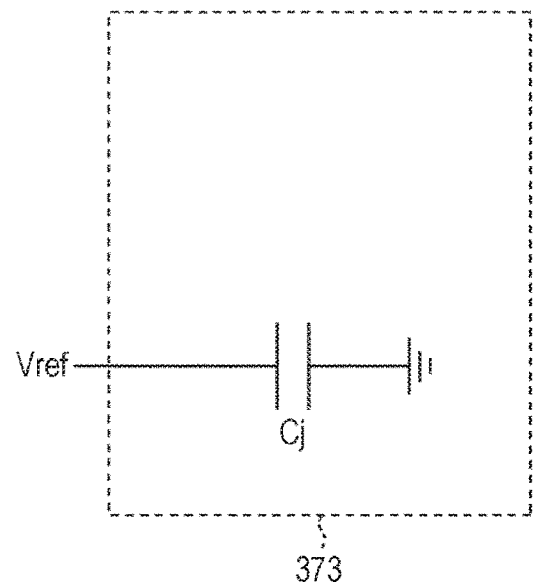
FIG. 31 is a diagram showing a typical example structure of a load capacitance Cj.

Further, the load capacitance 373 may be formed with a single capacitor having a capacitance equivalent or approximate to the combined capacitance of the capacitances of the capacitor Caz, the transistor M1, and the transistor M2, as shown in FIG. 31, for example.

<More Accurate Reproduction of the Capacitance Value>

The load capacitance (Cj) 373 in the example shown in FIG. 29 is an equivalent circuit that reproduces the input capacitance Ci of the comparing unit 162 shown in FIG. 8. The capacitor Caz cancels a reference voltage offset, the transistor M1 initializes the capacitor Caz, and the transistor M2 corresponds to the input transistor M2 of the comparing unit 162.

In the comparing unit 162, however, the input transistor M2 functions, as the source voltage follows the gate voltage. In the equivalent circuit shown in FIG. 29, the transistor M2 has its source grounded, and therefore, the source voltage thereof does not vary with changes in the gate voltage, resulting in a different operation region. Therefore, in a case where the same transistor as the input transistor M2 of the comparing unit 162 is used as the transistor M2 of the equivalent circuit in FIG. 29, there is a possibility that the capacitance value cannot be accurately reproduced.

Even if the capacitance value is adjusted through a simulation or the like, and the size of the transistor M2 shown in FIG. 29 is optimized, it is difficult to accurately adjust the gate capacitances of the two transistors in different operation regions to each other, since the input capacitance of a transistor varies depending on various conditions such as process variations, temperature dependence, and voltage variations.

In the load capacitance 373 in the example shown in FIG. 30, the transistor M1 and the transistor M2 shown in FIG. 29 are replaced with capacitors having capacitances approximate to those of the transistor M1 and the input transistor M2 of the comparing unit 162, respectively.

Further, in the load capacitance 373 in the example shown in FIG. 31, the input capacitance of the comparing unit 162 is replaced with a single capacitor. In a case where such a capacitor is used, a capacitance having a different structure from the element forming the input capacitance of the comparing unit 162, such as a Metal-Insulator-Metal capacitance, is probably used. Therefore, it is even more difficult to accurately adjust the capacitance value of the input capacitance of the equivalent circuit (also referred to as the dummy load capacitance) to the capacitance value of the input capacitance of the comparing unit 162, due to the influence of process variations, temperature dependence, and the like.

With any load capacitance 373 described above, it is difficult to accurately reproduce the input capacitance of the comparing unit 162 (or accurately adjust the capacitance value of the dummy load capacitance to the capacitance value of the input capacitance of the comparing unit 162).

<More Accurate Equivalent Circuits>

So as to more accurately adjust the capacitance value of the dummy load capacitance to the capacitance value of the input capacitance of the comparing unit 162, the same transistor as the input transistor connected to the input portion of the comparing unit 162 (this transistor will be hereinafter also referred to as the dummy input transistor) is connected as the dummy load capacitance. In this case, the dummy input transistor needs to operate in the same operation region as the input transistor connected to the comparing unit 162, so as to more accurately reproduce the input capacitance of the input transistor connected to the comparing unit 162.

Figure 32:
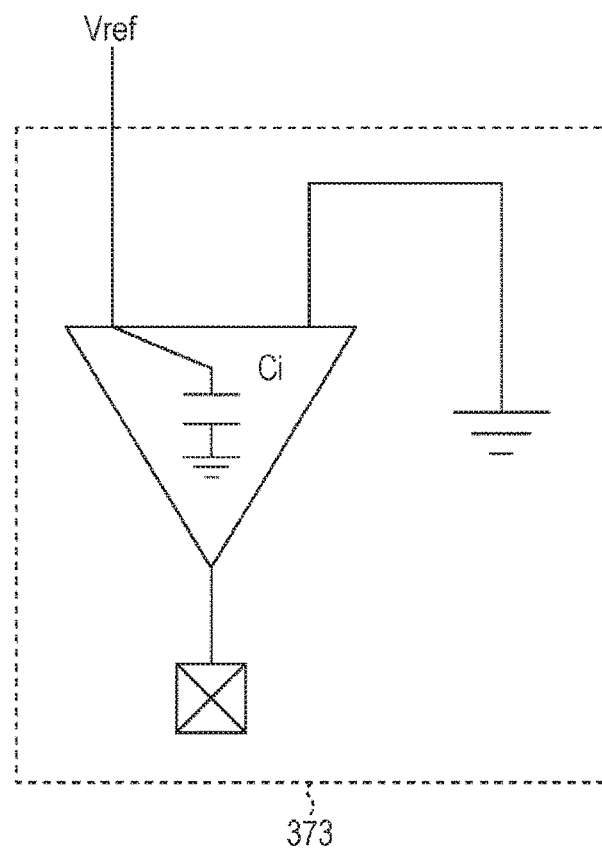
FIG. 32 is a diagram showing a typical example structure of a load capacitance Cj.

In view of this, the same circuit as the comparing unit 162 (this circuit is also referred to as the dummy comparing unit) is used as the load capacitance (Cj) 373, as shown in FIG. 32, for example. This dummy comparing unit (load capacitance 373) is a dummy comparing unit that only reproduces the input capacitance of the input transistor of the comparing unit 162, and does not actually perform any comparison.

That is, so as to adjust the operation region of the input transistor of the comparing unit 162 and the operation region of the input transistor (dummy input transistor) of the load capacitance 373 to each other, the dummy input transistor and the circuit surrounding the dummy input transistor have the same circuit configuration as that in the case of the input transistor of the comparing unit 162.

One input terminal of the dummy comparing unit (FIG. 32) serving as the load capacitance 373 is connected to the switch 371 or the switch 372 (or the reference voltage Vref1_x or the reference voltage Vref2_x), and the other input terminal is connected to a fixed potential. The output of the dummy comparing unit (FIG. 32) is open (or in an opened state).

As the comparing unit 162 and the load capacitance 373 are made to have the same structures as described above, the input transistor connected to the dummy load capacitance can constantly operate in the same operation region as the input transistor of the comparing unit 162. That is, the dummy load capacitance (load capacitance 373) can more accurately reproduce the input capacitance of the comparing unit 162. In other words, using the load capacitance 373 shown in FIG. 32, the CMOS image sensor 100 can more effectively reduce occurrences of A/D conversion errors.

The load capacitance 373 may also include a bias transistor that supplies the same current value as the current to be supplied to the input transistor of the comparing unit 162, or a current value close to the current to be supplied to the input transistor of the comparing unit 162 within such a range that the operation region does not change.

Figure 33:
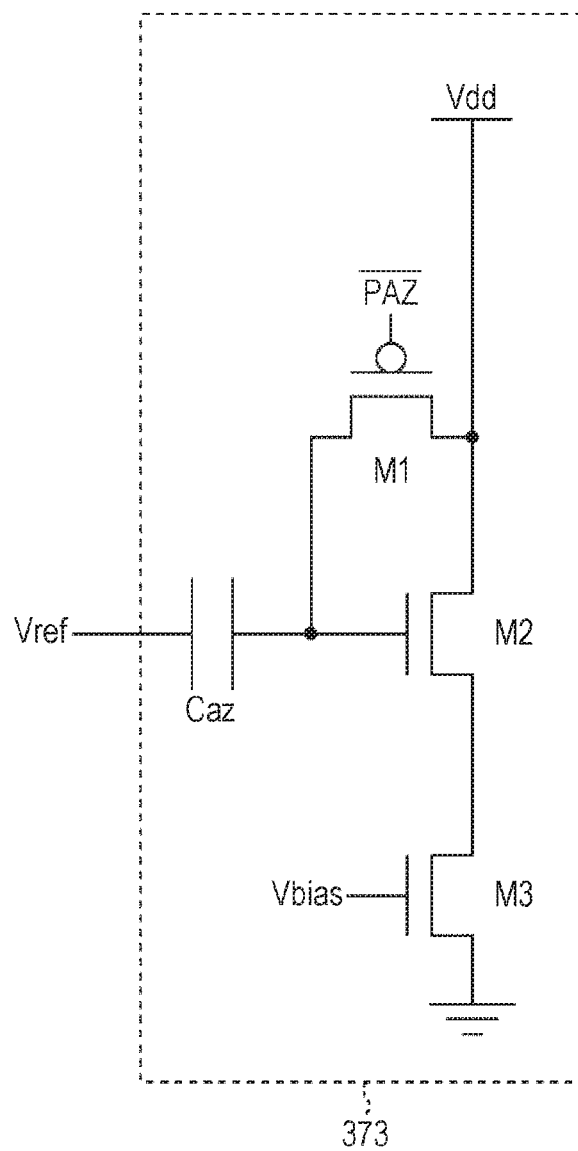
FIG. 33 is a diagram showing a typical example structure of a load capacitance Cj.

In the example case shown in FIG. 33, the load capacitance (Cj) 373 includes an input transistor M2, a current supply transistor M3 that supplies a constant current to the input transistor M2, a capacitor Caz that cancels a reference voltage offset, and a switch transistor M1 that initializes the capacitor Caz.

In this example case, the same current value as the current to be supplied to the differential pair of the comparing unit 162 (FIG. 8) or a current value close to the current to be supplied to the differential pair of the comparing unit 162 within such a range that the operation region does not change is supplied to the input transistor M2 by the current supply transistor M3. With this, the input transistor M2 can operate in the operation region equal to that of the input transistor M2 of the comparing unit 162. That is, the dummy load capacitance (load capacitance 373) can more accurately reproduce the input capacitance of the comparing unit 162. In other words, using the load capacitance 373 shown in FIG. 33, the CMOS image sensor 100 can more effectively reduce occurrences of A/D conversion errors.

Figure 34:
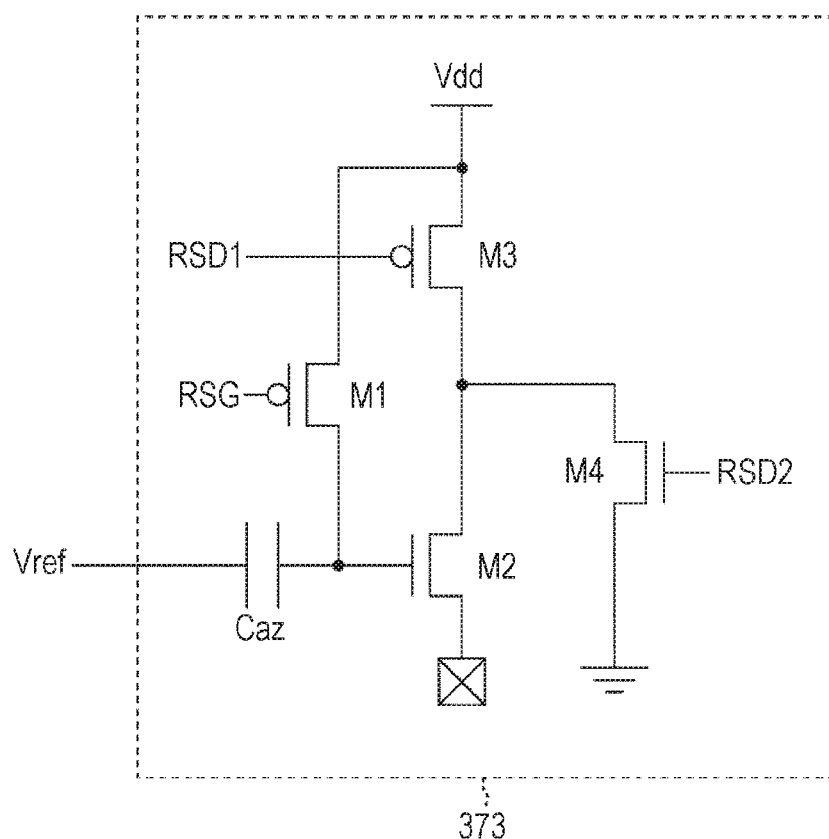
FIG. 34 is a diagram showing a typical example structure of a load capacitance Cj.

Further, the source of the dummy input transistor may be floating. In the example case shown in FIG. 34, the load capacitance (Cj) 373 includes an input transistor M2, a capacitor Caz that cancels a reference voltage offset, a switch transistor M1 that initializes the capacitor Caz, a switch transistor M4 that initializes the input transistor M2, and a switch transistor M3 that connects the input transistor M2 to a fixed potential. As the source of the transistor M2 is floating as shown in FIG. 34, the source voltage of the transistor M2 varies with the gate voltage. Since the input transistor M2 of the comparing unit 162 (FIG. 8) operates in a saturation region with the current supplied from the current supply transistor M3, the source voltage varies with the gate voltage. Operating in the same manner as the input transistor M2 of the comparing unit 162 (FIG. 8) as described above, the transistor M2 in FIG. 34 can more accurately reproduce the input capacitance of the input transistor M2. In other words, using the load capacitance 373 shown in FIG. 34, the CMOS image sensor 100 can more effectively reduce occurrences of A/D conversion errors.

Figure 35:
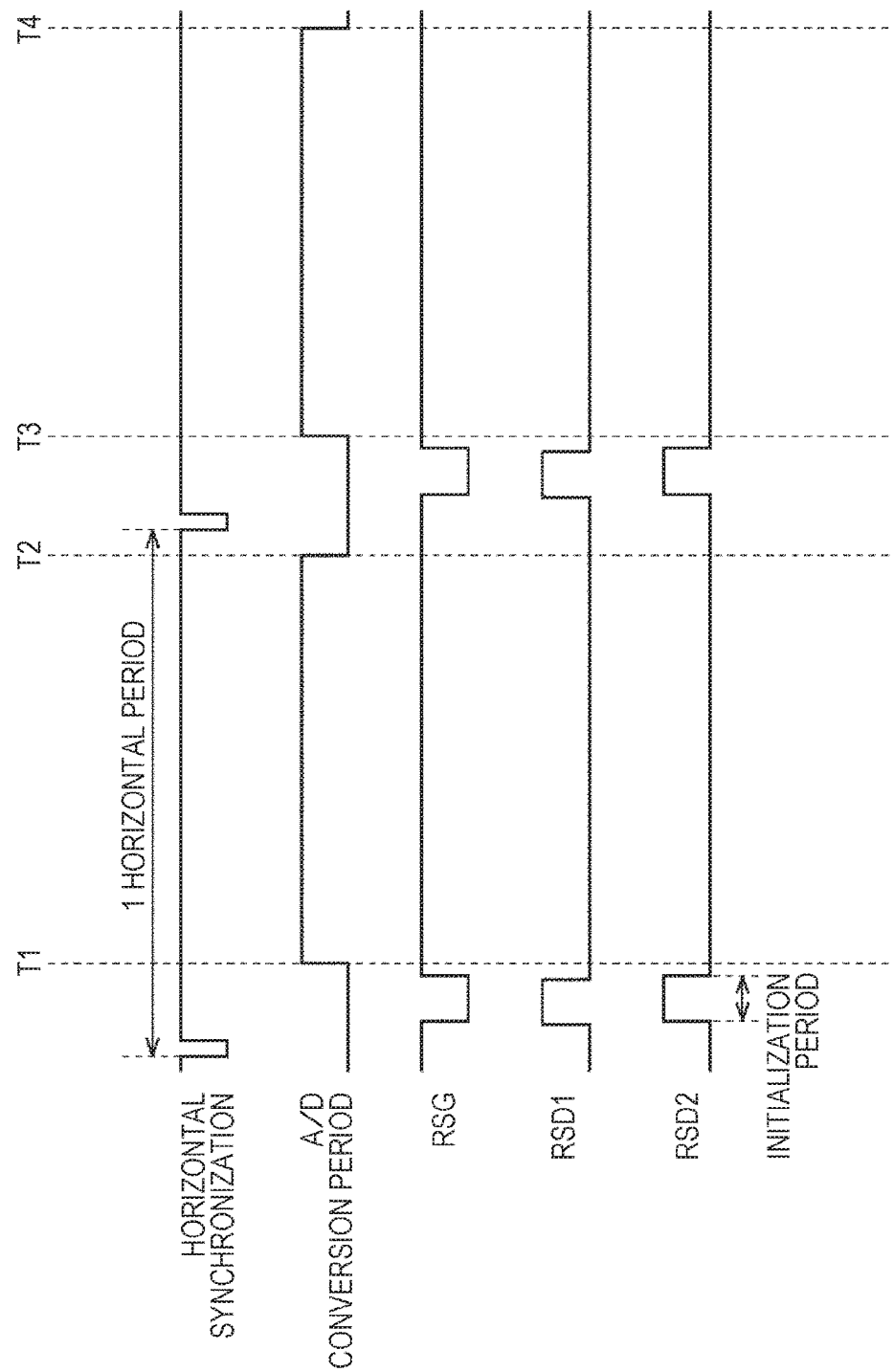
FIG. 35 is a diagram showing an example of control of a load capacitance Cj.

FIG. 35 shows example control of the example of the load capacitance 373 shown in FIG. 34. As shown in the example in FIG. 35, at the start of each horizontal period, or prior to each of the A/D conversion periods (the period from time T1 till time T2, and the period from time T3 till time T4) (or before time T1 and before time T4), the switch transistor M1 and the switch transistor M4 are made conductive (are switched on), and the switch transistor M3 is disconnected (or is switched off), so that the capacitor Caz and the floating source terminal of the input transistor M2 can be initialized at a fixed potential. As shown in the example in FIG. 35, during the A/D conversion periods, the switch transistor M1 and the switch transistor M4 are disconnected (are switched off), and the switch transistor M3 is made conductive (is switched on), so that the source voltage of the input transistor M2 can follow the gate voltage during operation. Accordingly, the input capacitance of the input transistor M2 can be more accurately reproduced. In other words, using the load capacitance 373 shown in FIG. 35, the CMOS image sensor 100 can more effectively reduce occurrences of A/D conversion errors.

As in the examples shown in FIGS. 32 through 34, in the load capacitance 373, a dummy input transistor that is the same as the input transistor of the comparing unit 162 is provided, and the dummy input transistor is made to operate in the same operation region as the input transistor of the comparing unit 162, so that the load capacitance 373 can more accurately reproduce the input capacitance of the comparing unit 162. Accordingly, the CMOS image sensor 100 can more effectively reduce occurrences of A/D conversion errors.

<Adjustment of the Capacitance Value>

By another method of more accurately reproduce the input capacitance of the input transistor M2 of the comparing unit 162, the difference between the input capacitance of the input transistor M2 of the comparing unit 162 and the capacitance value of the load capacitance 373 may be corrected.

Figure 36:
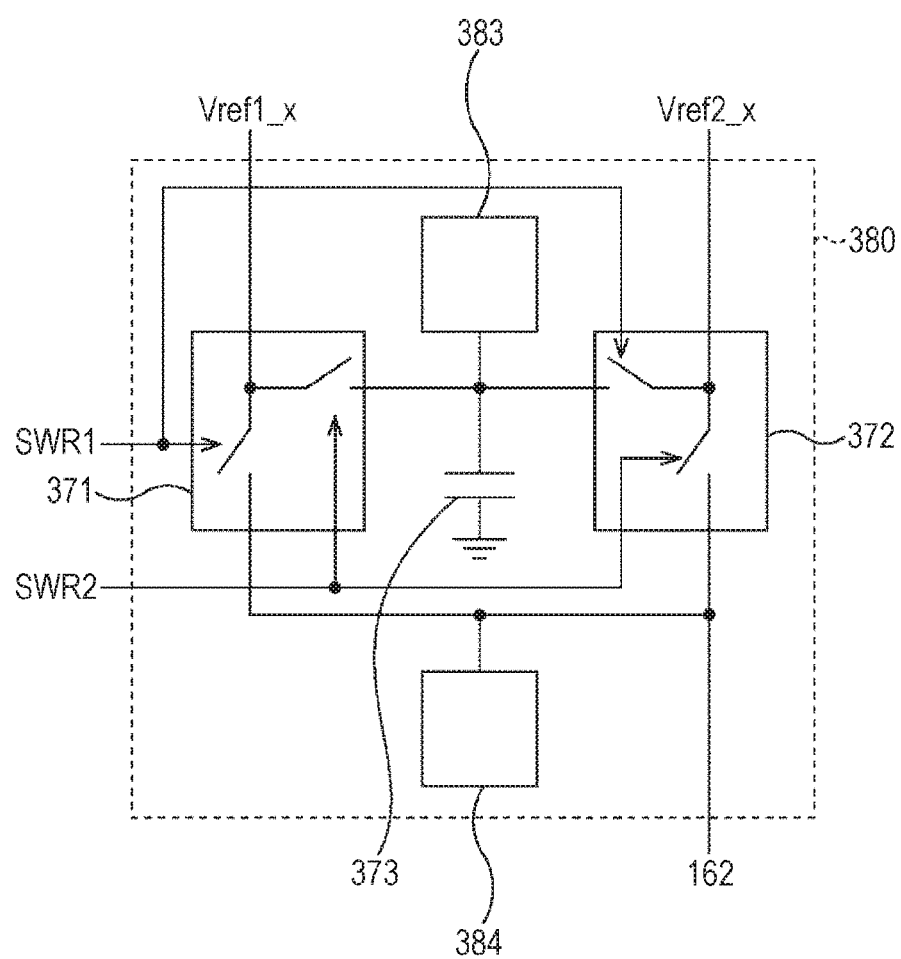
FIG. 36 is a diagram showing another example of the structure of a switching unit.

In that case, a switching unit 380 shown in FIG. 36, instead of the switching unit 161 (FIG. 5) or the switching unit 361 (FIG. 26), is used in the CMOS image sensor 100 shown in FIG. 5.

As shown in FIG. 36, the switching unit 380 includes a capacitance adjusting unit 383 and a capacitance adjusting unit 384, as well as the switch 371, the switch 372, and the load capacitance 373 (any or which is shown in FIG. 26).

The capacitance adjusting unit 383 is connected to the load capacitance 373, and adjusts (increases or decreases) the capacitance of the load capacitance 373. The capacitance adjusting unit 384 is connected to one input terminal (to which the reference voltage is input) of the comparing unit 162, and adjusts (increases or decreases) the input capacitance of the comparing unit 162. The capacitance adjusting unit 383 and the capacitance adjusting unit 384 are controlled by the A/D conversion control unit 110 of the CMOS image sensor 100 (FIG. 5), for example. That is, the A/D conversion control unit 110 sets the capacitances of the capacitance adjusting unit 383 and the capacitance adjusting unit 384. For example, the A/D conversion control unit 110 sets the capacitances of the capacitance adjusting unit 383 and the capacitance adjusting unit 384 in accordance with the size of the difference between the input capacitance of the input transistor M2 of the comparing unit 162 and the capacitance value of the load capacitance 373.

<Capacitance Adjusting Units>

Figure 37:
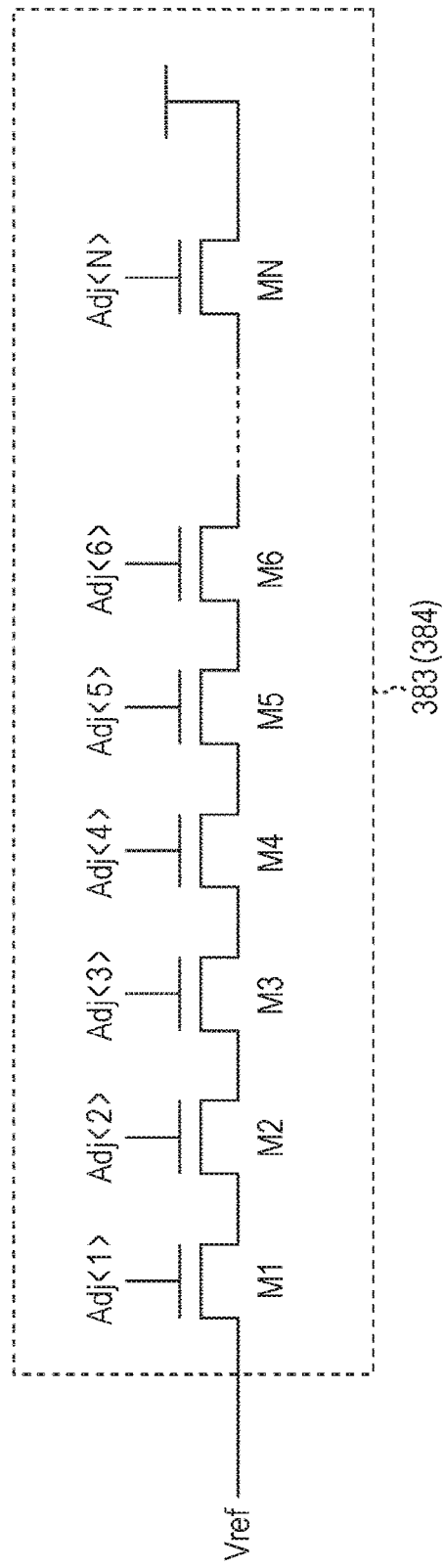
FIG. 37 is a diagram showing a typical example structure of a capacitance adjusting unit.

The capacitance adjusting unit 383 may have the structure shown in FIG. 37, for example. In the example case shown in FIG. 37, the capacitance adjusting unit 383 includes N (N being an integer of 2 or greater) transistors M1 through MN that are connected in series between the load capacitance (Cj) 373 and a predetermined fixed potential.

Capacitance adjustment codes Adj<1> through Adj<N> are supplied to the gate of each of the transistors (transistors M1 through MN). The capacitance adjustment codes Adj<1> through Adj<N> are control information that is supplied from the A/D conversion control unit 110 (FIG. 5) and control capacitances. That is, the A/D conversion control unit 110 (FIG. 5) controls switching on and off of each transistor by controlling the respective values of the capacitance adjustment codes Adj<1> through Adj<N>. With this, the capacitance value of the load capacitance 373 can be adjusted.

In a case where the A/D conversion control unit 110 (FIG. 5) sets Adj<1> through Adj<3> at Vdd, for example, the transistors M1 through M3 are connected, and the amount equivalent to the capacitance added to the channels and the diffusion layers of the respective transistors serves as the adjustment value.

As described above, the capacitance adjusting unit 383 can set its own capacitance value with digital codes supplied from the A/D conversion control unit 110, and adjust the capacitance value of the load capacitance 373 with its own capacitance value. Accordingly, tolerance to variation in manufacture can be increased, and the load capacitance 373 can more accurately reproduce the input capacitance of the comparing unit 162. Thus, the CMOS image sensor 100 can more effectively reduce occurrences of A/D conversion errors.

It should be noted that each of the transistors (transistors M1 through MN) may have any capacitance. For example, all the transistors may have the same capacitance, the capacitance of some of the transistors may differ from the capacitance of the others, or the respective transistors may have different capacitances from one another.

Figure 38:
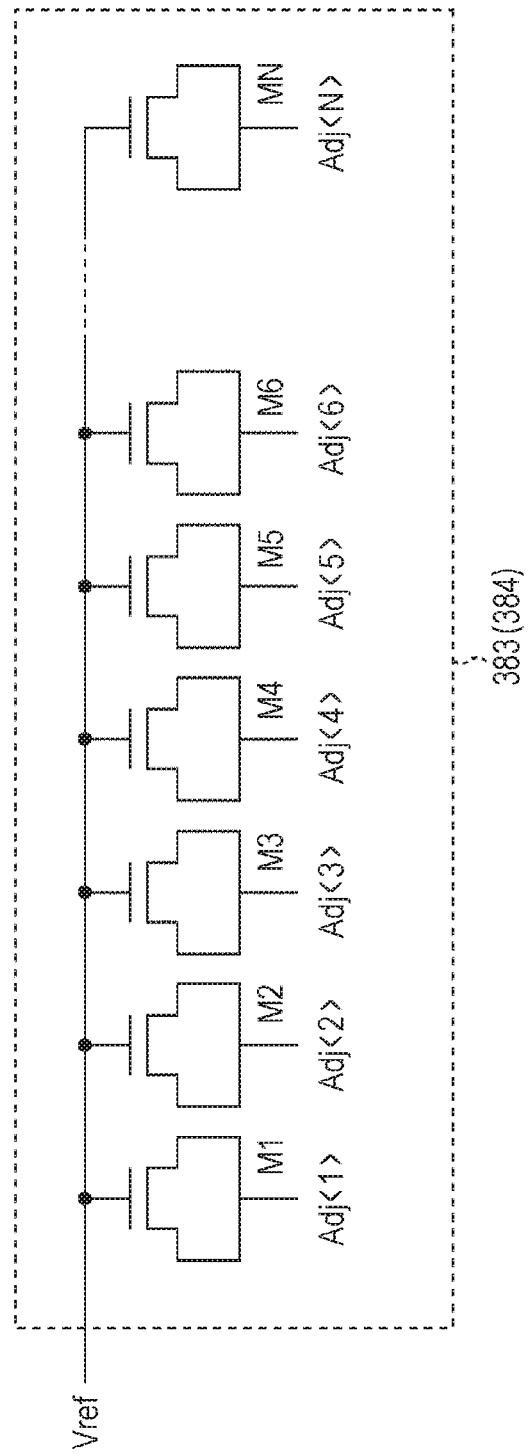
FIG. 38 is a diagram showing another example structure of a capacitance adjusting unit.

Alternatively, the capacitance adjusting unit 383 may have the structure shown in FIG. 38, for example. In the example case shown in FIG. 38, the capacitance adjusting unit 383 includes N (N being an integer of 2 or greater) transistors M1 through MN that are connected in parallel to the load capacitance (Cj) 373.

The gate input of each of the transistors (transistors M1 through MN) is connected to the load capacitance 373, and capacitance adjustment codes Adj<1> through Adj<N> are supplied to the source and the drain of each of the transistors. The capacitance adjustment codes Adj<1> through Adj<N> are control information that is supplied from the A/D conversion control unit 110 (FIG. 5) and control capacitances, as in the case shown in FIG. 37.

That is, the A/D conversion control unit 110 (FIG. 5) can adjust the capacitance value of the load capacitance 373 by controlling the respective values of the capacitance adjustment codes Adj<1> through Adj<N>. Accordingly, tolerance to variation in manufacture can be increased, and the load capacitance 373 can more accurately reproduce the input capacitance of the comparing unit 162. Accordingly, the CMOS image sensor 100 can more effectively reduce occurrences of A/D conversion errors.

It should be noted that each of the transistors (transistors M1 through MN) may also have any capacitance in the case shown in FIG. 38. For example, all the transistors may have the same capacitance, the capacitance of some of the transistors may differ from the capacitance of the others, or the respective transistors may have different capacitances from one another.

For example, the sizes of the respective transistors of the transistors M1 through MN may be multiplied by one, two, four, . . . , and $2^{(N-1)}$. In this manner, $2^N$ capacitance adjustment resolutions can be obtained with N adjustment codes. In the case of the structure shown in FIG. 38, for example, N capacitance adjustment resolutions are obtained with N adjustment codes.

Although examples of NMOS transistors have been described above, PMOS transistors may be used depending on the reference voltage range.

The above described example structures shown in FIGS. 37 and 38 can be applied to the capacitance adjusting unit 384. That is, the capacitance adjusting unit 384 may have the structure shown in FIG. 37 or the structure shown in FIG. 38, for example.

In the case of the capacitance adjusting unit 384, however, each of the transistors shown in FIGS. 37 and 38 is connected to the input terminal of the comparing unit 162, instead of the load capacitance 373, as shown in FIG. 36. That is, by adjusting its own capacitance, the capacitance adjusting unit 384 adjusts the input capacitance of the comparing unit 162, to reduce the difference between the load capacitance 373 and the input capacitance of the comparing unit 162.

In short, while the capacitance adjusting unit 383 adjust the load capacitance 373 to a value close to the input capacitance of the comparing unit 162, the capacitance adjusting unit 384 adjusts the input capacitance of the comparing unit 162 to a value close to the load capacitance 373. Accordingly, the same result is achieved in relative terms.

In the case of the capacitance adjusting unit 384, tolerance to variation in manufacture can be increased, and the load capacitance 373 can more accurately reproduce the input capacitance of the comparing unit 162, as in the case of the capacitance adjusting unit 383. Accordingly, the CMOS image sensor 100 can more effectively reduce occurrences of A/D conversion errors.

The structures of the capacitance adjusting unit 383 and the capacitance adjusting unit 384 are arbitrarily designed, as long as they can change capacitance values. For example, a capacitor that has a variable capacitance may be used, instead of the transistor groups shown in FIGS. 37 and 38.

<Capacitance Control>

Next, control of the capacitance of the capacitance adjusting unit 383 (or the capacitance adjusting unit 384) is described. As described above, the capacitance of the capacitance adjusting unit 383 (or the capacitance adjusting unit 384) is controlled with capacitance adjustment codes. So as to correct variation in manufacture and the like, each capacitance adjustment code may have a predetermined fixed value, or may be appropriately set by the A/D conversion control unit 110 as described above.

Figure 39:
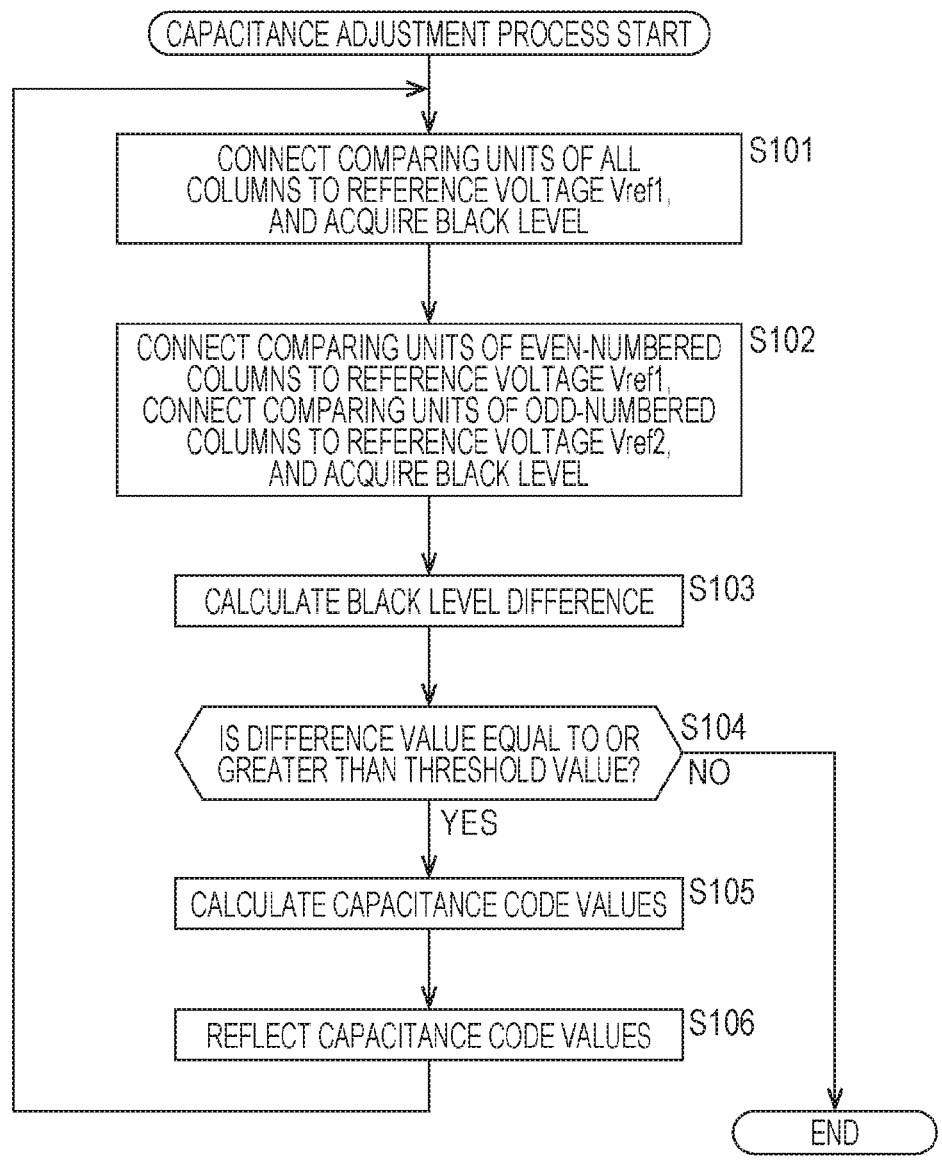
FIG. 39 is a flowchart for explaining an example flow of a capacitance adjustment process.

When the A/D conversion control unit 110 sets the capacitance adjustment codes, the A/D conversion control unit 110 sets the capacitance adjustment codes by performing a capacitance adjustment process, for example. Referring now to the flowchart shown in FIG. 39, an example flow of the capacitance adjustment process is described.

When the capacitance adjustment process is started, the A/D conversion control unit 110 in step S101 controls the column A/D conversion units 151 (FIG. 5) of all the columns of the A/D conversion unit 112, and connects one input (to which the reference voltage is input) of the comparing unit 162 of each column to the reference voltage generating unit 131 (the reference voltage Vref1 side), to obtain the black level in a state where the reference voltage Vref1 is supplied.

In step S102, the A/D conversion control unit 110 controls the column A/D conversion units 151 (FIG. 5) of all the columns of the A/D conversion unit 112, connects one input (to which the reference voltage is input) of the comparing unit 162 of each even-numbered column to the reference voltage generating unit 131 (the reference voltage Vref1 side) so as to be supplied with the reference voltage Vref1, and connects one input (to which the reference voltage is input) of the comparing unit 162 of each odd-numbered column to the reference voltage generating unit 132 (the reference voltage Vref2 side) so as to be supplied with the reference voltage Vref2. In this state, the black level is obtained.

In step S103, the A/D conversion control unit 110 calculates the difference value between the black level obtained in step S101 and the black level obtained in step S102.

In step S104, the A/D conversion control unit 110 determines whether the difference value obtained in step S103 is equal to or greater than a predetermined threshold value. This threshold value indicates the allowable range of errors between the load capacitance 373 and the input capacitance of the comparing unit 162, and is arbitrarily set. This value may be a predetermined value, or a value calculated based on some information.

If the difference value is determined to be equal to or greater than the threshold value (or if the error (difference) is determined not to be allowed) in step S104, the process moves on to step S105.

In step S105, the A/D conversion control unit 110 calculates capacitance code values based on the difference value. That is, capacitance code values are calculated in accordance with the size of the difference between the load capacitance 373 and the input capacitance of the comparing unit 162, or so as to reduce the difference or make the difference zero.

In step S106, the A/D conversion control unit 110 supplies the capacitance adjusting unit 383 (or the capacitance adjusting unit 384) with the capacitance code values, which have been calculated in step S105 and control the capacitance of the capacitance adjusting unit 383 (or the capacitance adjusting unit 384) so that the difference between the load capacitance 373 and the input capacitance of the comparing unit 162 is reduced or made zero.

After the procedure in step S106 is completed, the process returns to step S101. If the difference value is determined to be smaller than the threshold value (or if the error (difference) is determined to be within the allowable range) in step S104, the capacitance code values are not set (updated), and the capacitance adjustment process comes to an end.

By performing this process, the A/D conversion control unit 110 can perform adjustment to reduce the difference between the input capacitance of the comparing unit 162 and the load capacitance 373. Accordingly, the load capacitance 373 can more accurately reproduce the input capacitance of the comparing unit 162. Accordingly, the CMOS image sensor 100 can more effectively reduce occurrences of A/D conversion errors.

In the above description, in step S101, the comparing units 162 of all the columns are connected to the reference voltage generating unit 131 (the reference voltage Vref1 side). However, the connection pattern in this case is not limited to that. For example, the comparing units 162 of all the columns may be connected to the reference voltage generating unit 132 (the reference voltage Vref2 side).

Also, in the above description, in step S102, the comparing units 162 of the even-numbered columns are connected to the reference voltage generating unit 131 (the Vref1 side), and the comparing units 162 of the odd-numbered columns are connected to the reference voltage generating unit 132 (the Vref2 side). However, the connection pattern of the comparing units 162 of the respective columns in step S102 may be any pattern, as long as it differs from the connection pattern of the comparing units 162 in step S101 (a pattern in which the comparing units 162 of all the columns are connected to the reference voltage generating unit 131 (the Vref1 side) in the above described example case). For example, one of the N comparing units 162 may be connected to the reference voltage generating unit 131 (the Vref1 side), and the remaining (N−1) comparing units 162 may be connected to the reference voltage generating unit 132 (the Vref2 side).

The black level acquisition in step S101 and S102 may be performed in all the columns, or may be performed in only some columns (representative columns). Also, the black level acquisition in step S101 and S102 may be performed in all the rows, or may be performed in only some rows (representative rows) (such as the rows in the Optical Black (OBP) region).

The black level acquired in step S101 and S102 may be calculated by any method. For example, the total sum or the mean value or the like of the pixel values of the respective unit pixels may be calculated as the black level through any appropriate calculation.

The above described control (the capacitance adjustment process (FIG. 39)) of the capacitance value of the capacitance adjusting unit 383 (or the capacitance adjusting unit 384) can be performed at any timing. For example, the control may be performed only once at a timing before the CMOS image sensor 100 starts imaging, such as immediately after the activation (power activation) of the CMOS image sensor 100. Alternatively, the control may be repeatedly performed during imaging. For example, the control of the capacitance value of the capacitance adjusting unit 383 (or the capacitance adjusting unit 384) may be performed in each frame, or performed every few frames. As the capacitance adjustment process is repeated in this manner, capacitance variation due to changes in temperature and voltage can be reduced, and the CMOS image sensor 100 can more effectively reduce occurrences of A/D conversion errors.

In the capacitance adjustment process for the current frame to be processed, capacitance adjustment may be performed based on the result of the capacitance adjustment already performed in the previous frame (capacitance adjustment information). For example, the black level used in the capacitance adjustment may be information about the previous frame. With this, the black level calculation can be performed later, and the capacitance adjustment process can be performed at higher speed.

Further, the capacitance adjustment process can be performed at any appropriate timing. For example, the capacitance adjustment process may be performed first in the processing for the frame (or prior to the start of A/D conversion), or may be performed last in the processing for the frame (or after the end of the A/D conversion). As described above, the capacitance adjustment process is performed during a period outside the imaging period (the A/D conversion period, for example), such as the blanking period or the OPB region. Accordingly, the capacitance adjustment process does not hinder any imaging process. With this, the processing load can be reduced.

The structures of the capacitance adjusting unit 383 and the capacitance adjusting unit 384 may be the same as each other, or may differ from each other. The switching unit 380 may include both the capacitance adjusting unit 383 and the capacitance adjusting unit 384, or may include only one of them. In a case where the switching unit 380 includes both the capacitance adjusting unit 383 and the capacitance adjusting unit 384, the A/D conversion control unit 110 can set capacitance code values for both the capacitance adjusting unit 383 and the capacitance adjusting unit 384 as appropriate, and cause both of the adjusting units to reflect the capacitance code values. Accordingly, tolerance to variation in manufacture can be further increased.

Although FIG. 36 shows the capacitance adjusting unit 383 and the capacitance adjusting unit 384, the number of capacitance adjusting units can be arbitrarily determined. For example, capacitance adjusting units like the capacitance adjusting unit 383 or the capacitance adjusting unit 384 may be connected to the load capacitance 373, and capacitance adjusting units like the capacitance adjusting unit 383 or the capacitance adjusting unit 384 may be connected to an input of the comparing unit 162. In that case, all the capacitance adjusting units may have the same structure, the structure of some of the capacitance adjusting units may differ from the structure of the others, or the respective capacitance adjusting units may have different structures from one another. The number of capacitance adjusting units connected to the load capacitance 373 and the number of capacitance adjusting units connected to an input of the comparing unit 162 may be the same, or may differ from each other. Further, the capacitance adjusting unit 383 and the capacitance adjusting unit 384 shown in FIG. 36 may be integrally formed (or a single capacitance adjusting unit may be connected to both the load capacitance 373 and an input of the comparing unit 162).

The load capacitance 373 of the switching unit 380 shown in FIG. 36 may have any of the structures shown in FIGS. 32 through 34. As the load capacitance 373 to which the present technology is applied and capacitance adjusting units to which the present technology is applied are used in combination as described above, the capacitance values are accurately adjusted to each other, and mismatching due to variations in operating conditions can be corrected. Accordingly, the CMOS image sensor 100 can more effectively reduce occurrences of A/D conversion errors.

<Another Example of the CMOS Image Sensor>

Figure 40:
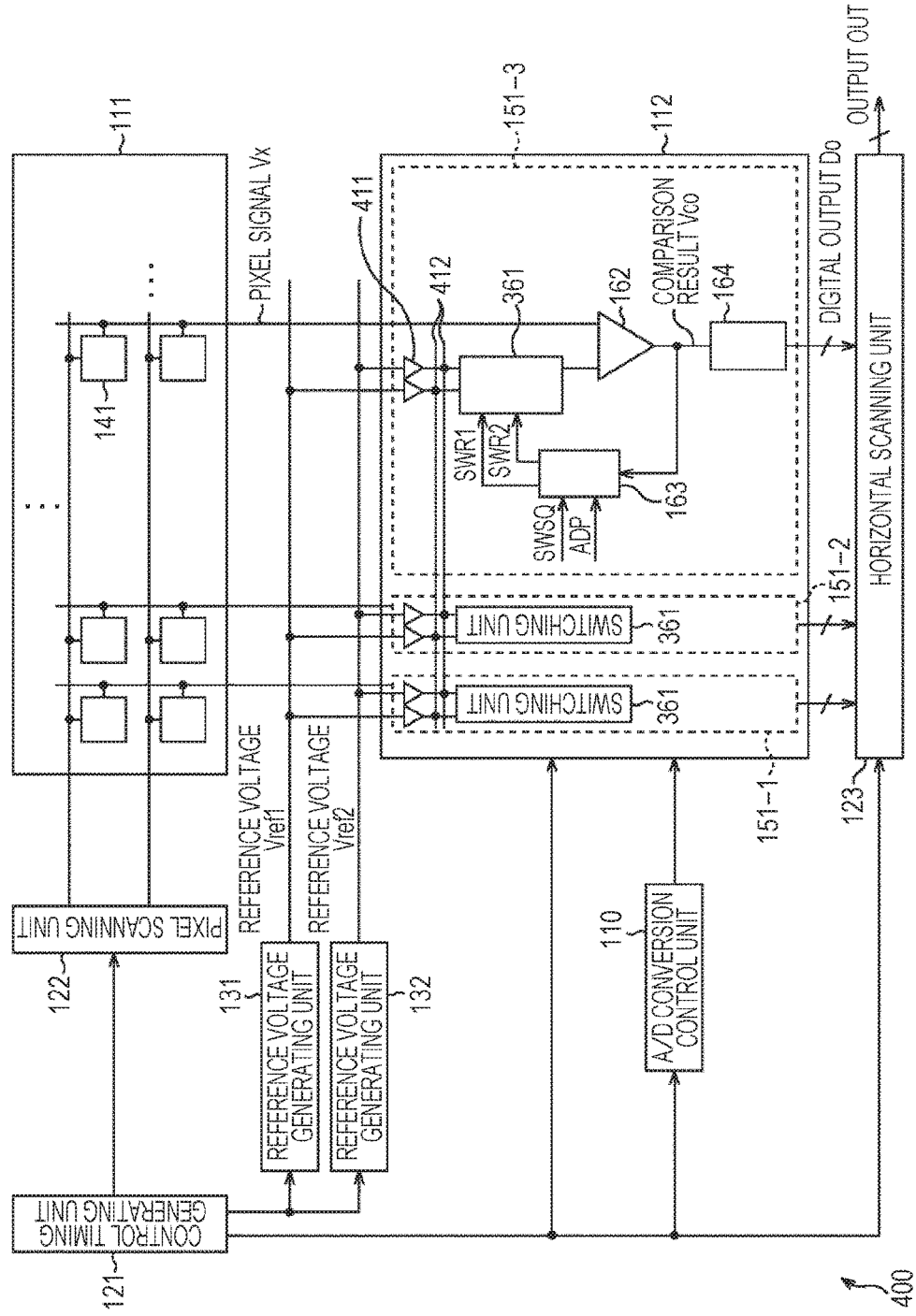
FIG. 40 is a diagram showing a typical example structure of a CMOS image sensor.

FIG. 40 is a diagram showing a typical example structure of a CMOS image sensor. The CMOS image sensor 400 shown in FIG. 40 is basically the same image sensor as the CMOS image sensor 100, has the same structure as the CMOS image sensor 100, and performs the same processing as the CMOS image sensor 100. In the CMOS image sensor 400, however, each of the column A/D conversion units 151 includes a buffer 411, and the column A/D conversion units 151 are connected to one another by a common column line 412. The CMOS image sensor 400 also includes switching units 361, instead of the switching units 161.

The buffer 411 is an amplifier that is provided between an input of the switching unit 361 and the respective signal output lines of the reference voltage generating units 131 and 132. That is, the reference voltage Vref is supplied to the switching unit 361 via this buffer 411. With this structure, noise generated in the comparing unit 162 can be prevented from affecting the other column A/D conversion units 151 via the reference voltage.

The common column line 412 connects the outputs of the respective buffers 411 corresponding to the same reference voltage to one another. With this, offset variations among the buffers 411 of the column A/D conversion units 151 can be smoothed.

However, as the column A/D conversion units 151 are connected to one another by the common column line 412, the CMOS image sensor 400 might have reference voltage delay variations due to changes in distributed constants, like the above described CMOS image sensor 100.

Therefore, the switching unit 361 is used in each of the column A/D conversion units 151, so that reference voltage delay variations can be reduced. That is, occurrences of A/D conversion errors can be reduced.

Other than that, the subtraction between the first analog signal and the second analog signal may be performed by an analog calculation circuit in an earlier stage than the inputs of the comparing unit 162, the calculation result or the signal component minus the variation component may be compared with a predetermined determination value, and a gradation accuracy (reference voltage) may be selected. In this manner, a digital value may be obtained through a single A/D conversion operation. In this case, there is still the problem that the reference voltage delay varies depending on which gradation accuracy is selected by the other pixel signals at the same signal voltage, and the resultant digital values have errors. With the switching units 361, reference voltage delay variations can be reduced. That is, occurrences of A/D conversion errors can be reduced.

The timing measuring unit 164 can also use any appropriate measurement method. For example, the timing measuring unit may use a counter, and carry out measurement by stopping the counter with an output Vco of the comparing unit 162. The timing measuring unit may use a count-up/down counter, and calculate the difference between the first analog signal and the second analog signal during the A/D conversion period. The timing measuring unit may store a count value into a latch circuit at the timing of a comparison result Vco. Further, a method other than the above may be used, or two or more methods may be combined. For example, objects to be processed may be divided into high bits and low bits by a predetermined method, and different methods may be used for the respective objects.

As a load capacitance is provided in the switching unit as described above, the input capacitance of the comparing unit 162 can be more accurately reproduced, and the CMOS image sensor 400 can more effectively reduce occurrences of A/D conversion errors.

In the case of the CMOS image sensor 400, the switching unit 380 can be used, instead of the switching unit 361. With this, the load capacitance and the input capacitance of the comparing unit 162 can be adjusted as described above, tolerance to variation in manufacture and the like can be increased, and the load capacitance 373 can more accurately reproduce the input capacitance of the comparing unit 162. Accordingly, the CMOS image sensor 400 can more effectively reduce occurrences of A/D conversion errors.

3. Third Embodiment

<Imaging Apparatus>

Figure 41:
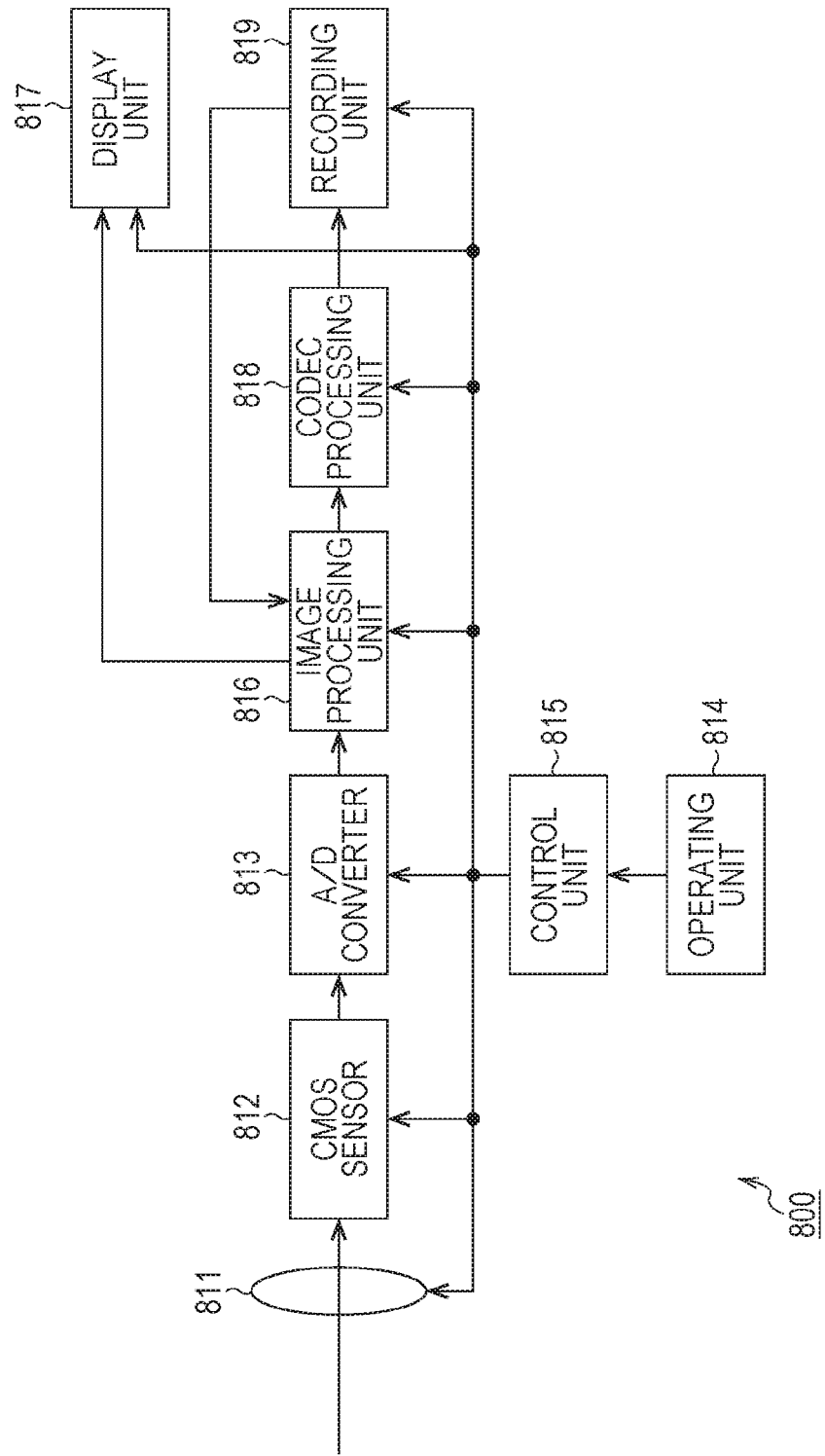
FIG. 41 is a diagram showing a typical example structure of an imaging apparatus.

FIG. 41 is a block diagram showing a typical example structure of an imaging apparatus using the above described signal processing device. The imaging apparatus 800 shown in FIG. 41 is an apparatus that images an object, and outputs an image of the object as an electrical signal.

As shown in FIG. 41, the imaging apparatus 800 includes an optical unit 811, a CMOS sensor 812, an A/D converter 813, an operating unit 814, a control unit 815, an image processing unit 816, a display unit 817, a codec processing unit 818, and a recording unit 819.

The optical unit 811 includes a lens that adjusts the focal point of the object and collects light from the focal position, a diaphragm that adjusts exposure, a shutter that controls timings for imaging, and the like. The optical unit 811 passes light (incident light) from the object on to the CMOS sensor 812.

The CMOS sensor 812 performs photoelectric conversion on the incident light, and supplies a signal (pixel signal) of each pixel to the A/D converter 813.

The A/D converter 813 converts the pixel signals supplied from the CMOS sensor 812 at a predetermined timing into digital data (image data), and sequentially supplies the digital data to the image processing unit 816 at a predetermined timing.

The operating unit 814 is formed with a Jog Dial (a trade name), keys, buttons, a touch panel, and the like, receives an operation input from a user, and supplies a signal according to the operation input to the control unit 815.

Based on the signal corresponding to the user's operation input from the operating unit 814, the control unit 815 controls driving of the optical unit 811, the CMOS sensor 812, the A/D converter 813, the image processing unit 816, the display unit 817, the codec processing unit 818, and the recording unit 819, and causes the respective components to perform processing related to imaging.

The image processing unit 816 performs various kinds of image processing, such as color mixing correction, black level correction, white balance adjustment, demosaicing, matrix processing, gamma correction, and YC conversion, on the image data supplied from the A/D converter 813. The image processing unit 816 then supplies the display unit 817 and the codec processing unit 818 with the image data subjected to the image processing.

The display unit 817 is designed as a liquid crystal display, for example, and displays an image of the object based on the image data supplied from the image processing unit 816.

The codec processing unit 818 performs a predetermined encoding process on the image data supplied from the image processing unit 816, and supplies the obtained encoded data to the recording unit 819.

The recording unit 819 records the encoded data supplied from the codec processing unit 818. The encoded data recorded in the recording unit 819 is read into the image processing unit 816 and is decoded as necessary. The image data obtained through the decoding process is then supplied to the display unit 817, and the corresponding image is displayed.

The above described present technology is applied to a processing unit including the CMOS sensor 812 and the A/D converter 813 of the imaging apparatus 800 having the above structure. That is, one of the CMOS image sensors (such as the CMOS image sensor 100 and the CMOS image sensor 400) described above in the first embodiment and the second embodiment is used as the processing unit including the CMOS sensor 812 and the A/D converter 813. Accordingly, the processing unit including the CMOS sensor 812 and the A/D converter 813 can reduce occurrences of A/D conversion errors. Thus, the imaging apparatus 800 can obtain an image with higher image quality by imaging an object.

An imaging apparatus to which the present technology is applied does not necessarily have the above described structure, and may have some other structure. For example, the imaging apparatus may not be a digital still camera or a video camera, but may be an information processing apparatus having an imaging function, such as a portable telephone device, a smartphone, a tablet-type device, or a personal computer. Alternatively, the imaging apparatus may be a camera module that is mounted on an another information processing apparatus and is used (or is mounted as a built-in device on another information processing apparatus).

4. Fourth Embodiment

<Computer>

The above described series of processes (such as the A/D conversion control processes described above in the respective embodiments (the process of supplying various kinds of control signals, for example)) may be conducted by hardware, or may be conducted by software.

For example, in the CMOS image sensor 100 shown in FIG. 5, the process to be performed by the A/D conversion control unit 110 to supply various kinds of control signals may be conducted by software. Of course, software may also be used in the example shown in FIG. 32, for example, and the use of software is not limited to the example shown in FIG. 5. Also, software may be used in any processes other than the process to be performed by the A/D conversion control unit 110, such as the process to be performed by the reference voltage generating unit 131, the reference voltage generating unit 132, or the like to supply the reference voltage.

When the series of processes are to be conducted by software, the program that forms the software is installed into a computer. Here, the computer may be a computer incorporated into special-purpose hardware, or may be a general-purpose personal computer that can execute various kinds of functions as various kinds of programs are installed thereinto, for example.

Figure 42:
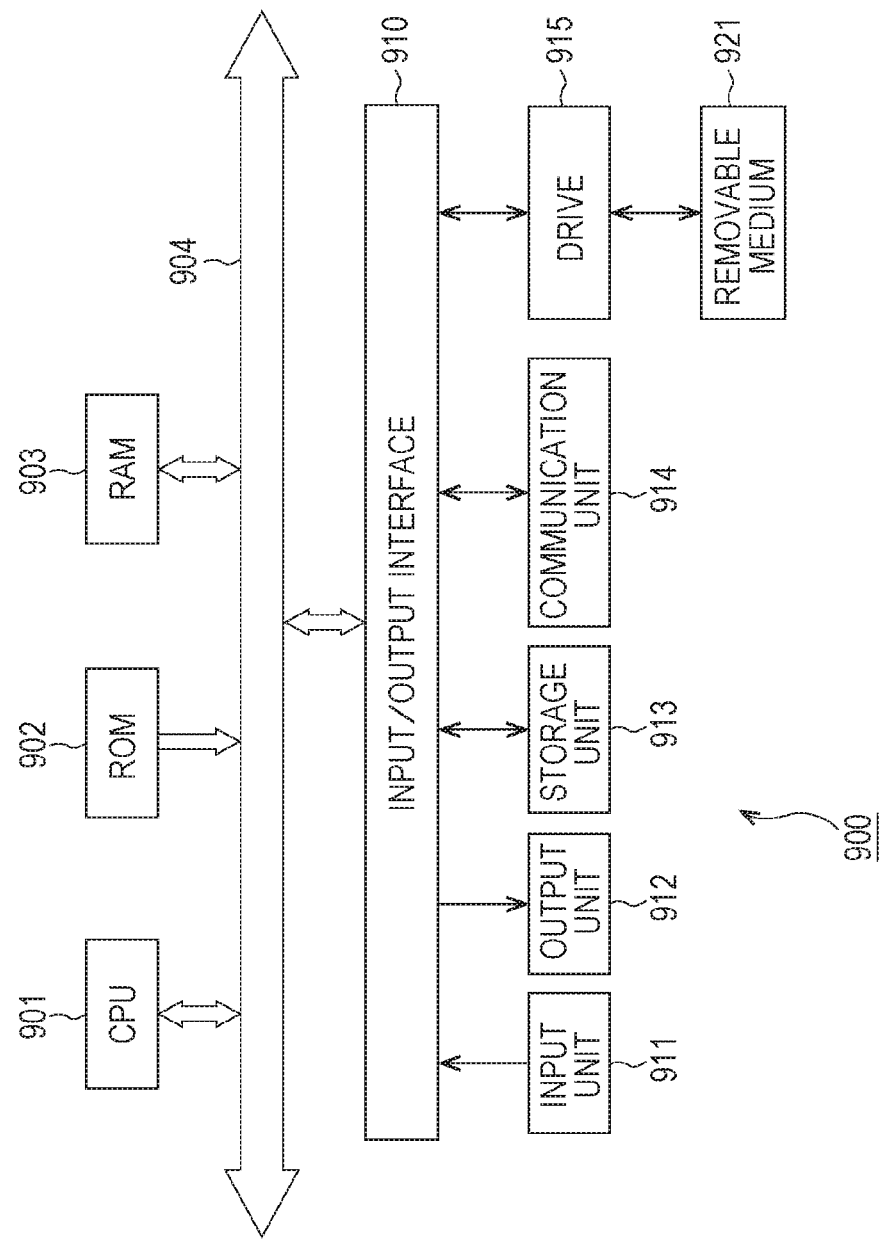
FIG. 42 is a block diagram showing a typical example structure of a computer.

FIG. 42 is a block diagram showing an example configuration of the hardware of a computer that performs the above described series of processes in accordance with a program.

In the computer 900 shown in FIG. 42, a Central Processing Unit (CPU) 901, a Read Only Memory (ROM) 902, and a Random Access Memory (RAM) 903 are connected to one another by a bus 904.

An input/output interface 910 is also connected to the bus 904. An input unit 911, an output unit 912, a storage unit 913, a communication unit 914, and a drive 915 are connected to the input/output interface 910.

The input unit 911 is formed with a keyboard, a mouse, a microphone, a touch panel, an input terminal, and the like. The output unit 912 is formed with a display, a speaker, an output terminal, and the like. The storage unit 913 is formed with a hard disk, a RAM disk, a nonvolatile memory, or the like. The communication unit 914 is formed with a network interface or the like. The drive 915 drives a removable medium 921 such as a magnetic disk, an optical disk, a magnetooptical disk, or a semiconductor memory.

In the computer having the above described structure, the CPU 901 loads a program stored in the storage unit 913 into the RAM 903 via the input/output interface 910 and the bus 904, and executes the program, so that the above described series of processes are performed. The RAM 903 also stores data necessary for the CPU 901 to perform various processes and the like as necessary.

The program to be executed by the computer (the CPU 901) may be recorded on the removable medium 921 as a packaged medium to be used, for example. Alternatively, the program can be provided via a wired or wireless transmission medium such as a local area network, the Internet, or digital satellite broadcasting.

In the computer, the program can be installed into the storage unit 913 via the input/output interface 910 when the removable medium 921 is mounted on the drive 915. The program can also be received by the communication unit 914 via a wired or wireless transmission medium, and be installed into the storage unit 913. Alternatively, the program may be installed beforehand into the ROM 902 or the storage unit 913.

The program to be executed by the computer may be a program for performing processes in chronological order in accordance with the sequence described in this specification, or may be a program for performing processes in parallel or performing a process when necessary, such as when there is a call.

In this specification, steps describing the program to be recorded in a recording medium include processes to be performed in parallel or independently of one another if not necessarily in chronological order, as well as processes to be performed in chronological order in accordance with the sequence described herein.

In this specification, a system means an assembly of components (devices, modules (parts), and the like), and not all the components need to be provided in the same housing. In view of this, devices that are housed in different housings and are connected to each other via a network form a system, and one device having modules housed in one housing is also a system.

Furthermore, any structure described above as one device (or one processing unit) may be divided into two or more devices (or processing units). Conversely, any structure described above as two or more devices (or processing units) may be combined into one device (or processing unit). Furthermore, it is of course possible to add components other than those described above to the structure of any of the devices (or processing units). Furthermore, some components of a device (or processing unit) may be incorporated into the structure of another device (or processing unit) as long as the structure and the function of the system as a whole are substantially the same.

While preferred embodiments of the present disclosure have been described above with reference to the accompanying drawings, the technical scope of the present disclosure is not limited to those examples. It is apparent that those who have ordinary skills in the technical field of the present disclosure can make various changes or modifications within the scope of the technical spirit claimed herein, and it should be understood that those changes or modifications are within the technical scope of the present disclosure.

For example, the present technology can be embodied in a cloud computing structure in which one function is shared among devices via a network, and processing is performed by the devices cooperating with one another.

The respective steps described with reference to the above described flowcharts can be carried out by one device or can be shared among devices.

In a case where more than one process is included in one step, the processes included in the step can be performed by one device or can be shared among devices.

The present technology can also be in the following forms.

(1) A signal processing device including:
a comparing unit that compares an analog signal output from a unit pixel with a predetermined voltage;
a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

(2) The signal processing device of any of (1) and (3) through (17), wherein the load capacitance is an equivalent capacitance or an approximate capacitance of the comparing unit.

(3) The signal processing device of any of (1), (2), and (4) through (17), further including a dummy comparing unit as the load capacitance, the dummy comparing unit having the same structure as the comparing unit, one input of the dummy comparing unit being connected to a fixed potential, the output of the dummy comparing unit being in an opened state, wherein the switching unit connects the other one of the reference voltages to the other input of the dummy comparing unit, the other one of the reference voltages being not connected to the comparing unit.

(4) The signal processing device of any of (1) through (3) and (5) through (17), further including a circuit as the load capacitance, the circuit including: an input transistor that operates in the same operation region as the input transistor of the comparing unit; a current supply transistor that supplies a constant current to the input transistor; a capacitor that cancels a reference voltage offset; and a switch transistor that initializes the capacitor, wherein the switching unit connects the other one of the reference voltages to the capacitor of the circuit, the other one of the reference voltages being not connected to the comparing unit.

(5) The signal processing device of any of (1) through (4) and (6) through (17), further including a circuit as the load capacitance, the circuit including: an input transistor that operates in the same operation region as the input transistor of the comparing unit; a capacitor that cancels a reference voltage offset; a first switch transistor that initializes the capacitor; a second switch transistor that initializes the input transistor; and a third switch transistor that connects the input transistor to a fixed potential, wherein the switching unit connects the other one of the reference voltages to the capacitor of the circuit, the other one of the reference voltages being not connected to the comparing unit.

(6) The signal processing device of any of (1) through (5) and (7) through (17), further including:

a first capacitance adjusting unit that is connected to the load capacitance, and adjusts the load capacitance; and a control unit that controls the capacitance of the first capacitance adjusting unit.

(7) The signal processing device of any of (1) through (6) and (8) through (17), wherein the first capacitance adjusting unit is formed with transistors connected in series between the load capacitance and a fixed potential, and the control unit obtains a desired capacitance value by inputting a control signal to each gate of the transistors.

(8) The signal processing device of any of (1) through (7) and (9) through (17), wherein the first capacitance adjusting unit is formed with transistors connected in parallel to one another, the gate of each of the transistors is connected to the load capacitance, and the control unit obtains a desired capacitance value by inputting a control signal to the source and the drain of each of the transistors.

(9) The signal processing device of any of (1) through (8) and (10) through (17), wherein the first capacitance adjusting unit is formed with a capacitor having a variable capacitance, and the control unit obtains a desired capacitance value by inputting a control signal to a control terminal of the capacitor.

(10) The signal processing device of any of (1) through (9) and (11) through (17), further including a second capacitance adjusting unit that is connected to an input of the comparing unit, and adjusts the capacitance of the comparing unit, wherein the control unit further controls the capacitance of the second capacitance adjusting unit.

(11) The signal processing device of any of (1) through (10) and (12) through (17), wherein the second capacitance adjusting unit is formed with transistors connected in series between the input of the comparing unit and a fixed potential, and the control unit obtains a desired capacitance value by inputting a control signal to each gate of the transistors.

(12) The signal processing device of any of (1) through (11) and (13) through (17), wherein the second capacitance adjusting unit is formed with transistors connected in parallel to one another, the gate of each of the transistors is connected to the input of the comparing unit, and the control unit obtains a desired capacitance value by inputting a control signal to the source and the drain of each of the transistors.

(13) The signal processing device of any of (1) through (12) and (14) through (17), wherein the second capacitance adjusting unit is formed with a capacitor having a variable capacitance, and the control unit obtains a desired capacitance value by inputting a control signal to a control terminal of the capacitor.

(14) The signal processing device of any of (1) through (13) and (15) through (17), wherein the control unit controls the capacitance first or last in a frame.

(15) The signal processing device of any of (1) through (14), (15), and (17), wherein the control unit controls the capacitance based on capacitance adjustment information about a frame processed in the past.

(16) The signal processing device of any of (1) through (15), and (17), wherein the control unit controls the capacitance every few frames.

(17) The signal processing device of any of (1) through (16), wherein the control unit controls the capacitance in accordance with the size of a difference in black level when the respective reference voltages are input to the comparing unit.

(18) A signal processing method including:

comparing an analog signal output from a unit pixel with a predetermined voltage, using a comparing unit;

switching reference voltages to be supplied to the comparing unit as necessary, connecting one of the reference voltages to the comparing unit, and connecting another one of the reference voltages to a predetermined load capacitance, the reference voltages being of different gradation accuracies from each other; and measuring timing of a change in the result of the comparison performed by the comparing unit between the analog signal and the reference voltage supplied to the comparing unit.

(19) An imaging device including:

a pixel array including unit pixels arranged therein, each of the unit pixels including a photoelectric conversion element that performs photoelectric conversion on incident light;

a comparing unit that compares an analog signal output from a unit pixel of the pixel array with a predetermined voltage;

a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

(20) An imaging apparatus including:

an imaging unit that images an object; and an image processing unit that performs image processing on image data obtained through the imaging performed by the imaging unit, the imaging unit including:

a pixel array including unit pixels arranged therein, each of the unit pixels including a photoelectric conversion element that performs photoelectric conversion on incident light;

a comparing unit that compares an analog signal output from a unit pixel of the pixel array with a predetermined voltage;

a switching unit that switches reference voltages to be supplied to the comparing unit as necessary, connects one of the reference voltages to the comparing unit, and connects another one of the reference voltages to a predetermined load capacitance, the reference voltages being of different gradation accuracies from each other; and a measuring unit that measures timing of a change in the result of the comparison performed by the comparing unit between the analog signal and the reference voltage supplied to the comparing unit through the switching control performed by the switching unit.

REFERENCE SIGNS LIST

100 CMOS image sensor
111 Pixel array
112 A/D conversion unit
110 A/D conversion control unit
121 Control timing generating unit
122 Pixel scanning unit
123 Horizontal scanning unit
131 and 132 Reference voltage generating unit
141 Unit pixel
151 Column A/D conversion unit
161 Switching unit
162 Comparing unit
163 Selecting unit
164 Timing measuring unit
171 Latch
181 Photodiode
233 Reference voltage generating unit
251 Column A/D conversion unit
261 Switching unit
263 Selecting unit
361 Switching unit
373 Load capacitance
380 Switching unit
383 Capacitance adjusting unit
384 Capacitance adjusting unit
400 CMOS image sensor
411 Buffer
412 Common column line
800 Imaging apparatus
812 CMOS sensor

What is claimed is:

1. A signal processing device comprising:
a comparing unit configured to compare an analog signal output from a unit pixel with a predetermined voltage;
a switching unit configured to switch reference voltages to be supplied to the comparing unit as necessary, connect one of the reference voltages to the comparing unit, and connect another one of the reference voltages to a predetermined load capacitance, the reference voltages being of different gradation accuracies from each other; and
a measuring unit configured to measure timing of a change in a result of the comparison performed by the comparing unit between the analog signal and the reference voltage supplied to the comparing unit through switching control performed by the switching unit.

2. The signal processing device according to claim 1, wherein the load capacitance is one of an equivalent capacitance and an approximate capacitance of the comparing unit.

3. The signal processing device according to claim 1, further comprising
a dummy comparing unit as the load capacitance, the dummy comparing unit having the same structure as the comparing unit, one input of the dummy comparing unit being connected to a fixed potential, an output of the dummy comparing unit being in an opened state,
wherein the switching unit connects the another one of the reference voltages to the other input of the dummy comparing unit, the another one of the reference voltages being not connected to the comparing unit.

4. The signal processing device according to claim 1, further comprising
a circuit as the load capacitance, the circuit including: an input transistor configured to operate in the same operation region as an input transistor of the comparing unit; a current supply transistor configured to supply a constant current to the input transistor; a capacitor configured to cancel a reference voltage offset; and a switch transistor configured to initialize the capacitor,
wherein the switching unit connects the another one of the reference voltages to the capacitor of the circuit, the another one of the reference voltages being not connected to the comparing unit.

5. The signal processing device according to claim 1, further comprising
a circuit as the load capacitance, the circuit including: an input transistor configured to operate in the same operation region as an input transistor of the comparing unit; a capacitor configured to cancel a reference voltage offset; a first switch transistor configured to initialize the capacitor; a second switch transistor configured to initialize the input transistor; and a third switch transistor configured to connect the input transistor to a fixed potential, wherein the switching unit connects the another one of the reference voltages to the capacitor of the circuit, the another one of the reference voltages being not connected to the comparing unit.

6. The signal processing device according to claim 1, further comprising:

a first capacitance adjusting unit configured to adjust the load capacitance, the first capacitance adjusting unit being connected to the load capacitance; and a control unit configured to control a capacitance of the first capacitance adjusting unit.

7. The signal processing device according to claim 6, wherein the first capacitance adjusting unit is formed with a plurality of transistors connected in series between the load capacitance and a fixed potential, and the control unit obtains a desired capacitance value by inputting a control signal to each gate of the transistors.

8. The signal processing device according to claim 6, wherein the first capacitance adjusting unit is formed with a plurality of transistors connected in parallel to one another, a gate of each of the transistors is connected to the load capacitance, and the control unit obtains a desired capacitance value by inputting a control signal to a source and a drain of each of the transistors.

9. The signal processing device according to claim 6, wherein the first capacitance adjusting unit is formed with a capacitor having a variable capacitance, and the control unit obtains a desired capacitance value by inputting a control signal to a control terminal of the capacitor.

10. The signal processing device according to claim 6, further comprising a second capacitance adjusting unit configured to adjust a capacitance of the comparing unit, the second capacitance adjusting unit being connected to an input of the comparing unit, wherein the control unit further controls a capacitance of the second capacitance adjusting unit.

11. The signal processing device according to claim 10, wherein the second capacitance adjusting unit is formed with a plurality of transistors connected in series between the input of the comparing unit and a fixed potential, and the control unit obtains a desired capacitance value by inputting a control signal to each gate of the transistors.

12. The signal processing device according to claim 10, wherein the second capacitance adjusting unit is formed with a plurality of transistors connected in parallel to one another, a gate of each of the transistors is connected to the input of the comparing unit, and the control unit obtains a desired capacitance value by inputting a control signal to a source and a drain of each of the transistors.

13. The signal processing device according to claim 10, wherein the second capacitance adjusting unit is formed with a capacitor having a variable capacitance, and the control unit obtains a desired capacitance value by inputting a control signal to a control terminal of the capacitor.

14. The signal processing device according to claim 6, wherein the control unit controls the capacitance first or last in a frame.

15. The signal processing device according to claim 6, wherein the control unit controls the capacitance based on capacitance adjustment information about a frame processed in the past.

16. The signal processing device according to claim 6, wherein the control unit controls the capacitance every few frames.

17. The signal processing device according to claim 6, wherein the control unit controls the capacitance in accordance with a size of a difference in black level when the respective reference voltages are input to the comparing unit.

18. A signal processing method comprising:

comparing an analog signal output from a unit pixel with a predetermined voltage, using a comparing unit;

switching reference voltages to be supplied to the comparing unit as necessary, connecting one of the reference voltages to the comparing unit, and connecting another one of the reference voltages to a predetermined load capacitance, the reference voltages being of different gradation accuracies from each other; and measuring timing of a change in a result of the comparison performed by the comparing unit between the analog signal and the reference voltage supplied to the comparing unit.

19. An imaging device comprising:

a pixel array including unit pixels arranged therein, each of the unit pixels including a photoelectric conversion element configured to perform photoelectric conversion on incident light;

a comparing unit configured to compare an analog signal output from a unit pixel of the pixel array with a predetermined voltage;

a switching unit configured to switch reference voltages to be supplied to the comparing unit as necessary, connect one of the reference voltages to the comparing unit, and connect another one of the reference voltages to a predetermined load capacitance, the reference voltages being of different gradation accuracies from each other; and a measuring unit configured to measure timing of a change in a result of the comparison performed by the comparing unit between the analog signal and the reference voltage supplied to the comparing unit through the switching control performed by the switching unit.

20. An imaging apparatus comprising:

an imaging unit configured to image an object; and an image processing unit configured to perform image processing on image data obtained through the imaging performed by the imaging unit, the imaging unit including:

a pixel array including unit pixels arranged therein, each of the unit pixels including a photoelectric conversion element configured to perform photoelectric conversion on incident light;

a comparing unit configured to compare an analog signal output from a unit pixel of the pixel array with a predetermined voltage;

a switching unit configured to switch reference voltages to be supplied to the comparing unit as necessary, connect one of the reference voltages to the comparing unit, and connect another one of the reference voltages to a predetermined load capacitance, the reference voltages being of different gradation accuracies from each other; and
a measuring unit configured to measure timing of a change in a result of the comparison performed by the comparing unit between the analog signal and the reference voltage supplied to the comparing unit through the switching control performed by the switching unit.

* * * * *